United States Patent
Onuma et al.

(10) Patent No.: US 11,456,288 B2
(45) Date of Patent: Sep. 27, 2022

(54) IMAGE DISPLAY ELEMENT

(71) Applicant: Sharp Fukuyama Laser Co., Ltd., Fukuyama (JP)

(72) Inventors: Hiroaki Onuma, Fukuyama (JP); Katsuji Iguchi, Fukuyama (JP); Koji Takahashi, Fukuyama (JP); Hidenori Kawanishi, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 183 days.

(21) Appl. No.: 16/986,178

(22) Filed: Aug. 5, 2020

(65) Prior Publication Data

US 2021/0043617 A1    Feb. 11, 2021

(30) Foreign Application Priority Data

Aug. 7, 2019 (JP) .............................. JP2019-145596
Mar. 2, 2020 (JP) .............................. JP2020-035230

(51) Int. Cl.

| | |
|---|---|
| *H01L 25/16* | (2006.01) |
| *H01L 33/60* | (2010.01) |
| *H01L 33/50* | (2010.01) |
| *H01L 33/38* | (2010.01) |
| *H01L 33/44* | (2010.01) |
| *H01L 33/58* | (2010.01) |
| *H01L 25/075* | (2006.01) |
| *H01L 27/15* | (2006.01) |
| *H01L 23/66* | (2006.01) |

(52) U.S. Cl.
CPC ............ *H01L 25/167* (2013.01); *H01L 33/60* (2013.01); *H01L 33/505* (2013.01); *H01L 2933/0083* (2013.01)

(58) Field of Classification Search
CPC ................... H01L 33/58; H01L 25/167; H01L 2223/6677; H01L 2933/0083; H01L 27/3241
See application file for complete search history.

(56) References Cited

U.S. PATENT DOCUMENTS

| | | |
|---|---|---|
| 2005/0269578 A1 | 12/2005 | Barnes et al. |
| 2011/0012139 A1 | 1/2011 | Yamamoto |
| 2011/0024778 A1 | 2/2011 | Barnes et al. |
| 2011/0297975 A1 | 12/2011 | Yeh et al. |
| 2016/0005922 A1* | 1/2016 | Huang .................... H01L 33/46 257/98 |
| 2018/0024279 A1* | 1/2018 | Murai ................... H01L 33/507 362/84 |

(Continued)

FOREIGN PATENT DOCUMENTS

| | | |
|---|---|---|
| JP | 2002-141492 A | 5/2002 |
| JP | 2005-535121 A | 11/2005 |

(Continued)

*Primary Examiner* — Marcos D. Pizarro
*Assistant Examiner* — Antonio B Crite
(74) *Attorney, Agent, or Firm* — ScienBiziP, P.C.

(57) ABSTRACT

An image display element includes micro light emitting elements arranged in an array, a drive circuit substrate that includes a drive circuit for supplying a current to the micro light emitting elements to cause light to be emitted, and an antenna arranged on a light emitting surface of each of the micro light emitting elements, in which the antenna includes isolated convex portions.

20 Claims, 33 Drawing Sheets

(56) References Cited

U.S. PATENT DOCUMENTS

2018/0045866 A1    2/2018   Chae et al.

FOREIGN PATENT DOCUMENTS

| JP | 2009-259805 | A |   | 11/2009 |              |
|----|-------------|---|---|---------|--------------|
| JP | 2013-134907 | A |   | 7/2013  |              |
| JP | 2014-026785 | A |   | 2/2014  |              |
| JP | 2018-013688 | A |   | 1/2018  |              |
| JP | 2018-025802 | A |   | 2/2018  |              |
| KR | 1020180025519 | A | | 3/2018  |              |
| KR | 20180068588 | A | * | 6/2018  | ............ H01L 27/15 |
| KR | 20200022575 | A | * | 3/2020  | ............ H01L 27/15 |
| KR | 20200127777 | A | * | 11/2020 | ............... G09F 9/33 |

\* cited by examiner

1: PIXEL REGION
5: PIXEL
60: EMBEDDING MATERIAL
70: ANTENNA
71: CONVEX PORTION
130: LIGHT EMITTING SURFACE
200: IMAGE DISPLAY ELEMENT

1: PIXEL REGION
5: PIXEL
60: EMBEDDING MATERIAL
70a: ANTENNA
71: CONVEX PORTION
130: LIGHT EMITTING SURFACE
200a: IMAGE DISPLAY ELEMENT

1: PIXEL REGION
5: PIXEL
60: EMBEDDING MATERIAL
70b: ANTENNA
71: CONVEX PORTION
72: SHIELD PATTERN
130: LIGHT EMITTING SURFACE
200b: IMAGE DISPLAY ELEMENT

| 1: PIXEL REGION | 50d: DRIVE CIRCUIT SUBSTRATE |
| 5: PIXEL | 51d: P DRIVE ELECTRODE |
| 11: N-SIDE LAYER | 60: EMBEDDING MATERIAL |
| 12: LIGHT EMISSION LAYER | 70: ANTENNA |
| 13: P-SIDE LAYER | 71: CONVEX PORTION |
| 14: COMPOUND SEMICONDUCTOR LAYER | 73: INSULATING FILM |
| 16d: BODY | 100d: MICRO LIGHT EMITTING ELEMENT |
| 16Sd: BODY SIDE SURFACE | |
| 23Pd: P ELECTRODE | 130: LIGHT EMITTING SURFACE |
| 30: COMMON N ELECTRODE | 200d: IMAGE DISPLAY ELEMENT |

| 1: PIXEL REGION | 52: N DRIVE ELECTRODE |
| 5: PIXEL | 60e: EMBEDDING MATERIAL |
| 16: BODY | 70e: ANTENNA |
| 17: PROTECTIVE FILM | 71: CONVEX PORTION |
| 23N: N ELECTRODE | 100e: MICRO LIGHT EMITTING ELEMENT |
| 23P: P ELECTRODE | 105: EXCITATION LIGHT EMITTING ELEMENT |
| 32: RED WAVELENGTH CONVERTER | 130: LIGHT EMITTING SURFACE |
| 50: DRIVE CIRCUIT SUBSTRATE | 200e: IMAGE DISPLAY ELEMENT |
| 51: P DRIVE ELECTRODE | |

1: PIXEL REGION
5: PIXEL
32: RED WAVELENGTH CONVERTER
37: OPENING
70f: ANTENNA
71: CONVEX PORTION
200f: IMAGE DISPLAY ELEMENT

FIG.19

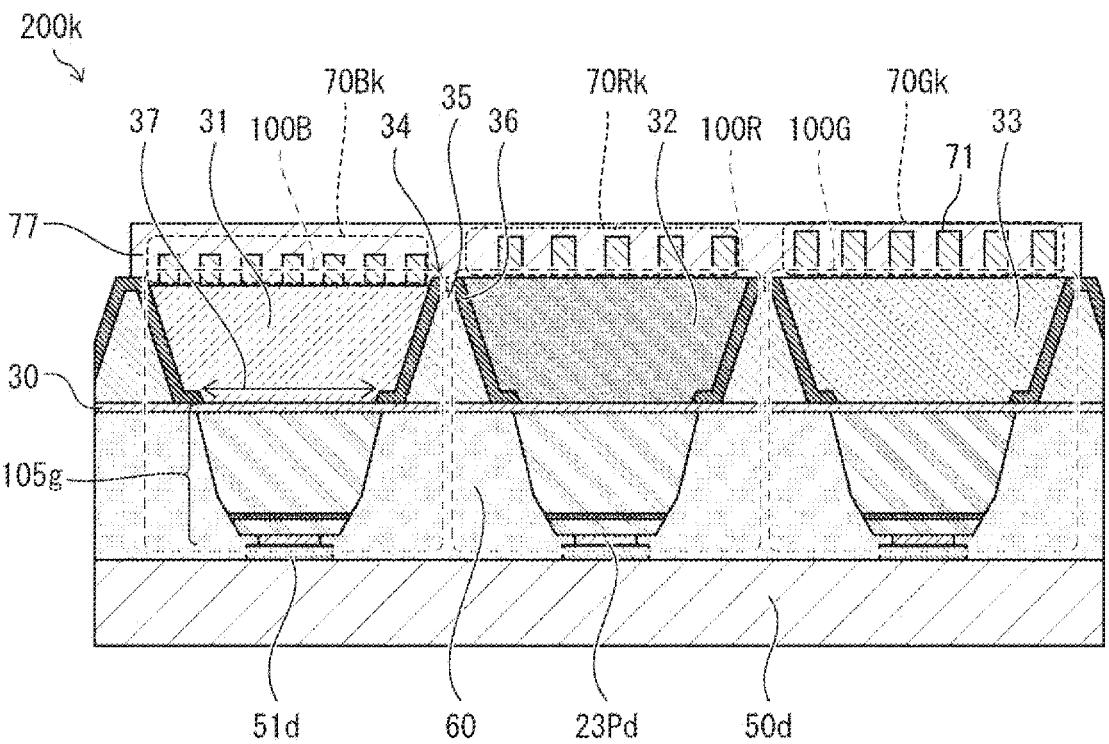

23Pd: P ELECTRODE
30: COMMON N ELECTRODE
31: TRANSPARENT PORTION
32: RED WAVELENGTH CONVERTER
33: GREEN WAVELENGTH CONVERTER
35: PARTITION WALL BASE MATERIAL
36: PARTITION WALL REFLECTIVE MATERIAL
37: OPENING
50d: DRIVE CIRCUIT SUBSTATE
51d: P DRIVE ELECTRODE
60: EMBEDDING MATERIAL

70Bk: BULE LIGHT ANTENNA
70Rk: RED LIGHT ANTENNA
70Gk: GREEN LIGHT ANTENNA
71: CONVEX PORTION
77: LOW REFRACTIVE INDEX RESIN
100B: BLUE LIGHT MICRO LIGHT EMITTING ELEMENT
100R: RED LIGHT MICRO LIGHT EMITTING ELEMENT
100G: GREEN LIGHT MICRO LIGHT EMITTING ELEMENT
105g: EXCITATION LIGHT EMITTING ELEMENT
200k: IMAGE DISPLAY ELEMENT

FIG.21

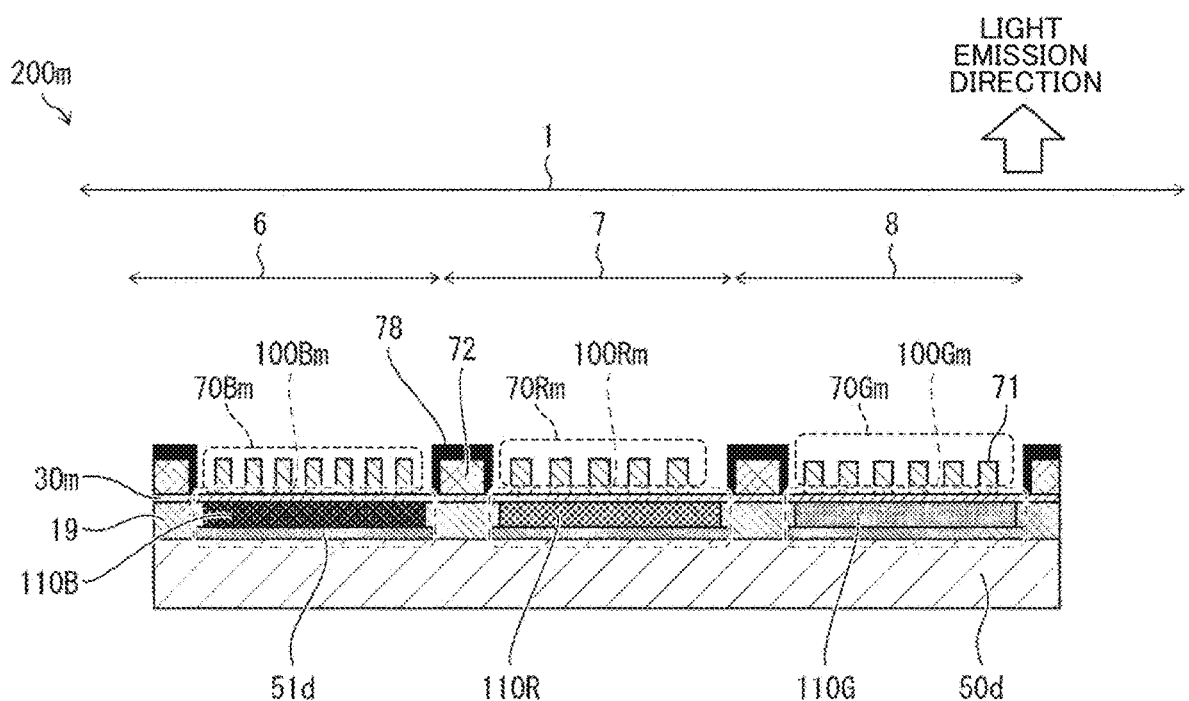

| | |
|---|---|
| 1: PIXEL REGION | 72: SHIELD PATTERN |
| 6: BLUE SUB-PIXEL | 78: BLACK MATRIX |
| 7: RED SUB-PIXEL | 100Bm: BLUE LIGHT MICRO LIGHT |
| 8: GREEN SUB-PIXEL | EMITTING ELEMENT |
| 19: FIRST INSULATING FILM | 100Rm: RED LIGHT MICRO LIGHT |
| 30m: COMMON N ELECTRODE | EMITTING ELEMENT |
| 50d: DRIVE CIRCUIT SUBSTRATE | 100Gm: GREEN LIGHT MICRO LIGHT |
| 51d: P DRIVE ELECTRODE | EMITTING ELEMENT |
| 70Bm: BULE LIGHT ANTENNA | 110B: BLUE LIGHT EMISSION LAYER |
| 70Rm: RED LIGHT ANTENNA | 110R: RED LIGHT EMISSION LAYER |
| 70Gm: GREEN LIGHT ANTENNA | 110G: GREEN LIGHT EMISSION LAYER |
| 71: CONVEX PORTION | 200m: IMAGE DISPLAY ELEMENT |

FIG.23

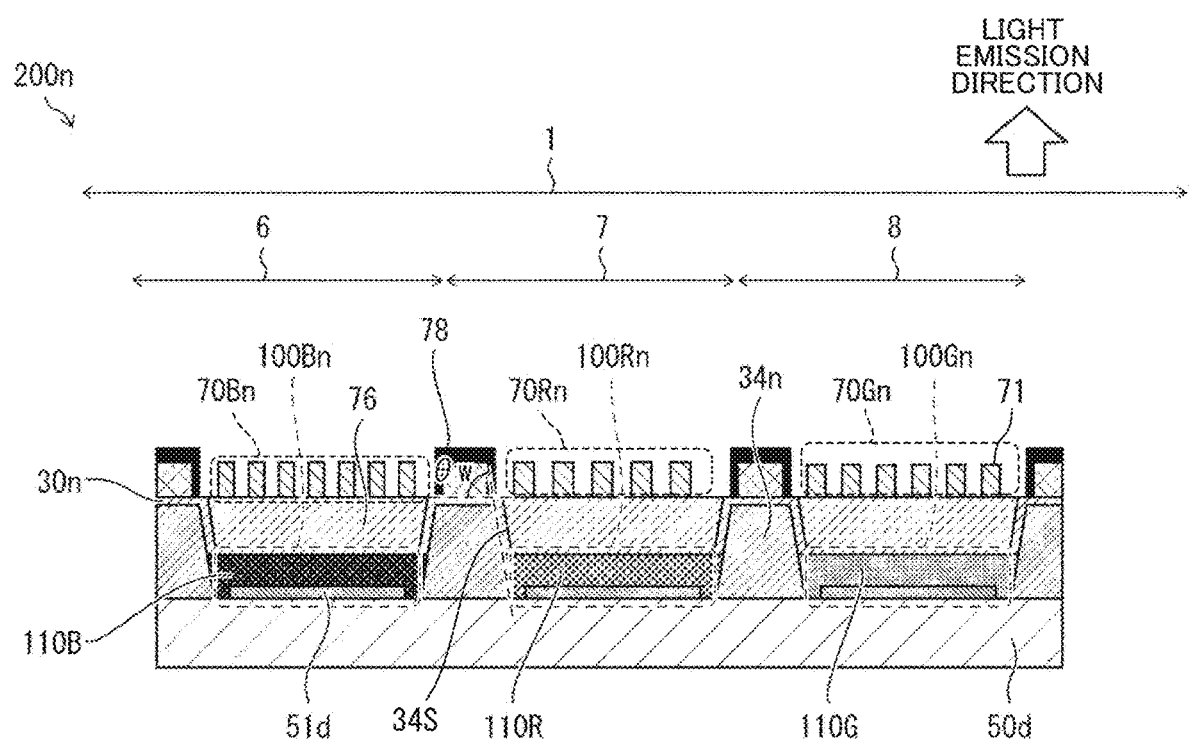

| | |
|---|---|
| 1: PIXEL REGION | 76: TRANSPARENT LAYER |
| 6: BLUE SUB-PIXEL | 78: BLACK MATRIX |
| 7: RED SUB-PIXEL | 100Bn: BLUE LIGHT MICRO LIGHT EMITTING ELEMENT |
| 8: GREEN SUB-PIXEL | |
| 30n: COMMON N ELECTRODE | 100Rn: RED LIGHT MICRO LIGHT EMITTING ELEMENT |
| 34n: PARTITION WALL | |
| 34S: PARTITION WALL SIDE SURFACE | 100Rn: GREEN LIGHT MICRO LIGHT EMITTING ELEMENT |
| 50d: DRIVE CIRCUIT SUBSTRATE | |
| 51d: P DRIVE ELECTRODE | 110B: BLUE LIGHT EMISSION LAYER |
| 70Bn: BULE LIGHT ANTENNA | 110R: RED LIGHT EMISSION LAYER |
| 70Rn: RED LIGHT ANTENNA | 110G: GREEN LIGHT EMISSION LAYER |
| 70Gn: GREEN LIGHT ANTENNA | 200n: IMAGE DISPLAY ELEMENT |
| 71: CONVEX PORTION | |

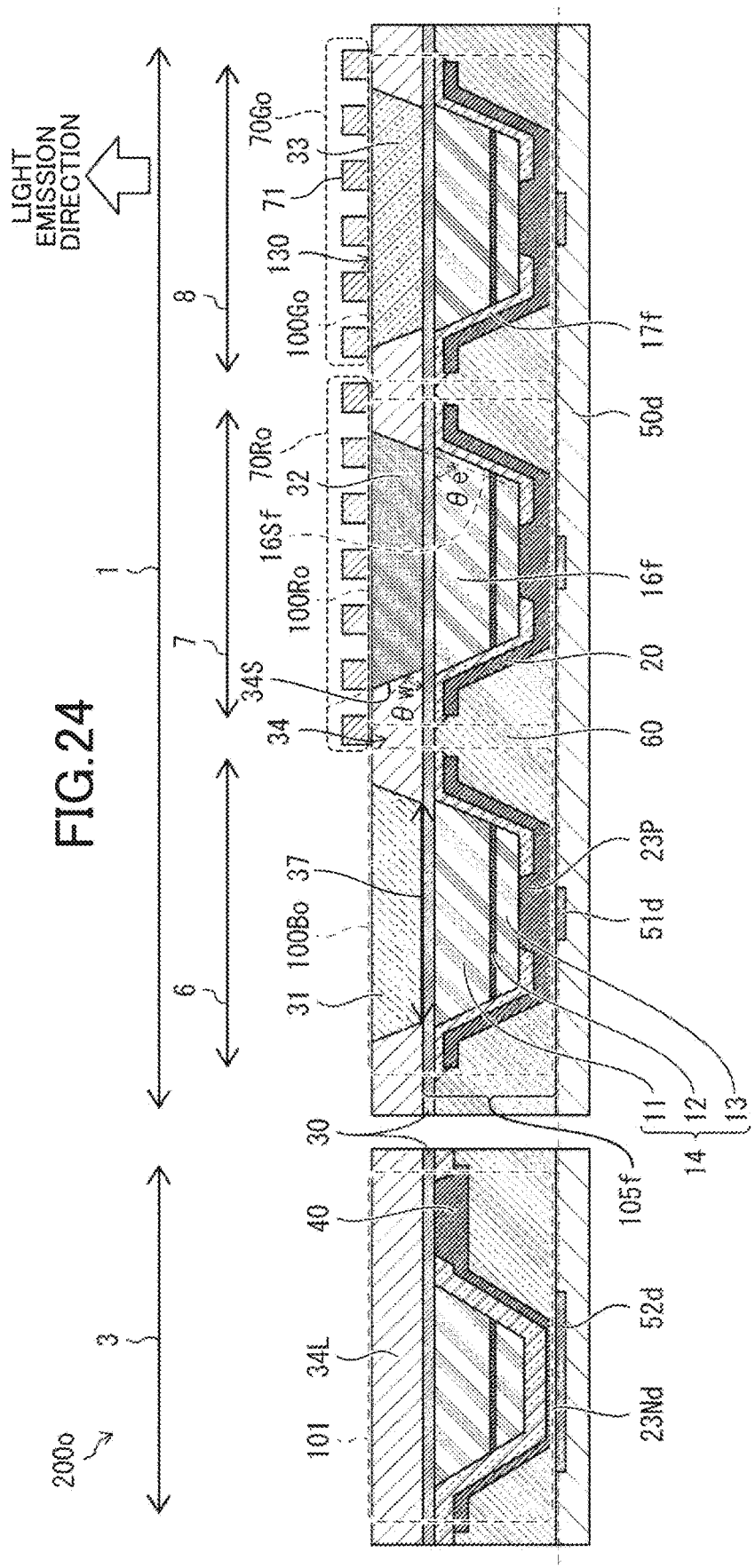

FIG.28

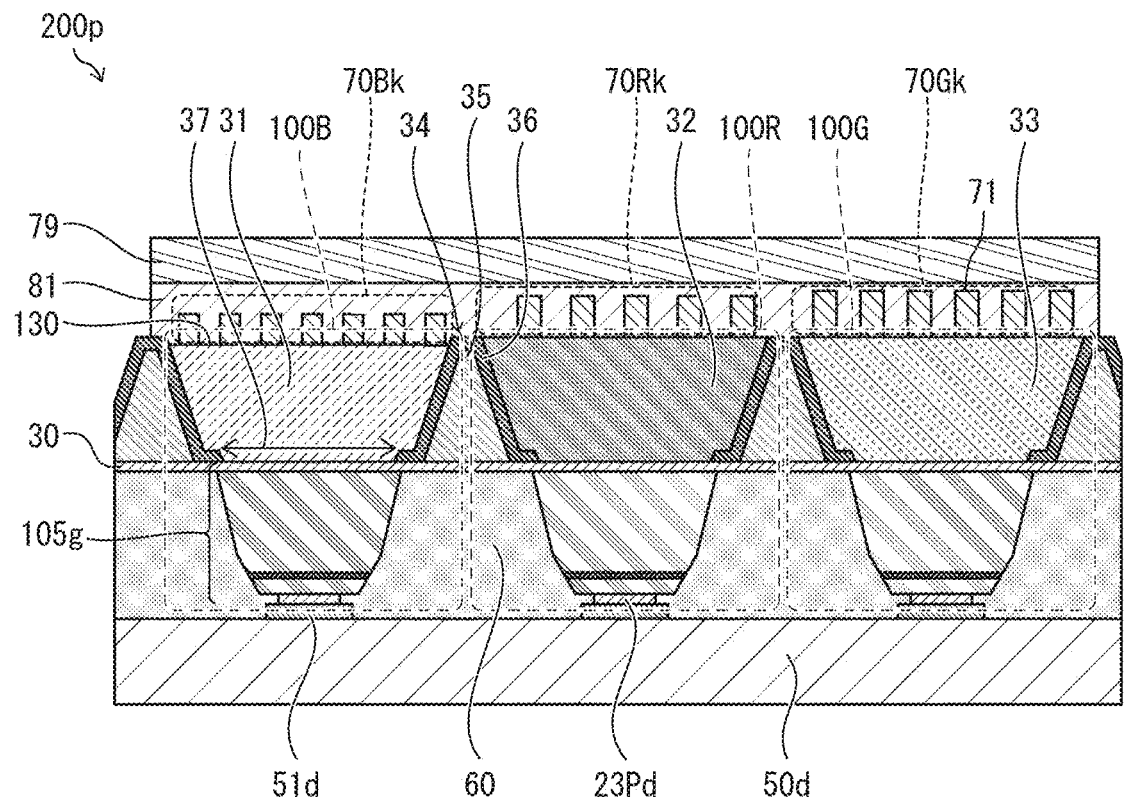

| | |
|---|---|
| 23Pd: P ELECTRODE | 70Rk: RED LIGHT ANTENNA |
| 30: COMMON N ELECTRODE | 70Gk: GREEN LIGHT ANTENNA |
| 31: TRANSPARENT PORTION | 71: CONVEX PORTION |
| 32: RED WAVELENGTH CONVERTER | 79: CAP LAYER |
| 33: GREEN WAVELENGTH CONVERTER | 81: EMBEDDING LAYER |
| 35: PARTITION WALL BASE MATERIAL | 100B: BLUE LIGHT MICRO LIGHT EMITTING ELEMENT |
| 36: PARTITION WALL REFLECTIVE MATERIAL | 100R: RED LIGHT MICRO LIGHT EMITTING ELEMENT |
| 37: OPENING | |
| 50d: DRIVE CIRCUIT SUBSTRATE | 100G: GREEN LIGHT MICRO LIGHT EMITTING ELEMENT |
| 51d: P DRIVE ELECTRODE | 105g: EXCITATION LIGHT EMITTING ELEMENT |
| 60: EMBEDDING MATERIAL | 130: LIGHT EMITTING SURFACE |
| 70Bk: BLUE LIGHT ANTENNA | 200p: IMAGE DISPLAY ELEMENT |

16: BODY
31: TRANSPARENT PORTION
32: RED WAVELENGTH CONVERTER
33: GREEN WAVELENGTH CONVERTER
70: ANTENNA
71: CONVEX PORTION
80: CONVEX PORTION PROTECTIVE FILM
130: LIGHT EMITTING SURFACE
200q: IMAGE DISPLAY ELEMENT

IMAGE DISPLAY ELEMENT

BACKGROUND

1. Field

The present disclosure relates to a micro light emitting element and an image display element including the same.

2. Description of the Related Art

There has been proposed a display element in which a plurality of micro light emitting elements forming pixels are arranged on a substrate (backplane). For example, in the technique disclosed in Japanese Unexamined Patent Application Publication No. 2002-141492 (published May 17, 2002), a drive circuit is formed on a silicon substrate, and a minute light emitting diode (LED) array that emits ultraviolet light is disposed on the drive circuit. Further, the above technique discloses a small-sized display for displaying a color image by providing a wavelength conversion layer for converting ultraviolet light into visible light of red, green, and blue on the light emitting diode array.

Although such a display element is small, the display element has high luminance and high durability. Therefore, the display element is expected as a display element such as a glasses-like device and a head-up display (HUD).

In such a display element, in order to improve the power efficiency, it is indispensable to improve the light emission efficiency and to efficiently capture the generated light into an optical system. As disclosed in U.S. Patent Application Publication No. 2011/0297975 (published on Dec. 8, 2011)", it has been proposed to improve the light extraction efficiency and collimate the emitted light by providing a photonic crystal structure on the micro light emitting element. Although it is not a display element but an illuminating device, a technique for controlling the light emission direction of fluorescent light by disposing a metal antenna on the surface of a phosphor is disclosed in Japanese Unexamined Patent Application Publication No. 2018-013688 (published on Jan. 25, 2018)".

However, in the structure of the micro light emitting element and the display device disclosed in Japanese Unexamined Patent Application Publication No. 2002-141492 mentioned above, there is also a problem that light is confined inside the micro light emitting element, the rate of emitting the light to the outside is low, and the light emission efficiency is low. Such a decrease in light extraction efficiency is a phenomenon that occurs because the refractive index of the light emitting material forming the micro light emitting element is higher than the refractive index of air or resin. The decrease in light emission efficiency causes problems such as an increase in power consumption and an increase in temperature due to heat generation.

Further, the micro light emitting element exhibits a light emission distribution close to a Lambertian distribution, and has a wide light emission angle distribution. In a small glasses-like terminal display element or mobile display, a large amount of wasted light that is not used is emitted. As a result, the power consumption is unnecessarily increased.

It is desirable to realize an image display element with low power consumption by improving the light emission efficiency of the micro light emitting element and controlling the light emission distribution.

SUMMARY

According to an aspect of the disclosure, there is provided an image display element including a drive circuit substrate that includes a drive circuit for supplying a current to micro light emitting elements to cause light to be emitted, the micro light emitting elements arranged in an array on the drive circuit substrate, and an antenna arranged on a light emitting surface of each of the micro light emitting elements, in which the antenna include isolated convex portions in a periodic pattern.

According to another aspect of the disclosure, there is provided an image display element including a drive circuit substrate that includes a drive circuit for supplying a current to micro light emitting elements to cause light to be emitted, the micro light emitting elements arranged in an array on the drive circuit substrate, and isolated convex portions arranged on a light emitting surface of each of the micro light emitting elements in a periodic pattern.

According to one aspect of the present disclosure, it is possible to improve the light emission efficiency of the micro light emitting element and control the light emission distribution.

BRIEF DESCRIPTION OF THE DRAWINGS

FIG. 19 is a schematic sectional view of an image display element according to Embodiment 12 of the present disclosure;

FIG. 21 is a schematic sectional view of an image display element according to Embodiment 14 of the present disclosure;

FIG. 23 is a schematic sectional view of a pixel region of an image display element according to Embodiment 15 of the present disclosure;

FIG. 24 is a schematic sectional view of a pixel region of an image display element according to Embodiment 16 of the present disclosure;

FIG. 28 is a schematic sectional view of an image display element according to Embodiment 19 of the present disclosure;

DESCRIPTION OF THE EMBODIMENTS

Figure 1:
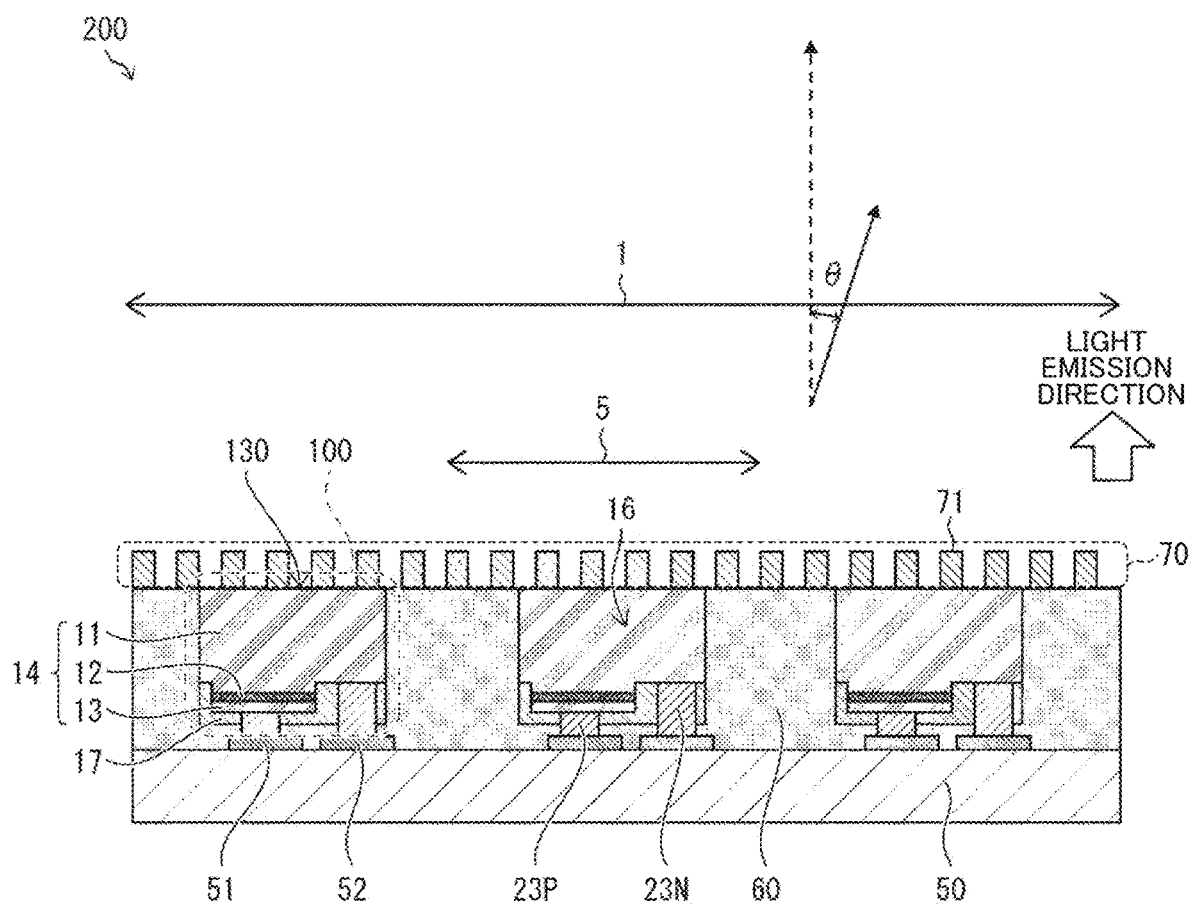
FIG. 1 is a schematic sectional view of a pixel region of an image display element according to Embodiment 1 of the present disclosure.

Hereinafter, an embodiment of the present disclosure will be described with reference to FIGS. 1 to 39, taking an image display element 200 having a plurality of micro light emitting elements 100 as an example. The image display element 200 includes a plurality of micro light emitting elements 100 and a drive circuit substrate 50, and the drive circuit substrate 50 supplies a current to the micro light emitting elements 100 in a pixel region 1 to cause light to be emitted. The micro light emitting elements 100 are arranged in an array in the pixel region 1.

The micro light emitting element 100 emits light to the side opposite to the drive circuit substrate 50. Unless otherwise specified, a surface of the micro light emitting element 100 that emits light into the air is referred to as a light emitting surface 130. In the description of the configuration of the image display element 200, the light emitting surface 130 is referred to as an upper surface (first surface), the surface opposite to the light emitting surface side is referred to as a lower surface (second surface), and side surfaces other than the upper surface and the lower surface are referred to as side surfaces unless otherwise specified. The direction perpendicular to the light emitting surface 130 and going into the air is called the front.

In the pixel region 1 of the drive circuit substrate 50, a micro light emitting element driving circuit that controls a current supplied to each micro light emitting element 100 is arranged, and a row selection circuit that selects each row of the micro light emitting elements 100 arranged in a two-dimensional matrix, a column signal output circuit that outputs a light emission signal to each column, an image processing circuit that calculates a light emitting signal based on an input signal, an input/output circuit, and the like are arranged outside the pixel region 1.

A P drive electrode 51 (P-drive electrode) (second drive electrode) and an N drive electrode 52 (N-drive electrode) (first drive electrode) coupled to the micro light emitting element 100 are arranged on the surface of the drive circuit substrate 50 on the joint surface side. Since the drive circuit substrate 50 is generally a silicon substrate on which a large scale integrated circuit (LSI) is formed or a glass substrate on which a thin film transistor (TFT) is formed, and can be manufactured by a known technique, the function and configuration thereof will not be described in detail.

Although the micro light emitting element 100 is drawn in a shape close to a square in the drawing, the shape of the micro light emitting element 100 is not particularly limited. The micro light emitting element can have various planar shapes such as a rectangle, a polygon, a circle, and an ellipse, but the maximum length is assumed to be 60 μm or less. It is assumed that the image display element 200 has 3,000 or more micro light emitting elements integrated in the pixel region 1.

Embodiment 1

(Structure of Image Display Element 200)

Figure 2:
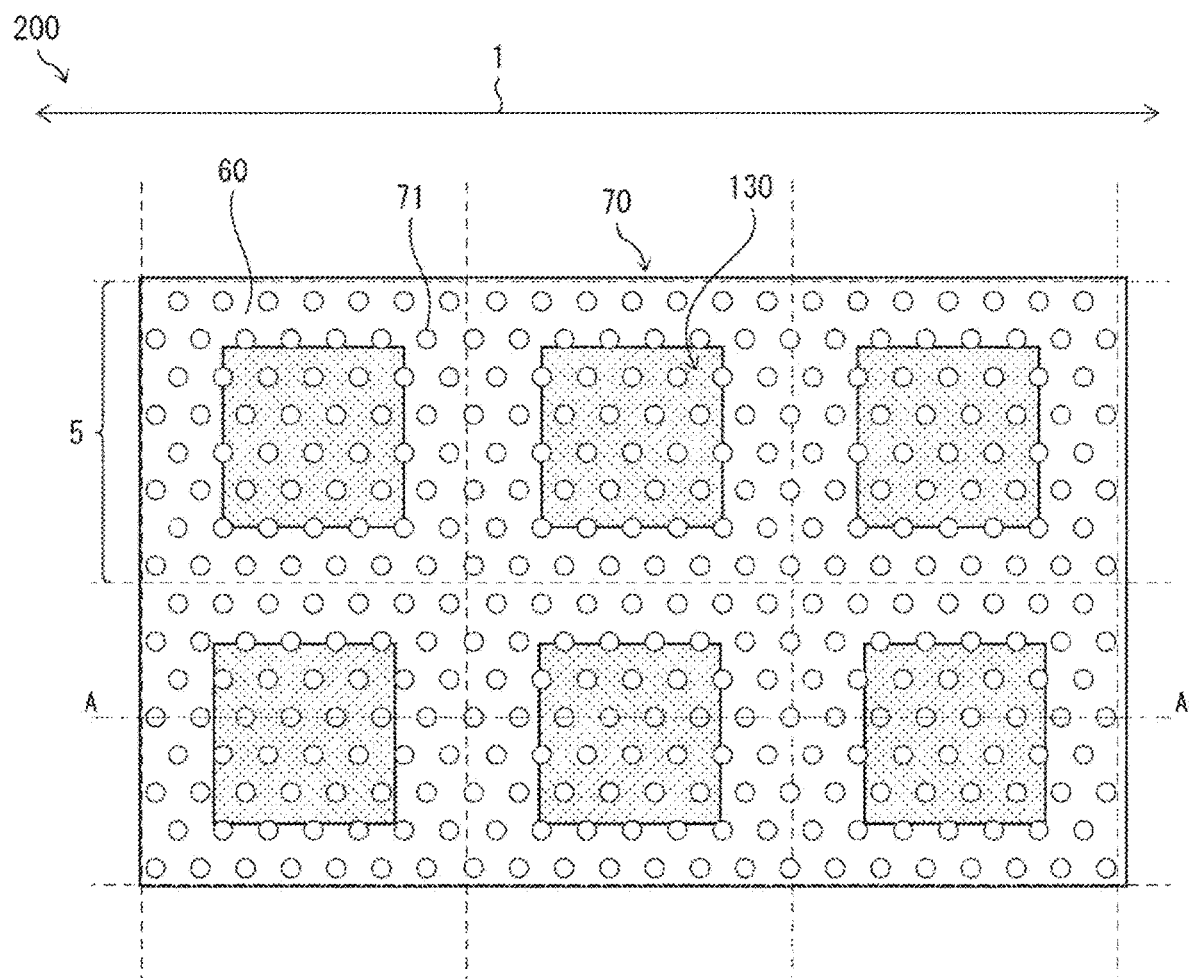
FIG. 2 is a schematic plan view of the pixel region of the image display element according to Embodiment 1 of the present disclosure.

FIG. 1 is a schematic sectional view of the pixel region 1 of the image display element 200 according to Embodiment 1 of the present disclosure. FIG. 2 is a schematic plan view of the pixel region 1 of the image display element 200 according to Embodiment 1 of the present disclosure. As shown in FIG. 2, the upper surface of the image display element 200 is the pixel region 1 in which a plurality of pixels 5 are arranged in an array. In the present embodiment, the image display element 200 is a display element for a single color, and each pixel 5 includes one micro light emitting element 100 for a single color.

In the present configuration, the upper surface of the micro light emitting element 100 is the light emitting surface 130, and an antenna 70 is formed on the light emitting surface 130. The antenna 70 is one in which isolated convex portions 71 are regularly arranged, and is arranged in a uniform periodic pattern with respect to the entire image display element 200, including the surface of the embedding material 60 that fills the space between the light emitting surfaces 130 of the micro light emitting element 100.

The micro light emitting element 100 includes a body 16 made of a compound semiconductor layer 14, a P electrode 23P (second electrode), and an N electrode 23N (first electrode). The compound semiconductor layer 14 includes a light emission layer 12 that emits light, an N-side layer 11 (N-side layer, first conductive layer) that injects electrons into the light emission layer 12, and a P-side layer 13 (P-side layer, second conductive layer) that injects holes into the light emission layer 12. The compound semiconductor layer 14 is, for example, a nitride semiconductor (AlInGaN-based) in the micro light emitting element 100 that emits light in the wavelength band from ultraviolet light to green, and is AlInGaP-based when emitting light in the wavelength band from yellow green to red. In the wavelength band from red to infrared, AlGaAs-based or GaAs-based.

In the following, regarding the compound semiconductor layer 14 that constitutes the body 16 of the micro light emitting element 100, the configuration in which the N-side layer 11 is arranged on the light emission side will be described exclusively, but a configuration in which the P-side layer 13 is arranged on the light emission side is also possible. The N-side layer 11, the light emission layer 12, and the P-side layer 13 are usually optimized by including a plurality of layers instead of a single layer, but are not directly related to the constitution of the present patent, and thus detailed structures of each layer are not described. Normally, the light emission layer 12 is sandwiched between an N-type layer and a P-type layer, but the N-type layer and the P-type layer may include a non-doped layer or a layer having a dopant having an opposite conductivity in some cases, and thus the layers are described as an N-side layer and a P-side layer below.

FIG. 1 is a sectional view taken along the line A-A of FIG. 2. As shown in FIGS. 1 and 2, the micro light emitting elements 100 are arranged in a two-dimensional array on the drive circuit substrate 50. Both the P electrode 23P and the N electrode 23N of the micro light emitting element 100 are formed on the second surface side. A protective film 17 is formed on the second surface side of the micro light emitting element 100. The P electrode 23P and the N electrode 23N are coupled to the corresponding P drive electrode 51 and the N drive electrode 52 on the drive circuit substrate 50, respectively.

The current supplied from the drive circuit substrate 50 to the micro light emitting element 100 is transmitted to the P-side layer 13 from the P drive electrode 51 via the P electrode 23P. The current that has passed through the light emission layer 12 from the P-side layer 13 flows from the N-side layer 11 to the N drive electrode 52 via the N electrode 23N. In this way, the micro light emitting element 100 emits light with a predetermined intensity according to the amount of current supplied from the drive circuit substrate 50.

The micro light emitting element 100 is separated from each other, and the micro light emitting element 100 is surrounded by the embedding material 60. It is preferable that the height of the light emitting surface 130 and the height of the embedding material 60 are substantially equal. In order to suppress light leakage to adjacent pixels, it is preferable that the embedding material 60 has a light shielding function by reflection or absorption. When the embedding material 60 is transparent, the embedding material 60 does not have a light-shielding function, and thus it is preferable to cover the sidewall of the micro light emitting element 100 with a metal film.

In the present configuration, the metal convex portions 71 are arranged on the light emitting surface 130 at a constant period. As shown in FIG. 2, the convex portion 71 is arranged at the apex of an equilateral triangle in a plan view. The shape of the convex portion 71 is cylindrical, and in the present example, the diameter is 100 nm and the height is 150 nm. Such a pattern can be formed by depositing a metal film on the light emitting surface 130, forming a resist pattern at a position corresponding to the convex portion 71, and etching the metal film by a dry etching technique. The resist pattern can be formed by a photolithography technique or a nanoimprint technique. In the present configuration, the antenna 70 is not aligned with the array arrangement of the micro light emitting elements 100. The convex portion could be made of semiconductor or dielectric in this embodiment.

The size, shape, height, and arrangement pattern of the convex portions 71 can be appropriately selected depending on the material of the light emitting surface 130 and the emission wavelength. However, in order to suppress the amount of light passing through the antenna 70 from decreasing, it is preferable that the horizontal size of the convex portion 71 is ½ or less of the distance between the adjacent convex portions 71 in a case that the convex portion is made of metal. Further, in order to reduce the influence of the polarization direction of the transmitted light, the aspect ratio (=height/horizontal size of convex portion), which is the ratio of height to the horizontal size of the convex portion 71, is preferably between 0.5 and 2.0, and more preferably between 0.75 and 1.5. In the present configuration, the metal forming the convex portion 71 is aluminum, but other metal material such as silver may be used.

Figure 3:
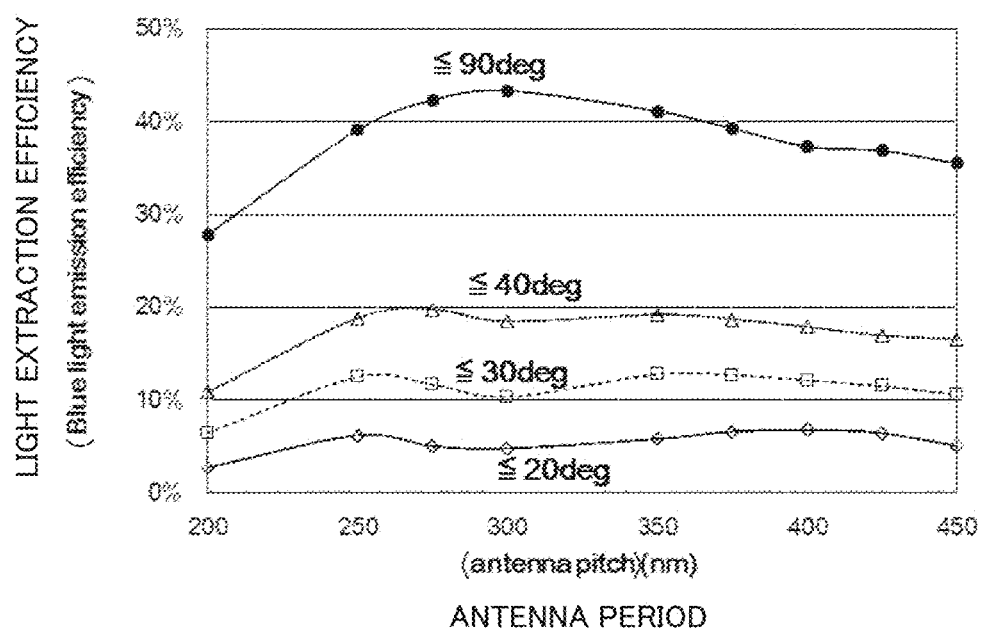
FIG. 3 is a simulation result showing a relationship between a light extraction efficiency and an antenna period according to Embodiment 1 of the present disclosure.

FIG. 3 shows a simulation result of the light extraction efficiency when the period (antenna pitch) of the antenna 70 is changed in the present configuration. If such a simulation is performed with high accuracy, since a very large calculation resource is indispensable, a simple model for evaluating the degree of influence of various parameters was used here, without fully taking the numerical accuracy into account. While the inside of the micro light emitting element 100 is calculated with high accuracy by using a ray-trace method, as the effect of the antenna 70, only the 0th-order and 1st-order diffracted lights on the light emitting surface 130 are considered, and the transmittance is treated as constant.

The micro light emitting element 100 is a GaN-based LED and has an emission wavelength of 450 nm. The light emitting surface 130 of the micro light emitting element 100 is a square having one side of 8 μm, and the body 16 has a thickness of 4.1 μm. The four lines in FIG. 3 are the integrated values of light and indicate angles of light emitting surface 20° or less, 30° or less, 40° or less, and 90° or less, the angle (angle θ indicated in FIG. 1) being formed by the perpendicular line of the light emitting surface 130 and the traveling direction of the emitted light.

The simulation values without the antenna 70 are 0.9%, 1.9%, 3.3%, and 8.1%, respectively, and thus the antenna 70 increases the light output several times, and particularly the amount of light emitted to the front is significantly increased. A compound semiconductor generally has a high refractive index, and light in the compound semiconductor has a very low light extraction efficiency due to the effect of total internal reflection at the light emitting surface 130. However, the light that has not been emitted to the outside due to the total internal reflection can be emitted into the air due to the diffraction effect of the antenna 70. Therefore, the light extraction efficiency can be improved. Further, since the diffraction direction changes depending on the period of the antenna 70, it is possible to increase the light emission intensity to the front by appropriately selecting the period.

The structure of disposing the metal antenna on the surface of the wavelength conversion material described in Japanese Unexamined Patent Application Publication No. 2018-013688 discloses the structure of increasing the amount of light emitted to the front. However, Japanese Unexamined Patent Application Publication No. 2018-013688 does not disclose a structure in which the antennas 70 having a constant period are arranged on the surfaces of the micro light emitting elements 100 arranged in an array and the embedding material 60 filling the spaces between the micro light emitting elements 100. Further, Japanese Unexamined Patent Application Publication No. 2018-013688 does not disclose that such a structure can suppress the optical crosstalk and enhance the light extraction efficiency to the front.

As described above, by disposing the antenna 70 on the light emitting surface 130 of the micro light emitting element 100, it is possible to significantly improve the light output and increase the light emission to the front.

Embodiment 2

Figure 4:
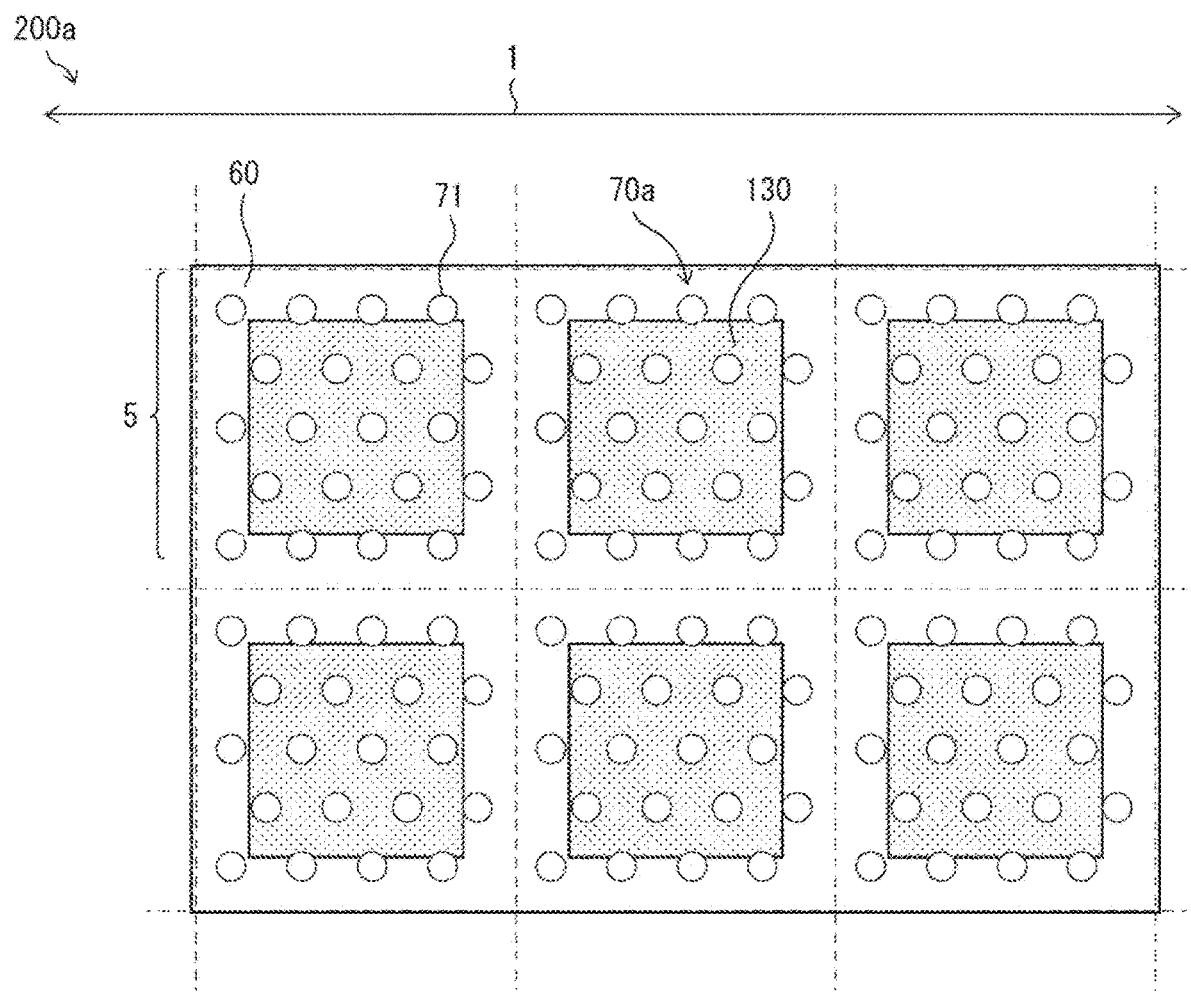
FIG. 4 is a schematic plan view of a pixel region of an image display element according to Embodiment 2 of the present disclosure.

Another embodiment of the present disclosure will be described below with reference to FIG. 4. For convenience of description, members having the same functions as the members described in the above embodiment are designated by the same reference numerals, and the description thereof will not be repeated. The same applies to the following embodiments. An image display element 200a of the present embodiment is different from that of Embodiment 1 in the arrangement pattern of antennas 70a, but the other configurations are the same as those of Embodiment 1.

In the first embodiment, the antenna 70 is arranged without being aligned with the array arrangement of the micro light emitting elements 100. Therefore, in the manufacturing process, there is an advantage that no precise alignment is indispensable and the manufacturing is easy. However, when the micro light emitting element 100 becomes finer, there arises a problem that the number and positions of the convex portions 71 arranged on the light emitting surface 130 of the micro light emitting element 100 are different for each micro light emitting element 100. If the size of the micro light emitting element 100 is large, the number of the convex portions 71 is large, and thus it is not a big problem. However, as the micro light emitting element 100 becomes finer, variations in the number and position of the convex portions 71 cause variations in the angular distribution of the emitted light.

In the present embodiment, in order to suppress such a problem, all the micro light emitting elements 100 are arranged so that the number and positions of the convex portions 71 are the same. That is, the arrangement pattern of the convex portions 71 covering the light emitting surface 130 maintains the same regularity as in Embodiment 1, but the regularity is disturbed on the embedding material 60 outside the light emitting surface 130. That is, the arrangement pattern of the convex portions 71 on the embedding material 60 is different that on the light emitting surface 130. In order to form such antennas 70a, it is indispensable to align the antennas 70a with the array arrangement of the micro light emitting elements 100 in the manufacturing process. The convex portion could be made of metal, semiconductor or dielectric in this embodiment.

Also in the present configuration, the same effect as that of Embodiment 1 can be realized. Further, when the micro light emitting element 100 is miniaturized, there is a secondary effect that variation in the light emission angular distribution between the pixels 5 can be reduced.

Embodiment 3

Another embodiment of the present disclosure will be described below with reference to FIG. 5. An image display element 200b of the present embodiment is different from that of Embodiment 1 in the arrangement pattern of an antenna 70b, but the other configurations are the same as those of Embodiment 1.

In Embodiments 1 and 2, when the distance between the micro light emitting elements 100 becomes smaller, the light output of the micro light emitting element 100 may be influenced by the adjacent micro light emitting element 100 via the antenna 70 and the antenna 70a. When a certain micro light emitting element 100 has a very strong light emission intensity, plasmon vibration excited by the antenna may spread to the antenna on the adjacent micro light emitting element 100 in a case that the convex portions 71 is made of metal. In such a case, the adjacent micro light emitting elements 100 appear to emit light, and thus the contrast is lowered. The antenna causes a kind of optical crosstalk.

Figure 5:
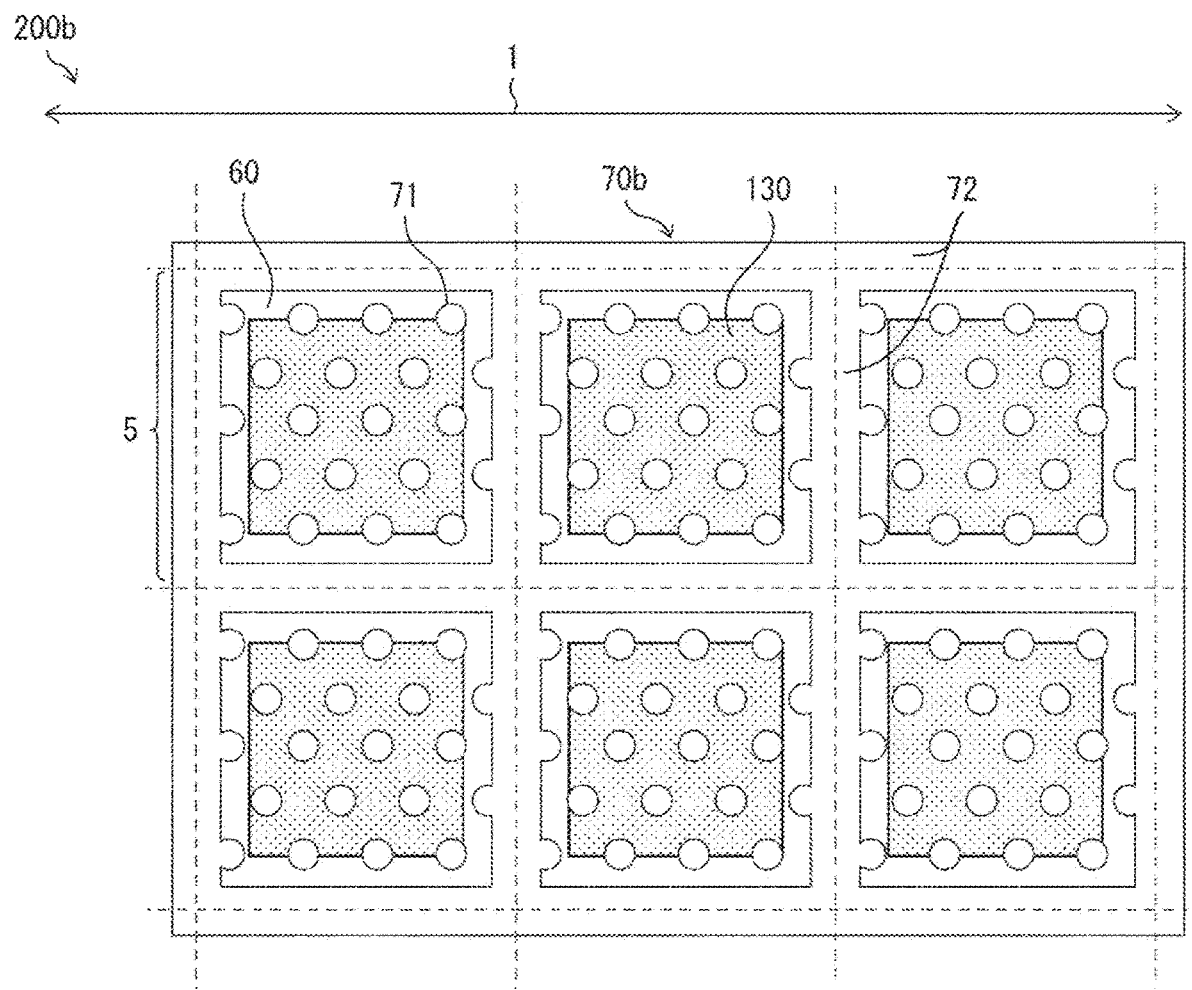
FIG. 5 is a schematic plan view of a pixel region of an image display element according to Embodiment 3 of the present disclosure.

In order to suppress such optical crosstalk via the antenna, a shield pattern 72 for suppressing plasmon vibration from spreading to adjacent pixels is arranged between the pixels in FIG. 5. That is, the shield pattern 72 is disposed on the outer peripheral portion of the micro light emitting element 100. The shield pattern 72 is preferably a continuous pattern that surrounds the entire periphery of the micro light emitting element 100, but may be partially cut as long as the cut portion is short.

Since the shield pattern 72 of the present configuration can be formed simultaneously as a part of the antenna 70b, the manufacturing cost does not increase. If the problem that the reflection of external light increases due to the installation of the shield pattern 72 occurs, the shield pattern 72 may be covered with a black matrix.

Also in the present configuration, the same effect as that of Embodiment 1 can be realized. Further, there is a secondary effect that optical crosstalk that occurs between adjacent pixels can be reduced when the distance between the micro light emitting elements 100 is reduced.

Embodiment 4

Figure 6:
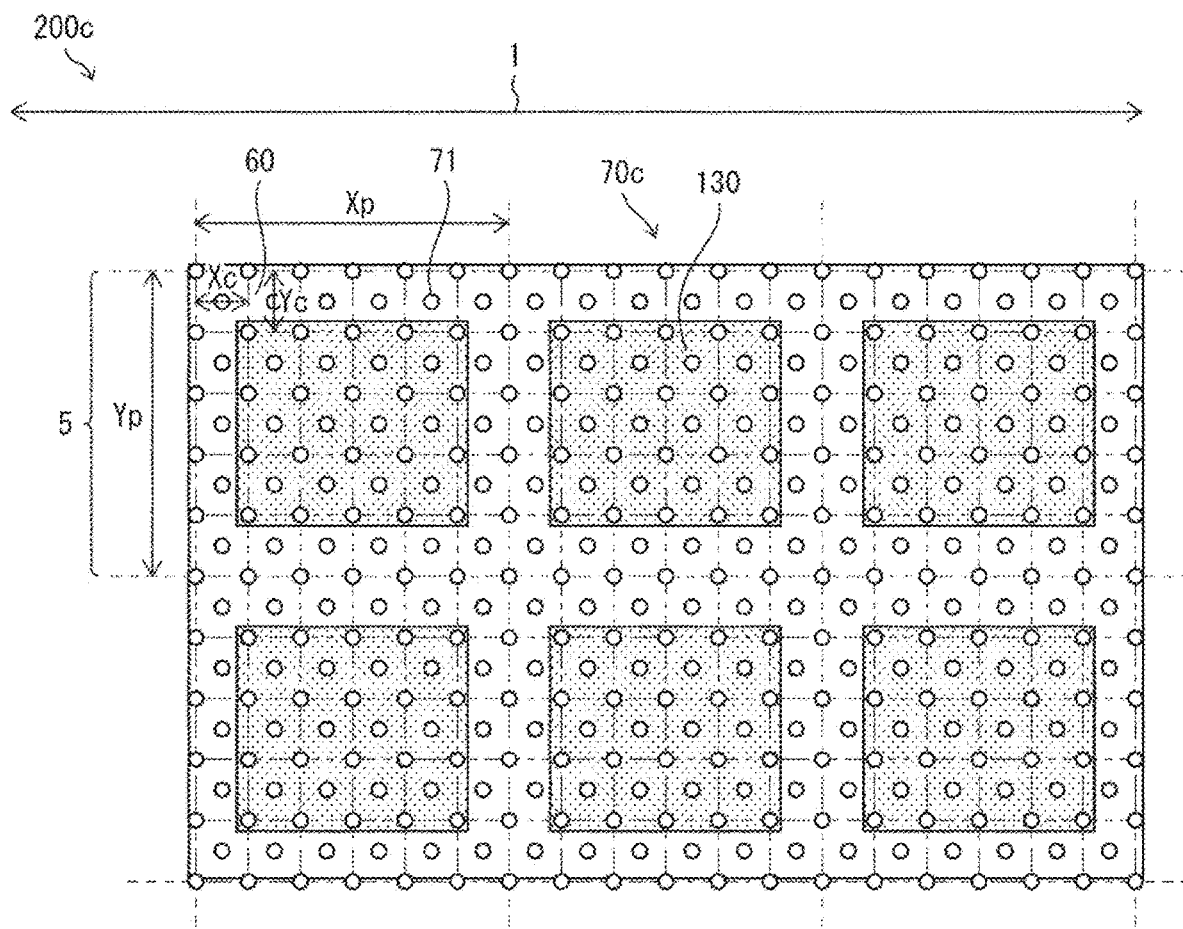
FIG. 6 is a schematic plan view of a pixel region of an image display element according to Embodiment 4 of the present disclosure.

Another embodiment of the present disclosure will be described below with reference to FIG. 6. An image display element 200c of the present embodiment is different from that of Embodiment 1 in the arrangement pattern of an antenna 70c, but the other configurations are the same as those of Embodiment 1.

In the first embodiment, the antenna 70 is arranged without being aligned with the array arrangement of the micro light emitting elements 100. Therefore, in the manufacturing process, there is an advantage that no precise alignment is indispensable and the manufacturing is easy. However, when the micro light emitting element 100 becomes finer, there arises a problem that the number and positions of the convex portions 71 arranged on the light emitting surface 130 of the micro light emitting element 100 are different for each micro light emitting element 100. If the size of the micro light emitting element 100 is large, the number of the convex portions 71 is large, and thus it is not a big problem. However, as the micro light emitting element 100 becomes finer, variations in the number and position of the convex portions 71 cause variations in the angular distribution of the emitted light.

In the present embodiment, in order to avoid such a problem, all the micro light emitting elements 100 are arranged so that the number and positions of the convex portions 71 are the same. That is, in the present embodiment, the period of the array arrangement of the micro light emitting elements 100 is set to be a natural number multiple of the period of the antenna 70c. When the pitches of the pixels 5 in the X and Y directions are Xp and Yp, and the pitches of the unit cells of the antenna 70c in the X and Y directions are Xc and Yc, Xp=Xc×N and Yp=Xc×M (N and M are both natural numbers) are set. The convex portion could be made of metal, semiconductor or dielectric in this embodiment.

If this relationship is satisfied, the arrangement pattern of the convex portions 71 on all the light emitting surfaces 130 is the same even if the antenna 70c is not aligned with the array arrangement of the micro light emitting elements 100. By selecting the size of the unit cell of the antenna 70c in this way, it is possible to reduce variations between pixels without precise alignment in the manufacturing process.

Also in the present configuration, the same effect as that of Embodiment 1 can be realized. Further, when the micro light emitting element 100 is miniaturized, there is a secondary effect that variation in the light emission angular distribution between the pixels 5 can be reduced.

Embodiment 5

Figure 7:
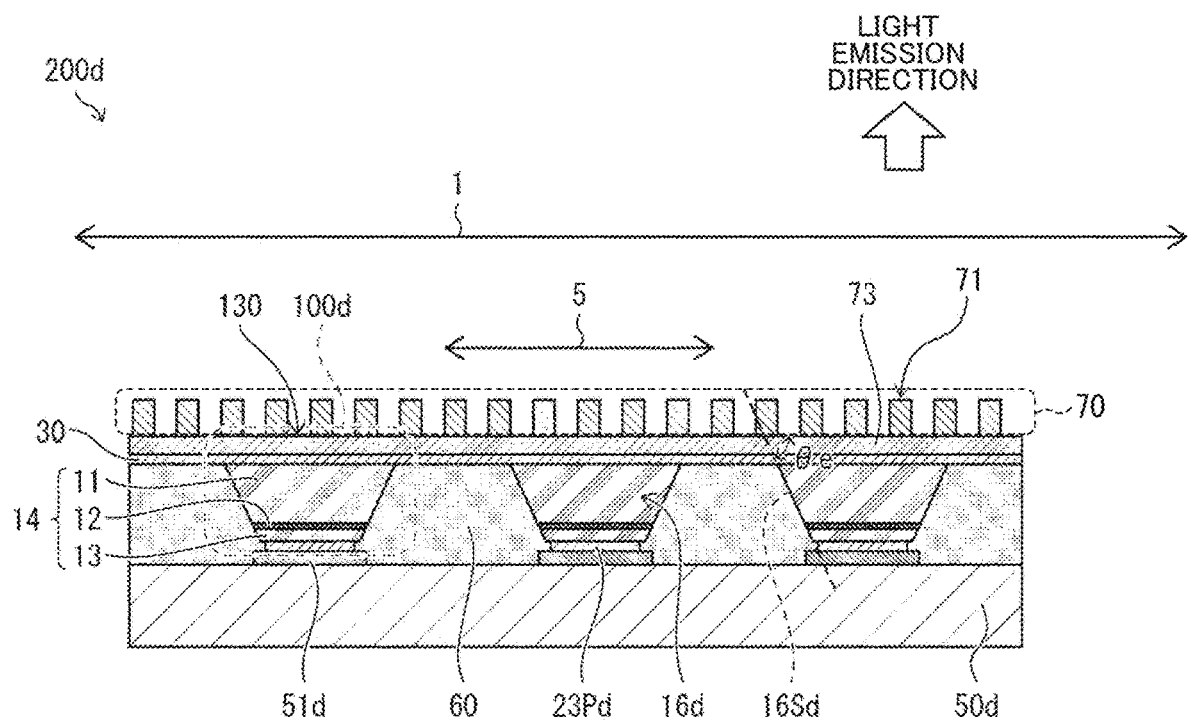
FIG. 7 is a schematic sectional view of a pixel region of an image display element according to Embodiment 5 of the present disclosure.

Another embodiment of the present disclosure will be described below with reference to FIG. 7. In an image display element 200d of Embodiment 5, a micro light emitting element 100d is different from the micro light emitting element 100 of Embodiment 1. That is, the micro light emitting element 100 has the P electrode 23P and the N electrode 23N on the second surface bonded to the drive circuit substrate 50, but the micro light emitting element 100d has a P electrode 23Pd on the second surface and the common N electrode 30 on the light emitting surface 130 side. The common N electrode 30 is a transparent electrode. The present configuration has an advantage that it is easy to miniaturize the micro light emitting element 100d because it is not necessary to have a space for the N electrode on the second surface.

In the image display element 200d, outside the pixel region 1, the common N electrode 30 and an N drive electrode 52d on a drive circuit substrate 50d are coupled via an N electrode 23Nd. In FIG. 7, the coupling method is not shown because the coupling method is not directly related to the present application (see FIG. 10). The P electrode 23Pd is coupled to a P drive electrode 51d on the drive circuit substrate 50d.

The current supplied from the drive circuit substrate 50d to the micro light emitting element 100d is transmitted to the P-side layer 13 from the P drive electrode 51d via the P electrode 23Pd. The current that has passed through the light emission layer 12 from the P-side layer 13 flows from the N-side layer 11 to the N drive electrode 52d via the common N electrode 30. In this way, the micro light emitting element 100d emits light with a predetermined intensity according to the amount of current supplied from the drive circuit substrate 50d.

An insulating film 73, which is a transparent protective layer, is disposed on the common N electrode 30 of the micro light emitting element 100d, and the surface of the insulating film 73 is the light emitting surface 130. The insulating film 73 plays a role of insulating the common N electrode 30 and the antenna 70 for a case that the convex portion is made of metal or semiconductor and also a role of protection layer of the common N electrode 30 for any materials of the convex portions. In order to suppress optical crosstalk via the insulating film 73, the insulating film 73 is preferably thin and has a thickness of 10 nm to 1000 nm. The convex portion 71 could be made of metal, semiconductor or dielectric in this embodiment.

Similar to the micro light emitting element 100, the micro light emitting element 100d is obtained by dividing the compound semiconductor layer 14 into individual bodies 16d. A body side surface 16Sd (side wall) of the body 16d is preferably tapered to open in the light emission direction. In FIG. 7, an inclination angle θe of the body side surface 16Sd is constant, but may be composed of a plurality of surfaces having different inclination angles.

Figure 8:
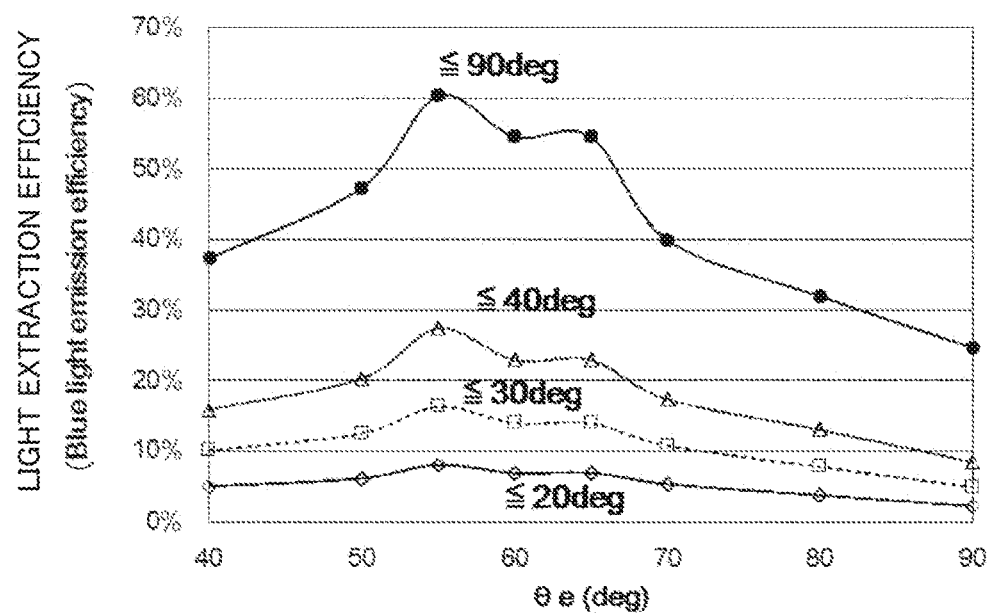
FIG. 8 is a simulation result showing a relationship between a light extraction efficiency and an antenna period according to Embodiment 5 of the present disclosure.

FIG. 8 shows a simulation result of the inclination angle dependence of the light extraction efficiency. By setting the inclination angle θe from 50° to 70°, the light extraction efficiency can be improved by about 20% to 50% as compared with the case where there is no inclination that opens in the light emission direction (the inclination angle θe is 90°). In this way, by tapering the body side surface 16Sd so as to open in the light emission direction, the light extraction efficiency from the micro light emitting element 100d can be greatly improved.

In order to suppress optical crosstalk between the micro light emitting elements 100d, it is preferable to surround the periphery of the micro light emitting element 100d with the light-shielding embedding material 60 or cover the body side surface 16Sd of the micro light emitting element 100d with a reflective material such as a highly reflective metal film. Further, by disposing a transparent insulating film between the body side surface 16Sd and a highly reflective metal film, the reflectance on the body side surface 16Sd can be increased and the light output can be further increased.

Also in the present embodiment, the same effect as that of Embodiment 1 can be realized.

Embodiment 6

Figure 9:
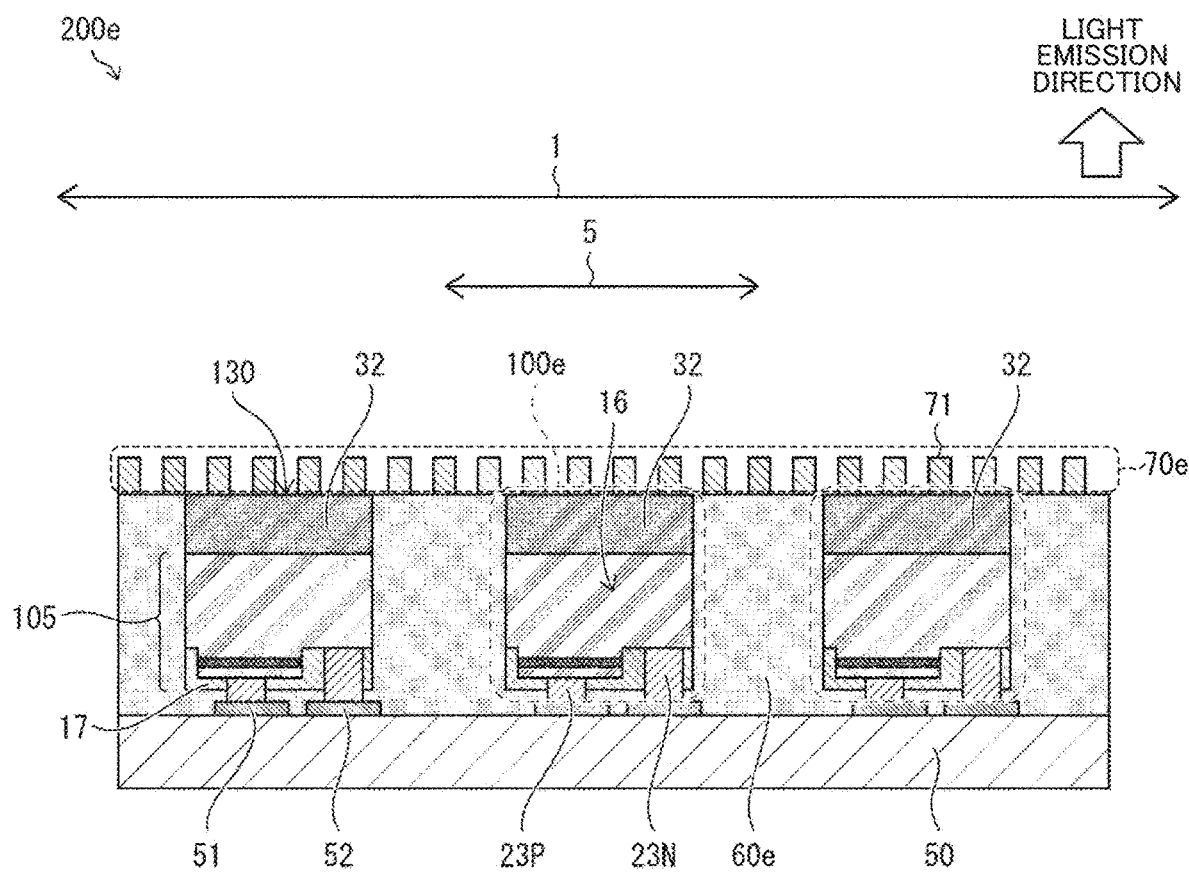
FIG. 9 is a schematic sectional view of a pixel region of an image display element according to Embodiment 6 of the present disclosure.

Another embodiment of the present disclosure will be described below with reference to FIG. 9. An image display element 200*e* of Embodiment 6 is a display element for a single color, and each pixel 5 includes one micro light emitting element 100*e* for a single color. Here, the case of a red display element will be described, but the same applies to other display colors. Further, a case of using blue light as the excitation light will be described, but it is also possible to use blue-violet light (wavelength 400 nm to 430 nm) or ultraviolet light (wavelength less than 400 nm).

The micro light emitting element 100*e* includes an excitation light emitting element 105 that emits blue light and a red wavelength converter 32. The excitation light emitting element 105 is the same as the micro light emitting element 100 of Embodiment 1. The light emitting surface 130 of the micro light emitting element 100*e* is the upper surface of the red wavelength converter 32.

Similar to Embodiment 1, the periphery of the micro light emitting element 100*e* is surrounded by a light-shielding embedding material 60*e*. That is, the periphery of the excitation light emitting element 105 and the red wavelength converter 32 is also covered with the embedding material 60*e*. Therefore, it is possible to suppress optical crosstalk between the micro light emitting elements 100*e*.

An antenna 70*e* is similar to that of Embodiment 1 shown in FIG. 1. The difference from FIG. 1 is that the period of the antenna 70*e* and the size of the convex portion 71 change as the emission wavelength changes to red light and a refractive index n of the light emitting surface 130 changes. Assuming that the optimum value of the period is P and the center wavelength of the emission peak is $\lambda$, $n \cdot P/\lambda$ is approximately constant. The convex portion 71 could be made of metal, semiconductor or dielectric in this embodiment.

For example, in Embodiment 1, the light emitting surface 130 is a nitride semiconductor, and an optimum value P of the period is P=250 nm at the refractive index n=2.47 and a center wavelength $\lambda$=450 nm. In the present configuration, the refractive index n=1.67, the center wavelength $\lambda$=620 nm, and the optimum value P of the period=510 nm. As a result of the simulation regarding the present embodiment, a period 525 nm showed the highest light extraction efficiency.

Also in the present embodiment, the same effect as that of Embodiment 1 can be realized.

Embodiment 7

(Structure of Image Display Element 200*f*)

Figure 10:
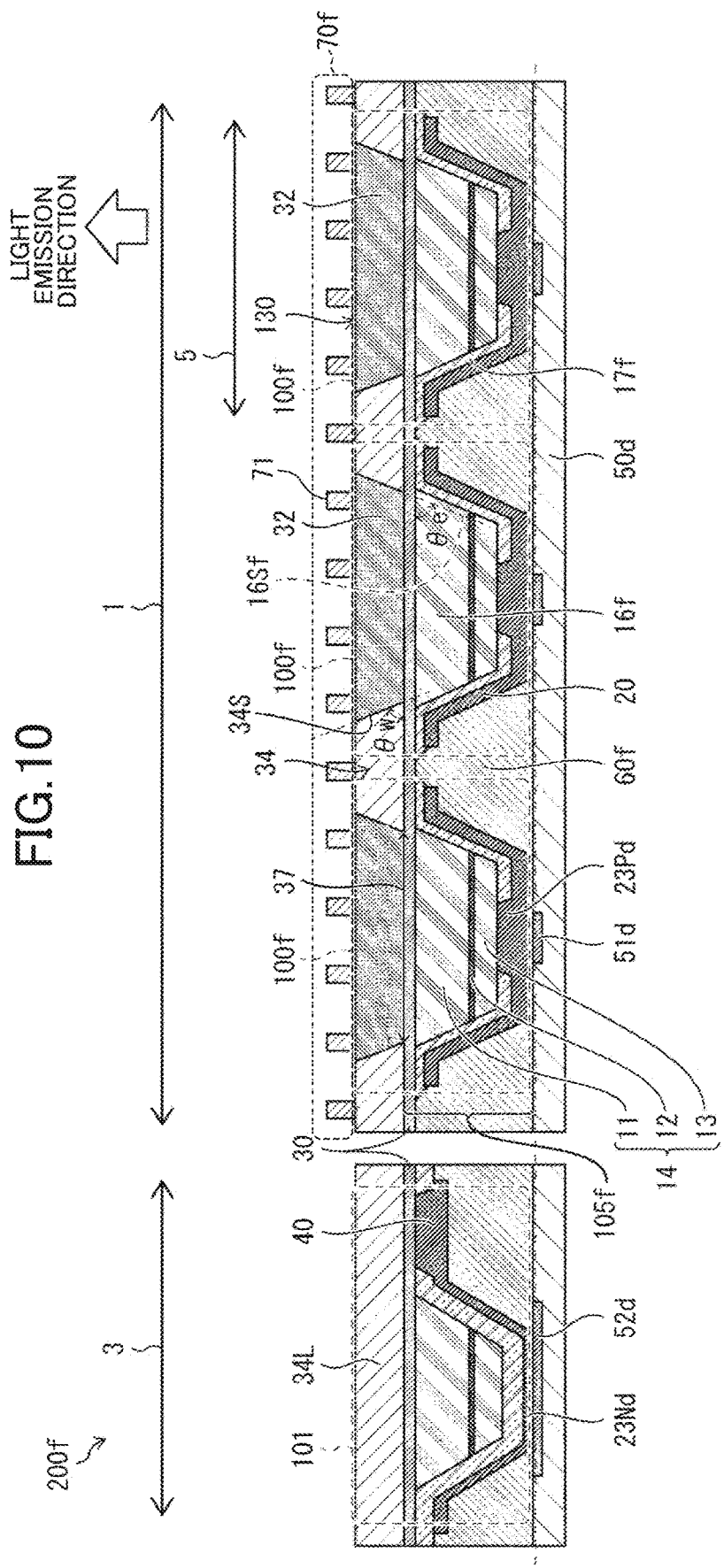
FIG. 10 is a schematic sectional view of a pixel region of an image display element according to Embodiment 7 of the present disclosure.
Figure 11:
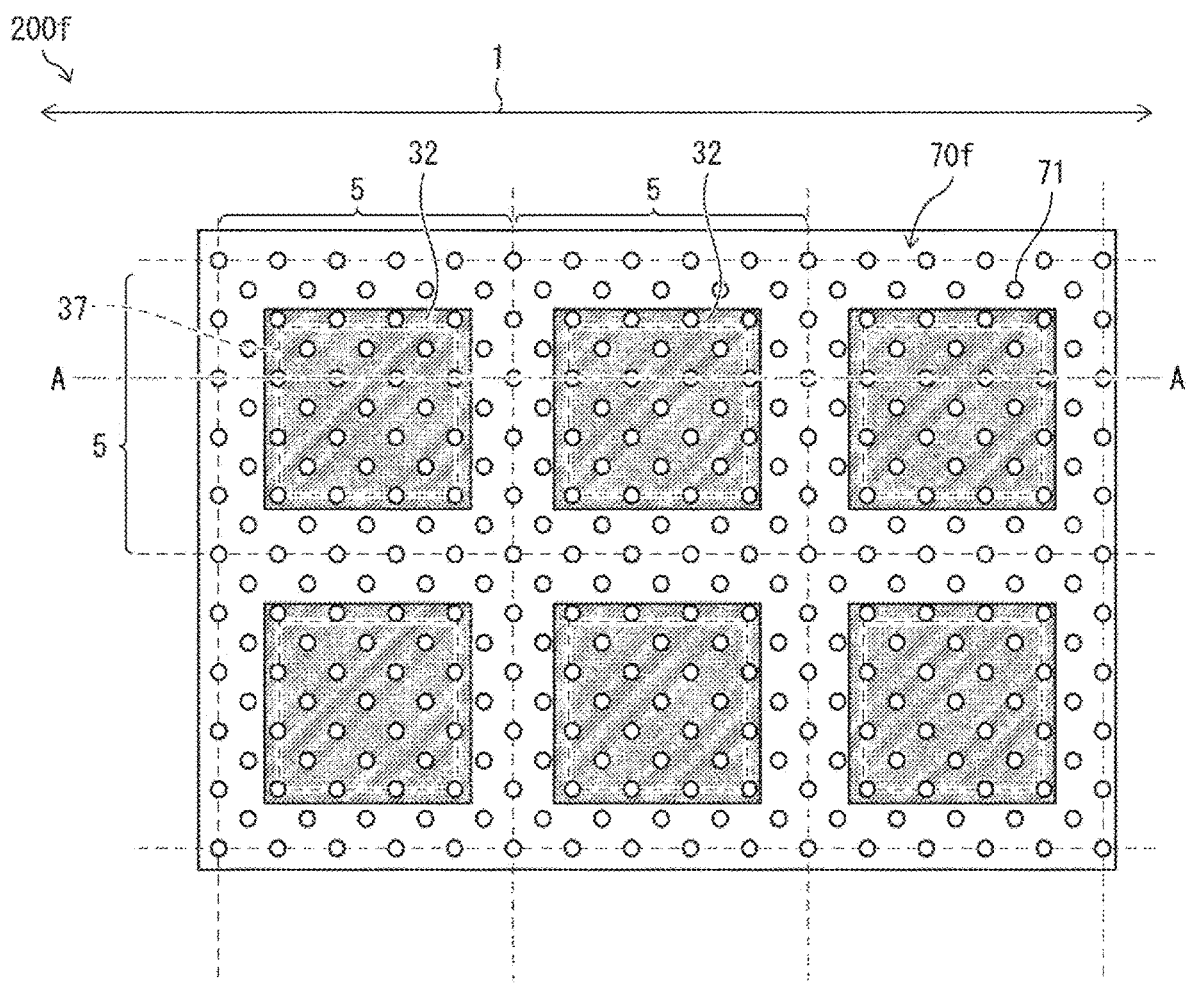
FIG. 11 is a schematic plan view of a pixel region of an image display element according to Embodiment 7 of the present disclosure.

FIG. 10 is a schematic sectional view of an image display element 200*f* according to Embodiment 7 of the present disclosure. FIG. 11 is a schematic plan view of the pixel region 1 of the image display element 200*f* according to Embodiment 7 of the present disclosure. The cross-sectional view taken along the line A-A of FIG. 11 is the pixel region 1 portion of FIG. 10. FIG. 10 also shows a schematic cross-sectional view of an N coupling region 3 outside the pixel region 1.

In the present embodiment, similar to Embodiment 6, the image display element 200*f* is a display element for a single color, and a micro light emitting element 100*f* includes an excitation light emitting element 105*f* that emits blue light that is excitation light, and a red wavelength converter 32 that absorbs blue light and converts the light into red light. In the present embodiment, the surface of the red wavelength converter 32 is the light emitting surface 130, and an antenna 70*f* is provided. The present embodiment is suitable when it is indispensable to miniaturize the micro light emitting element 100*f* in order to realize the high resolution image display element 200*f*.

As shown in FIG. 11, the antenna 70*f* has a configuration in which a unit cell has the convex portions 71 arranged at the four corners and the center of the square. When the unit cell is an equilateral triangle, the aspect ratio becomes an irrational number, and thus it is difficult to apply the antenna 70*f* to the micro light emitting element 100*f* array without precise alignment, for a general square pixel. However, such a problem can be avoided by making the unit cell square. For example, one side of the pixel 5 is 4.725 μm, and the period of the antenna 70*f* (the length of one side of the unit cell) is 675 nm. The convex portion 71 is similar to that of Embodiment 1. The convex portion 71 could be made of metal, semiconductor or dielectric in this embodiment.

In the excitation light emitting element 105*f* of the present configuration, a body side surface 16Sf is tapered to open in the light emission direction, and it is possible to suppress optical crosstalk and increase the blue absorption amount in the red wavelength converter 32 by covering the body side surface 16Sf and the lower surface with a highly reflective material. Further, by partitioning the red wavelength converter 32 by a partition wall 34 having a highly reflective partition wall side surface 34S, optical crosstalk in the red wavelength converter 32 is suppressed, and the light extraction efficiency from the red wavelength converter 32 into the air is improved.

Figure 12:
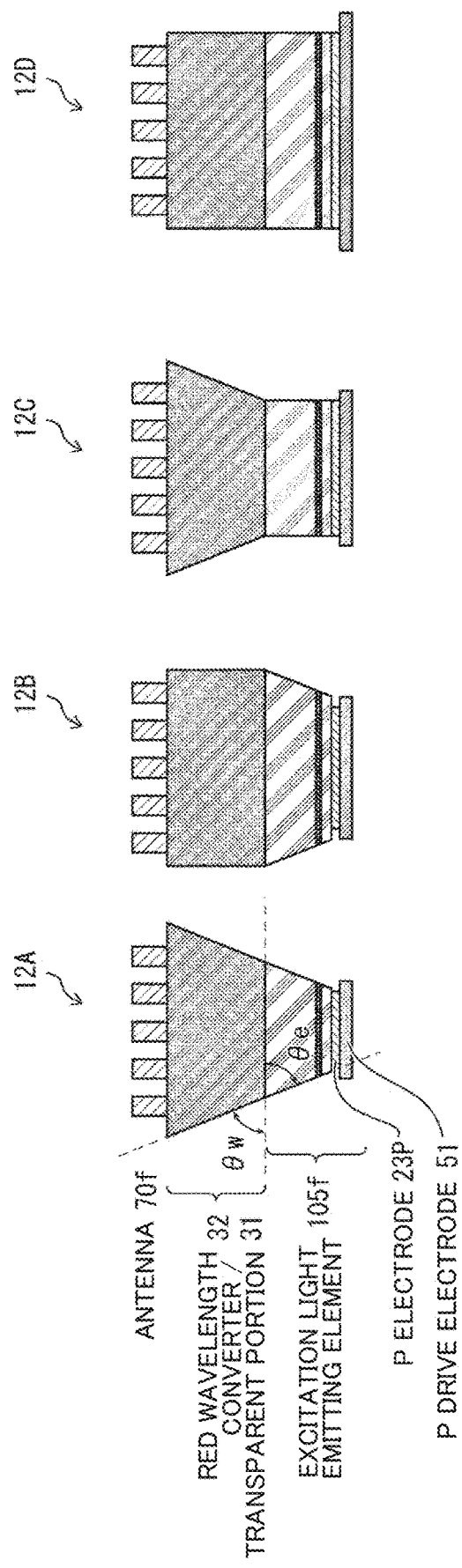
FIG. 12 is a schematic sectional views of a structure 12A that simulates the light extraction efficiency of a micro light emitting element according to Embodiment 7, and structures 12B, 12C and 12D of a simulated light emitting element for comparison with the structure 12A.
Figure 13:
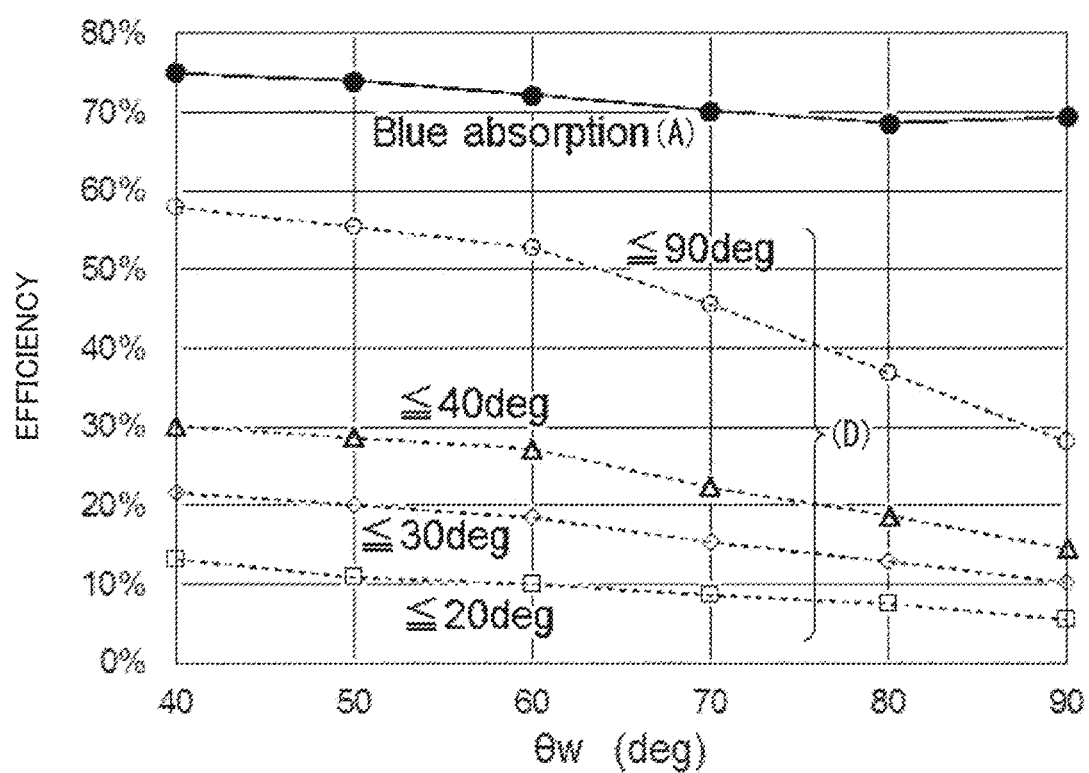
FIG. 13 is a simulation result showing a relationship between a red light extraction efficiency and θw according to Embodiment 7 of the present disclosure.

For comparison, Table 1 shows the simulation values of a blue light absorption amount (A) in the red wavelength converter 32 and an extraction efficiency (C) of red light in the structures of the four types of micro light emitting elements in the structure (structure 12A, structure 12B, structure 12C, and structure 12D) of the four types of micro light emitting elements shown in FIG. 12. The red wavelength converter 32 has a square planar shape, and the length of one side is 4.0 μm. Further, in the structure 12A, FIG. 13 shows a simulation result of the blue light absorption amount (A) and a red light extraction efficiency (D) in consideration of the blue light absorption amount, when an inclination angle θw is changed.

TABLE 1

| STRUCTURE | | WITHOUT ANTENNA (WO-Antenna) | 12A | 12B | 12C | 12D |
|---|---|---|---|---|---|---|
| BLUE LIGHT ABSORPTION AMOUNT (A) | | 73.1% | 71.9% | 74.7% | 34.7% | 36.1% |
| BLUE LIGHT LEAKAGE AMOUNT (B) | | 6.3% | 16.9% | 8.8% | 3.9% | 2.2% |
| RED LIGHT EXTRACTION EFFICIENCY (C) | $\leq 20°$ | 4.0% | 12.7% | 10.1% | 13.4% | 10.5% |
| | $\leq 30°$ | 8.9% | 22.5% | 18.4% | 23.9% | 18.4% |
| | $\leq 40°$ | 15.8% | 32.6% | 25.9% | 34.2% | 26.3% |
| | $\leq 90°$ | 42.5% | 64.7% | 47.8% | 68.2% | 48.3% |
| BLUE LIGHT ABSORPTION AMOUNT X RED LIGHT EXTRACTION EFFICIENCY (D) = (A) × (C) | $\leq 20°$ | 2.9% | 9.1% | 7.5% | 4.6% | 3.8% |
| | $\leq 30°$ | 6.5% | 16.2% | 13.7% | 8.3% | 6.6% |
| | $\leq 40°$ | 11.6% | 23.4% | 19.3% | 11.9% | 9.5% |
| | $\leq 90°$ | 31.0% | 46.5% | 35.7% | 23.6% | 17.4% |

The leftmost column (no antenna: WO-Antenna) in Table 1 is the simulation result in the structure 12A without the antenna. It is understood that the blue light absorption amount (A) in the red wavelength converter 32 is greatly influenced by the inclination angle θe of the body side surface 16Sf, and is less influenced by the inclination angle θw of the side surface (partition wall side surface 34S) of the red wavelength converter 32. Also, it is understood that the influence of the presence or absence of the antenna is small. It is understood that the light extraction efficiency (C) of red light is greatly influenced by the inclination angle θw of the side surface of the red wavelength converter 32 and is less influenced by the inclination angle θe of the body side surface 16Sf. Further, it is understood that the antenna 70f greatly improves the light extraction efficiency, and the smaller the angle, the greater the influence.

The product (D) of the blue light absorption amount (A) and the red light extraction efficiency (C) is shown in Table 1 and FIG. 13 as a red light extraction efficiency in consideration of the blue light absorption amount. In order to strongly emit light to the front, as in the structure 12A, it is indispensable to taper the side wall of the red wavelength converter 32 so as to open in the light emission direction and also incline so that the body side surface 16Sf also opens in the light emission direction.

As shown in FIG. 13, the smaller the inclination angle θw of the side surface of the red wavelength converter 32, the higher the red light extraction efficiency. However, if the inclination angle θw is reduced, an opening 37 becomes smaller as the red wavelength converter 32 becomes thicker. Therefore, the tilt angle θw has a lower limit. When the length of one side of the upper surface of the red wavelength converter 32 is L and the thickness is T, the inclination angle θw that satisfies 2·T/L=tan θw is the lower limit. Further, when the opening 37 becomes smaller, the light extraction efficiency from the excitation light emitting element 105f to the red wavelength converter 32 decreases, and thus it is indispensable to use the inclination angle θw that is larger than the lower limit of the inclination angle θw by a certain degree.

The combination form of the micro light emitting element and the wavelength conversion material described in Japanese Unexamined Patent Application Publication No. 2002-141492 or U.S. Patent Application Publication No. 2011/0297975 is a structure such as structure 12D, and from the light generated by the excitation light emitting element, the amount of light absorbed in the wavelength converter is 40% or less, which is very low. Further, the light extraction efficiency of the light generated in the wavelength converter from the wavelength converter is as low as 20% or less. Therefore, the structure 12A can realize excellent light emitting characteristics with respect to these related arts.

Further, in a phosphor for illumination treated in Japanese Unexamined Patent Application Publication No. 2018-013688, the phosphor particle diameter is as large as several tens of μm, the light scattering property is very high, and the phosphor has a thickness of several mm, and thus the traveling direction of light inside the phosphor is normally changed by scattering. Therefore, the light reflected without being emitted into the air while being incident on the light emitting surface of the phosphor can also be scattered inside the phosphor, be incident on the light emitting surface again by changing the traveling direction thereof, and be emitted into the air. That is, in the phosphor for illumination treated in Japanese Unexamined Patent Application Publication No. 2018-013688, the light extraction efficiency can be increased regardless of the outer shape of the phosphor.

However, in a microscopic light emitting element, quantum dots with a particle diameter of several nm to several tens nm and nanophosphors with a particle diameter of several tens nm to 300 nm are used for wavelength conversion, and thus there is almost no light scattering property, and light travels almost straight in the wavelength converter. In addition, the size of the wavelength converter is as small as several μm. As a result, as shown in the comparison in Table 1, in order to increase the light extraction efficiency of the down-converted light, it is highly relevant to taper the side surface (partition wall side surface 34S) of the wavelength converter so as to open in the light emission direction.

However, as a method of increasing the absorption amount of the excitation light in the red wavelength converter 32, as will be described later, the excitation light emitting element 105f itself can be covered with the wavelength converter, and in such a case, it is not necessary to taper the body side surface 16Sf so as to open in the light emission direction.

The excitation light emitting element 105f includes a body 16f (hereinafter, simply referred to as the body 16f) of the excitation light emitting element having the compound semiconductor layer 14 made of a nitride semiconductor, the P electrode 23Pd (second electrode), and a common N electrode 30 (first electrode). The compound semiconductor layer 14 made of a nitride semiconductor includes a light emission layer 12 that emits blue light, an N-side layer 11 (N-side layer, first conductive layer) that injects electrons into the light emission layer 12, and a P-side layer 13 (P-side layer, second conductive layer) that injects holes into the light emission layer 12.

In the present configuration, the N-side layer 11 of the compound semiconductor layer 14 made of a nitride semiconductor is disposed on the light emitting surface side, and the P-side layer 13 is disposed on the drive circuit substrate 50d side. Therefore, the common N electrode 30 coupled to the N-side layer 11 is disposed on the light emitting surface side, and the P electrode 23Pd coupled to the P-side layer 13 is disposed on the drive circuit substrate 50d side. The P electrode 23Pd is coupled to the P drive electrode 51d on the drive circuit substrate 50d. The common N electrode 30 is coupled to the N drive electrode 52d on the drive circuit substrate 50d in the N coupling region 3 outside the pixel region 1.

The excitation light emitting elements 105f are supplied with a current from the corresponding P drive electrodes 51d and emit light. The body 16f is obtained by dividing the compound semiconductor layer 14 made of a nitride semiconductor into the excitation light emitting elements 105f by dividing grooves. That is, the excitation light emitting elements 105f are individually divided, and the space between the excitation light emitting elements 105f is filled with the embedding material 60f.

The P drive electrodes 51d for supplying a current to the excitation light emitting element 105f are arranged in a two-dimensional array on the surface of the pixel region 1 in the drive circuit substrate 50d. Further, the N drive electrode 52d is disposed on the surface of the drive circuit substrate 50d outside the pixel region 1 (the surface of the N coupling region 3). The N drive electrode 52d is electrically connected to the common N electrode 30 (common N-electrode and light emitting surface side electrode) via a dummy element 101.

In the dummy element 101, the common N electrode 30 and the N electrode 23Nd are electrically connected via a coupling portion 40. The dummy element 101 is coupled to the N drive electrode 52d by the same coupling method as the excitation light emitting element 105f. A metal layer 34L is formed on the common N electrode 30 on the upper surface side of the dummy element 101 opposite to the drive circuit substrate 50d. Only the structure in which the P electrode 23Pd and the P drive electrode 51d are directly coupled is shown in the present specification, but a member for coupling such as a bump, a paste, or a nanoparticle may be interposed therebetween. The same applies to the N electrode 23Nd and the N drive electrode 52d.

It is preferable that a metal layer having a high reflectance with respect to visible light is disposed on the side of the P electrode 23Pd that is in contact with the body 16f. For example, the P electrode 23Pd has a metal layer containing silver or aluminum as a main component on the P-side layer 13 side. It is preferable to realize a good ohmic contact between these metal layers and the P-side layer 13. On the other hand, it is preferable to dispose a metal material that is easily coupled to the P drive electrode 51d on the side of the P electrode 23Pd that is in contact with the drive circuit substrate 50d. For example, the metal material is gold or copper. Thus, the P electrode 23Pd is composed of a plurality of metal layers and barrier layers.

The common N electrode 30 is composed of a transparent conductive layer that is electrically connected to the N-side layer 11, that is, a transparent conductive film. The common N electrode 30 may be an oxide semiconductor such as Indium-Tin-Oxide (ITO) or Indium-Zinc-Oxide (IZO), or may be a silver nanofiber film or the like. The common N electrode 30 is preferably as thin as possible in order to reduce the absorption of blue light. The wiring resistance is increased by reducing the thickness, but in the present configuration, the partition wall 34 that is a conductive material is electrically coupled to the common N electrode 30 and is disposed in the entire pixel region 1, and thus the wiring resistance between the N drive electrode 52d and the excitation light emitting element 105f can be kept low.

In the present configuration, a part of the convex portion 71 forming the antenna 70f is also disposed on the surface of the partition wall 34. Such a convex portion 71 may be electrically connected to the partition wall 34 when the convex portion 71 is conductive or semiconductive. Since the partition wall 34 is fixed to the ground potential, the surface of the partition wall 34 and the convex portion 71 electrically connected to the partition wall have the effect of reducing the optical crosstalk due to the antenna, similarly to the shield pattern 72 provided in Embodiment 3. That is, the convex portion 71 electrically connected to the partition wall 34 becomes a shield pattern.

The compound semiconductor layer 14 made of a nitride semiconductor, which constitutes the excitation light emitting element 105f, is divided into the body 16f by dividing grooves. The adjacent excitation light emitting elements 105f are not connected to each other via a part of the compound semiconductor layer 14 made of a nitride semiconductor. That is, as shown in FIG. 10, the body side surface 16Sf of the body 16f extends from one surface of the compound semiconductor layer 14 (the surface of the N-side layer 11) made of a nitride semiconductor to the other surface (the surface of the P-side layer 13). Therefore, it is possible to suppress light leakage between the excitation light emitting elements 105f adjacent to each other.

In the present embodiment, as shown in FIG. 11, the excitation light emitting element 105f has a quadrangular planar shape, and the body side surface 16Sf of the body 16f includes four surfaces. When the excitation light emitting element 105f has a polygonal planar shape and the number of angles is N (N is a natural number), N body side surfaces 16Sf are configured. When the micro light emitting element 100f has a circular planar shape, the body side surface 16Sf is a truncated cone side surface.

It is preferable that the body side surface 16Sf is tapered to open in the light emission direction. The inclination angle θe of the body side surface 16Sf is preferably approximately 30° or more and 80° or less. The inclination angle θe is an angle formed by the body side surface 16Sf and the top surface of the body 16f. The inclination angle θe is preferably constant, but the inclination angle may change depending on the manufacturing process.

The optimum value of the inclination angle of the body side surface 16Sd in Embodiment 5 is not the same as the optimum value of the inclination angle of the body side surface 16Sf in the present configuration. In Embodiment 5, the light generated in the compound semiconductor is emitted into the air as it is, and thus the inclination angle θe is determined by optimizing the emission efficiency into the air including the emission angular distribution. However, in the present configuration, it is indispensable to select the inclination angle θe that maximizes the absorption amount of blue light mainly in the red wavelength converter 32. Therefore, both do not necessarily have the same angle.

In the present configuration, the light emission layer 12 is disposed on the lower surface side of the body 16f, that is, on the drive circuit substrate 50d side, but may be disposed on the upper surface side of the body 16f. Even if the inclination angle θe is set small in order to increase the blue light absorption amount in the red wavelength converter 32, the area of the horizontal plane of the light emission layer 12 is hardly reduced. Therefore, the increase in the current density of the current passing through the light emission layer 12 is small, and the decrease in the internal quantum efficiency can be suppressed.

The body side surface 16Sf is covered with a transparent insulating film 17f (first transparent insulating film), and the transparent insulating film 17f is covered with a reflective material 20 (second metal film). That is, the body side surface 16Sf is covered with the reflective material 20. The transparent insulating film 17f is preferably made of a material, such as $SiO_2$, which is transparent to visible light and has a refractive index smaller than that of the compound semiconductor layer 14 made of a nitride semiconductor.

The transparent insulating film 17f is disposed between the body side surface 16Sf and the reflective material 20. The film thickness of the transparent insulating film 17f is preferably 75 nm or more, and more preferably 400 nm or more.

In the present configuration, in order to simplify the manufacturing process, the P electrode 23Pd is extended to above the body side surface 16Sf to form the reflective material 20 that covers the body side surface 16Sf. However, the reflective material 20 is not necessarily coupled to the P electrode 23Pd. The reflective material 20 may be composed of a single layer or a plurality of layers. It is preferable that the reflective material 20 has a metal layer containing silver or aluminum as a main component, which has a large reflectance with respect to visible light, on the transparent insulating film 17f side, that is, on the compound semiconductor layer 14 side made of a nitride semiconductor. The reflective material 20 needs to shield light, and the total thickness thereof is preferably several tens of nm or more.

It is preferable that the reflective material 20 is disposed so as to cover the entire excitation light emitting element 105f in a plan view from the drive circuit substrate 50d side. If there is an exposed portion of the compound semiconductor layer 14 made of a nitride semiconductor, light is emitted to the outside and causes optical crosstalk, and thus it is preferable that there is no such exposed portion.

In the present configuration, most of the bottom surface and the side surface of the excitation light emitting element 105f are covered with the P electrode 23Pd and the reflective material 20, and light leakage is very small. However, since there is a portion that is not covered by the reflective material 20 on the upper surface side surface of the body 16f, the embedding material 60f is preferably a light-shielding material in order to suppress optical crosstalk through this portion. As such an embedding material 60f, a light-absorbing material such as carbon black, a white resin containing $TiO2$ particles, or the like can be used.

Further, in FIG. 10, the same effect can be obtained by disposing a light-shielding material as an upper part of the embedding material 60f and disposing a transparent material as a lower part of the embedding material 60f. If the exposed portion of the transparent insulating film 17f that is not covered with the reflective material 20 is thin and the optical crosstalk is small, the embedding material 60f may be a transparent material.

The partition wall 34 that partitions the red wavelength converter 32 is made of a metal material having a high reflectance with respect to visible light. Therefore, the partition wall side surface 34S, which is the side surface thereof, is made of a light reflecting material. Further, the side surface is tapered to open in the light emission direction. That is, the partition wall side surface 34S of the partition wall 34 is inclined in a forward taper.

The inclination angle θw is preferably smaller than 90 degrees, more preferably about 45 degrees to 80 degrees. This is because when the inclination angle θw becomes smaller, the bottom width of the partition wall 34 becomes larger, the width of the partition wall 34 occupying the length of one side of the pixel 5 becomes larger, and the excitation light emitting element 105f becomes smaller. When the area of the pixel 5 is small, the area of the excitation light emitting element 105f is reduced, and thus the effective area of the light emission layer 12 is reduced, the density of a current passing through the light emission layer 12 is increased, and light emission efficiency decreases and temperature rises significantly.

Inside the red wavelength converter 32, blue light is absorbed and red light is generated. From the generated red light, not much red light is directly emitted into the air. Part of the generated red light is lost due to reflection in the red wavelength converter 32. Most of the generated red light is incident onto the body 16f, is reflected in the body 16f, and returns to the red wavelength converter 32 again. Part of the red light returned to the red wavelength converter 32 is emitted into the air, and the rest is lost due to reflection in the red wavelength converter 32, or is incident onto the body 16f again. As described above, when the red light is emitted to the outside, it is highly relevant to reduce the loss due to reflection in the red wavelength converter 32 and to efficiently return the red light incident on the body 16f to the red wavelength converter 32.

In order to reduce the loss of light due to reflection inside the red wavelength converter 32, it is indispensable to cover the red wavelength converter 32 with a light reflecting material having a high reflectance except for the coupling portion with the excitation light emitting element 105f. For that purpose, it is relevant that the partition wall side wall 34S is made of a light reflecting material such as a high-reflectance metal film and the opening 37 at the bottom of the partition wall 34 is inside the upper end of the reflective material 20 of the excitation light emitting element 105f. By configuring the partition wall side surface 34S with a high-reflectance metal film, it is possible to suppress leakage of light from the partition wall 34, improve the reflectance on the partition wall side surface 34S, and reduce light loss.

By disposing the opening 37 at the bottom of the partition wall 34 inside the upper end of the reflective material 20 of the excitation light emitting element 105f, when viewed from the red wavelength converter 32, the embedding material 60f is not exposed, and loss and optical crosstalk due to light leakage from the red wavelength converter 32 to the embedding material 60f can be reduced. All the light emitted downward from the red wavelength converter 32 can be guided to the body 16f of the excitation light emitting element 105f and returned to the red wavelength converter 32 via the excitation light emitting element 105f.

Also in the present embodiment, the same effect as that of Embodiment 1 can be realized.

Embodiment 8

Another embodiment of the present disclosure will be described below with reference to FIG. 14. The image display element 200g of Embodiment 8 is a display element for a single color including the micro light emitting element 100g having the red wavelength converter 32 as in the case of Embodiment 7, but the difference is that a dielectric multilayer film 74 is provided on the surface of the red wavelength converter 32. In the present configuration, the surface of the dielectric multilayer film 74 is the light emitting surface 130.

The red wavelength converter 32 will be described, but the same applies to other wavelengths. The dielectric multilayer film 74 has a property of reflecting excitation light and transmitting red light. Thereby, even if the red wavelength converter 32 is thin, it is possible to reduce the leakage of the excitation light and increase the intensity of the red light. In FIG. 14, the dielectric multilayer film 74 is disposed continuously across the pixels 5, but may be formed separately for each pixel. The convex portion 71 could be made of metal, semiconductor or dielectric in this embodiment.

Figure 14:
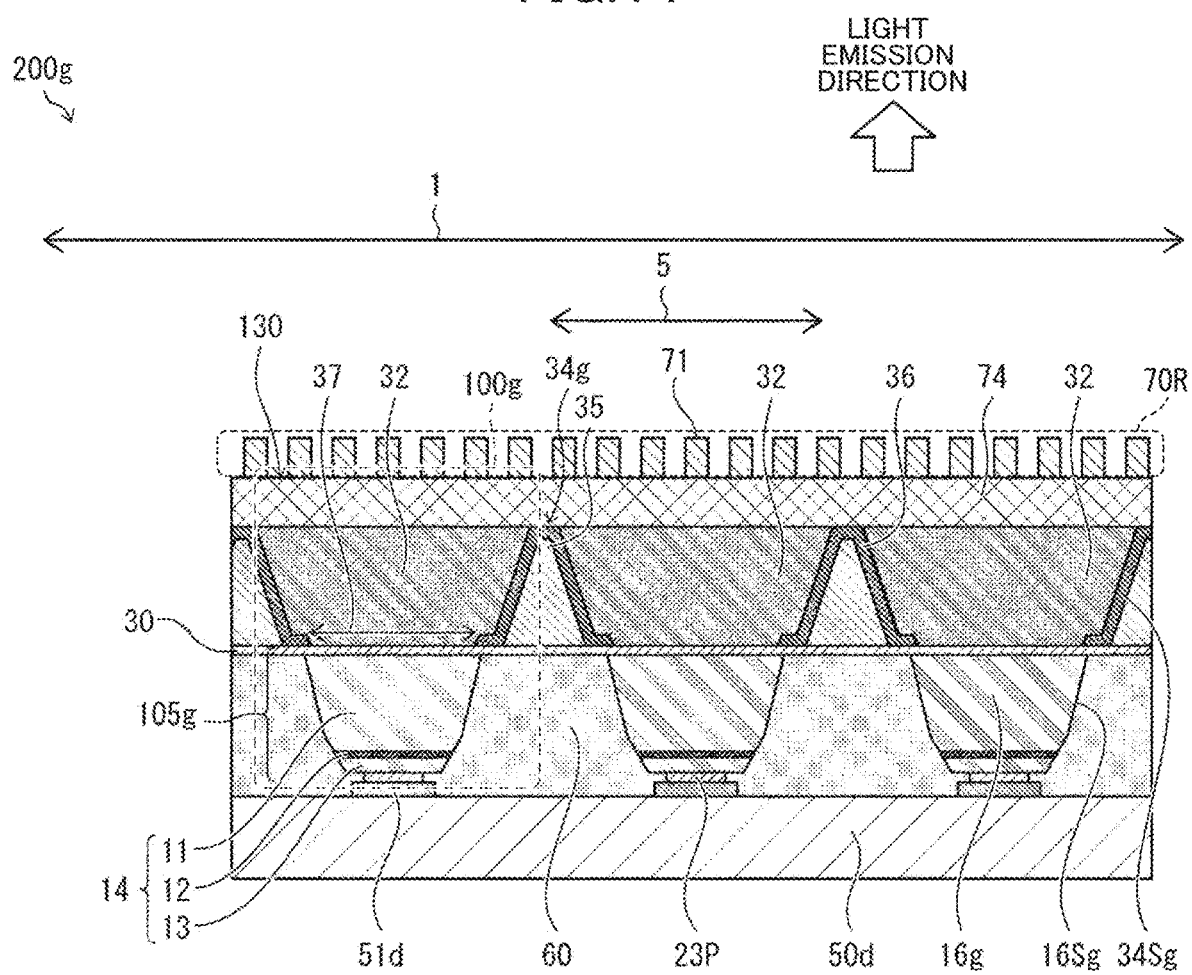
FIG. 14 is a schematic sectional view of an image display element according to Embodiment 8 of the present disclosure.

In the configuration of FIG. 14, a body side surface 16Sg (side wall) of a body 16g of an excitation light emitting element 105g is inclined about 30 degrees to 60 degrees in the periphery of the light emission layer 12, and the side surface of the N-side layer 11 is also inclined about 85 degrees to 70 degrees. With such a shape of the body 16g, the absorption efficiency of blue light in the red wavelength converter 32 can be increased. Although omitted in FIG. 14, as in FIG. 10 of Embodiment 7, by covering these inclined surfaces with a transparent insulating film and further covering the outside with a highly reflective metal film such as aluminum or silver, the absorption efficiency can be further improved.

Further, a partition wall 34g for partitioning the red wavelength converter 32 is not configured with a single material as in Embodiment 7, but is configured with a partition wall base material 35 and a partition wall reflective material 36 (light reflecting material) covering the surface thereof. The surface of the partition wall reflective material 36 on the side surface of the partition wall 34g is a reflective surface, and is a partition wall side surface 34Sg. When the thickness of the partition wall reflective material 36 is substantially constant, the inclination angle θw of the reflective surface is approximately equal to the inclination angle of the side surface of the partition wall base material 35. The partition wall base material 35 can be made of, for example, an inorganic material such as $SiO_2$ or SiN, or a resin material such as a photoresist material. The partition wall reflective material 36 can be formed of, for example, a highly reflective metal film. Thus, the partition wall 34g may be composed of a plurality of members as long as the partition wall side surface 34Sg is a good reflective surface.

When the partition wall 34g is formed of a single reflective material as in Embodiment 7, a metal film having a thickness larger than that of the partition wall 34g is deposited, and the partition wall 34g having an inclined surface needs to be processed by a photolithography method and a dry etching technique. Since the height of the partition wall 34g may be several µm, a very thick metal film is indispensable, but the surface of such a thick metal film has large irregularities, and precise alignment with the underlying layer is difficult. Further, since it is desirable that the bottom of the partition wall side surface 34Sg does not cover the light emitting surface 130 of the excitation light emitting element 105g, as the pixel size of the image display element 200g becomes smaller, it is indispensable to precisely align the partition wall 34g with the light emitting surface 130 of the excitation light emitting element 105g. Therefore, the above problem can be avoided by forming the central portion of the partition wall 34g (partition wall base material 35) with a transparent material that is easy to perform precision alignment and has less surface irregularities and covering the surface with the partition wall reflective material 36.

Also in the present embodiment, the same effect as that of Embodiment 1 can be realized.

Embodiment 9

Figure 15:
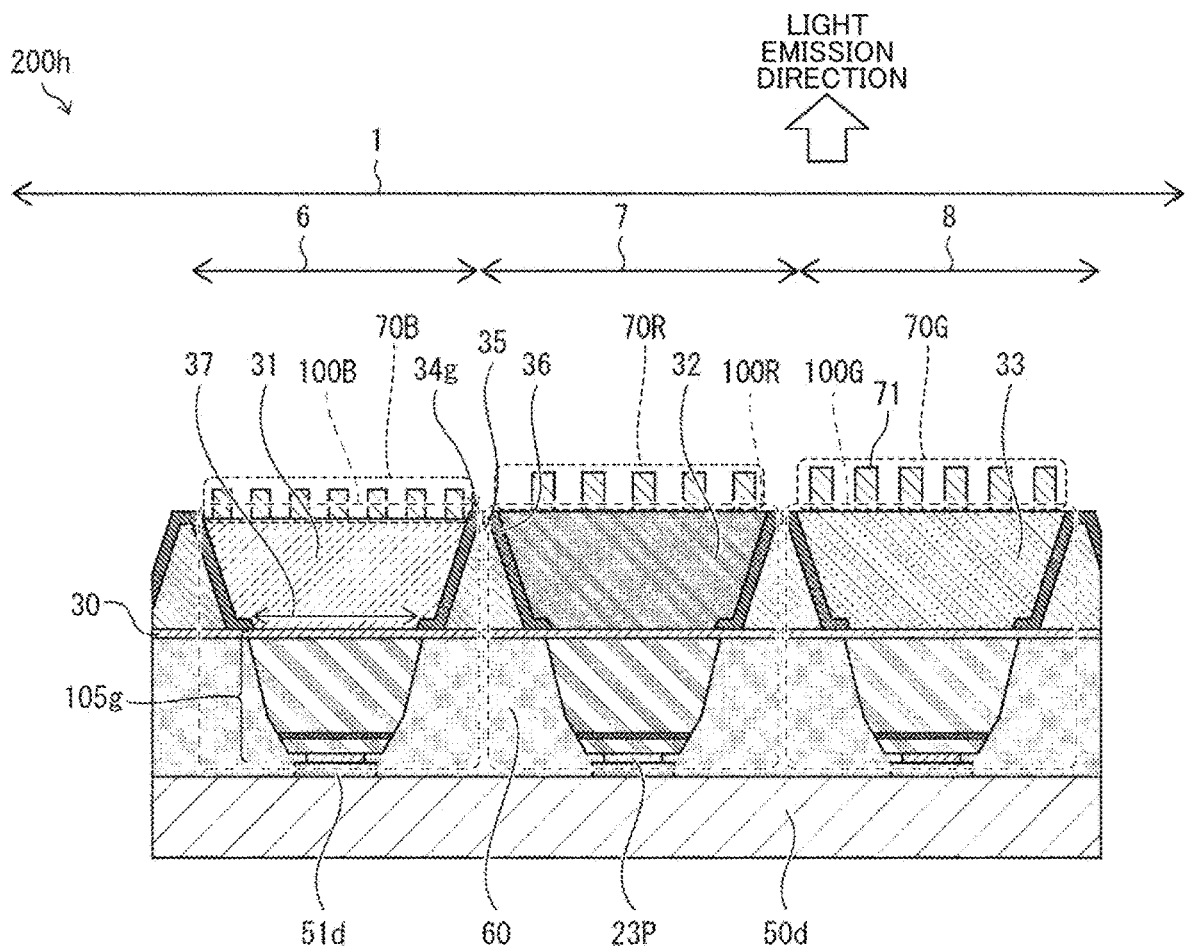
FIG. 15 is a schematic sectional view of an image display element according to Embodiment 9 of the present disclosure.

Another embodiment of the present disclosure will be described below with reference to FIGS. 15 and 16. FIG. 15 is a cross-section taken along the line A-A in FIG. 16. The image display element 200h of the present configuration is a full-color display element of RGB three primary colors, and the pixel 5 includes a blue sub-pixel 6, a red sub-pixel 7, and a green sub-pixel 8. The blue sub-pixel 6 includes one blue light micro light emitting element 100B, the red sub-pixel 7 includes one red light micro light emitting element 100R, and the green sub-pixel 8 includes two green light micro light emitting elements 100G.

The red light micro light emitting element 100R includes the excitation light emitting element 105g that emits blue light and the red wavelength converter 32. Similarly, the green light micro light emitting element 100G includes the excitation light emitting element 105g and a green wavelength converter 33. The blue light micro light emitting element 100B includes the excitation light emitting element 105g and a transparent portion 31.

The excitation light emitting element 105g is the same as the micro light emitting element 100 of Embodiment 1. The light emitting surface 130 of the blue light micro light emitting element 100B is the upper surface of the transparent portion 31. The light emitting surface 130 of the red light micro light emitting element 100R is the upper surface of the red wavelength converter 32, and the light emitting surface 130 of the green light micro light emitting element 100G is the upper surface of the green wavelength converter 33.

In the present configuration, for red and green, a wavelength converter that down-converts the wavelength is provided by using blue light as excitation light, and the blue light is used as the excitation light as it is. However, it is also possible to generate blue light by down-converting near-ultraviolet light or ultraviolet light as excitation light. In the following description, the transparent portion 31, the red wavelength converter 32, and the green wavelength converter 33 may be simply referred to as a wavelength converter when it is not necessary to distinguish therebetween.

The excitation light emitting element 105g that generates excitation light is inclined so that the body side surface 16Sg opens in the light emission direction in order to improve the light extraction efficiency, as in Embodiment 8. Similarly to Embodiment 8, the side walls (partition wall side surface 34Sg) of the transparent portion 31, the red wavelength converter 32, and the green wavelength converter 33 are also tapered to open in the light emission direction, and the side walls are configured with the partition wall reflective material 36.

In the present configuration, the antennas of different patterns (forms) are arranged for the micro light emitting elements of each emission color. On the surface of the transparent portion 31, which is the light emitting surface 130 of the blue light micro light emitting element 100B, a blue light antenna 70B is disposed, on the surface of the red wavelength converter 32, which is the light emitting surface 130 of the red light micro light emitting element 100R, a red light antenna 70R is disposed, and on the surface of the green wavelength converter 33, which is the light emitting surface 130 of the green light micro light emitting element 100G, a green light antenna 70G is disposed. The convex portion 71 could be made of metal, semiconductor or dielectric in this embodiment.

For example, the period of the blue light antenna 70B is 475 nm, the period of the green light antenna 70G is 555 nm, and the period of the red light antenna 70R is 675 nm, and in either case, the arrangement pattern of the convex portions 71 is the same as the arrangement pattern of the antenna 70f of Embodiment 7.

As described in Embodiment 6, assuming that the optimum value of the period is P and the center wavelength λ of the emission peak, n·P/λ is approximately constant. In the configuration of FIG. 15, the difference in the refractive index of the light emitting surface 130 of each sub-pixel is not large, and thus the antenna period of each sub-pixel is almost proportional to the center wavelength λ. Therefore, a relationship "the period of the blue light antenna 70B<the period of the green light antenna 70G<the period of the red light antenna 70R" is established.

Figure 16:
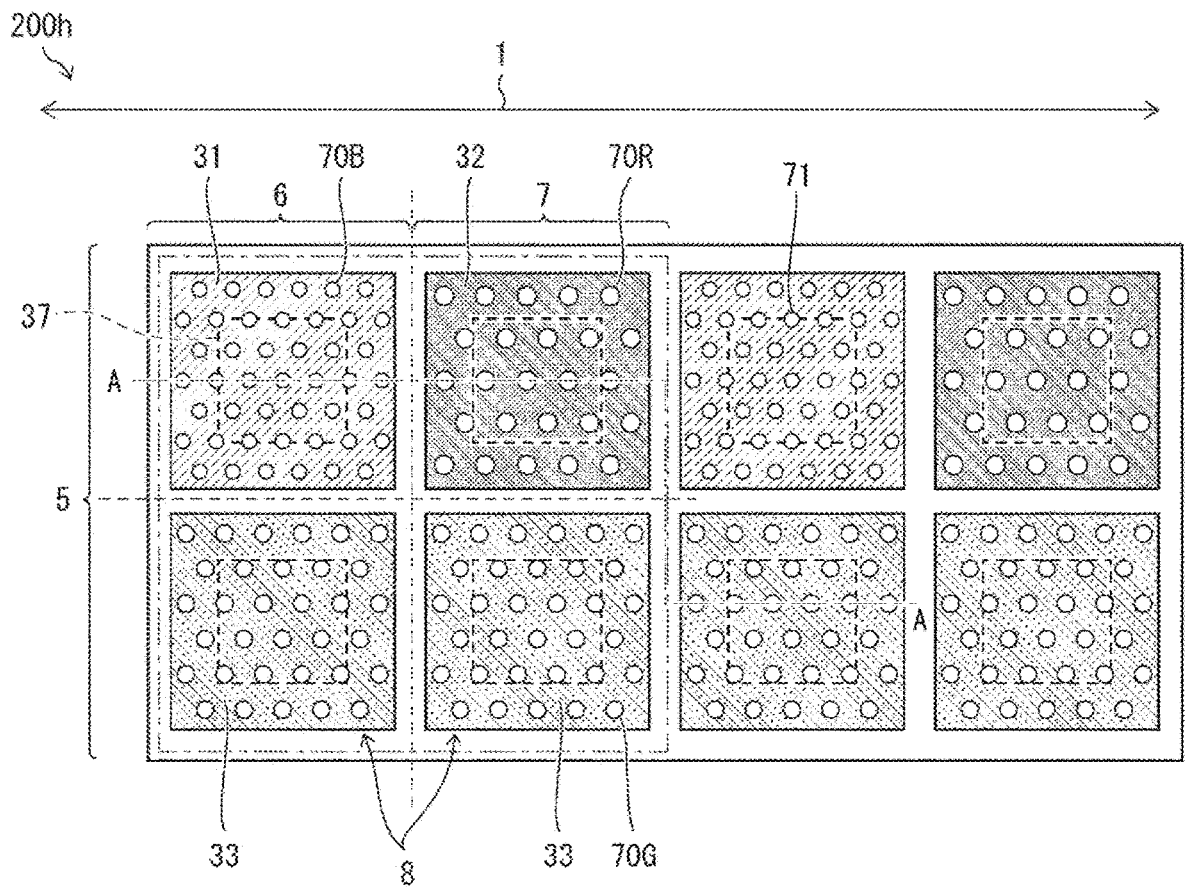
FIG. 16 is a schematic plan view of an image display element according to Embodiment 9 of the present disclosure.

FIGS. 15 and 16, the convex portion 71 of each antenna is disposed only on the light emitting surface 130, but the convex portion 71 may be disposed on the surface of the partition wall 34g. The convex portion 71 coupled to the partition wall 34g is electrically fixed to the ground potential to form a shield pattern when the convex portion 71 is made of metal or semiconductor.

The present embodiment is configured to generate red light and green light by the wavelength converter, but it is also possible to adopt a micro light emitting element that emits red light or green light, respectively.

Also in the present embodiment, the same effect as that of Embodiment 1 can be realized. Further, the light emission distributions of the sub-pixels can be adjusted to match with each other.

Embodiment 10

Another embodiment of the present disclosure will be described below with reference to FIG. 17. An image display element 200i of Embodiment 10 includes a blue light micro light emitting element 100B, a red light micro light emitting element 100Ri, and a green light micro light emitting element 100Gi. The present configuration is a full-color display element similar to that of Embodiment 9. The difference from Embodiment 9 is that a color filters 75 is disposed on the wavelength converters (red wavelength converter 32 and green wavelength converter 33), respectively.

When converting blue light into red or green light by using the wavelength converter, it is difficult to completely suppress leakage of blue light that is excitation light. In particular, when the pixel 5 is miniaturized and the thickness of the wavelength converter needs to be reduced, the excitation light may leak. It is possible to suppress the leakage of the excitation light by disposing each color filter 75 that absorbs excitation light and transmits red light and green light.

Figure 17:
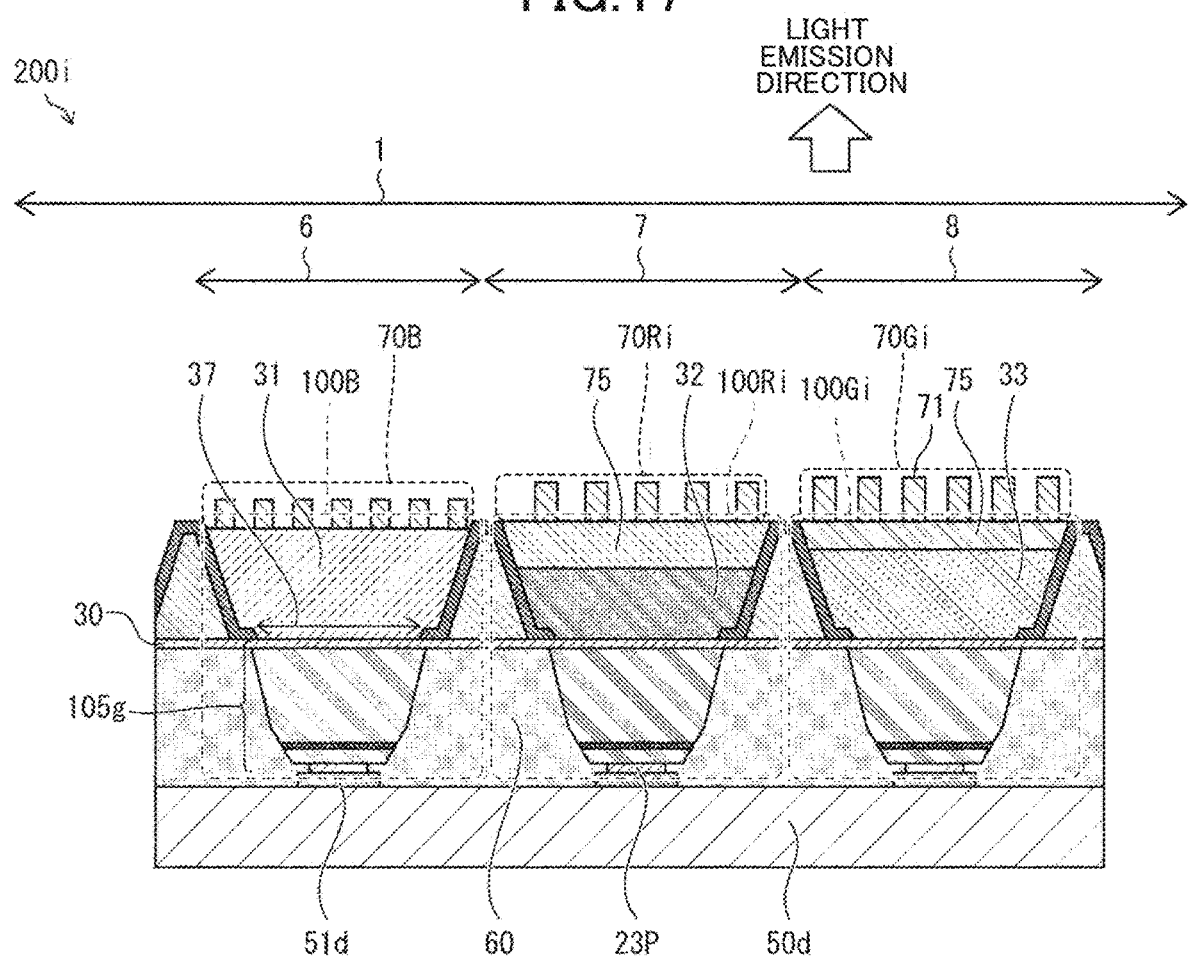
FIG. 17 is a schematic sectional view of an image display element according to Embodiment 10 of the present disclosure.

In the image display element 200i, as shown in FIG. 17, the color filter 75 is disposed on the red wavelength converter 32, and a red light antenna 70Ri is disposed on the surface of the color filter 75. The same applies to a green light antenna 70Gi. In this case, the light emitting surfaces of the red light micro light emitting element 100Ri and the green light micro light emitting element 100Gi are the surfaces of the respective color filters 75. Also in the present configuration, it is preferable to dispose the antennas of different patterns (forms) for the micro light emitting elements of each emission color, as in Embodiment 9. The convex portion 71 could be made of metal, semiconductor or dielectric in this embodiment.

Also in the present embodiment, the same effect as that of Embodiment 1 can be realized. Further, it is possible to realize a secondary effect that leakage of excitation light can be reduced.

Embodiment 11

Figure 18:
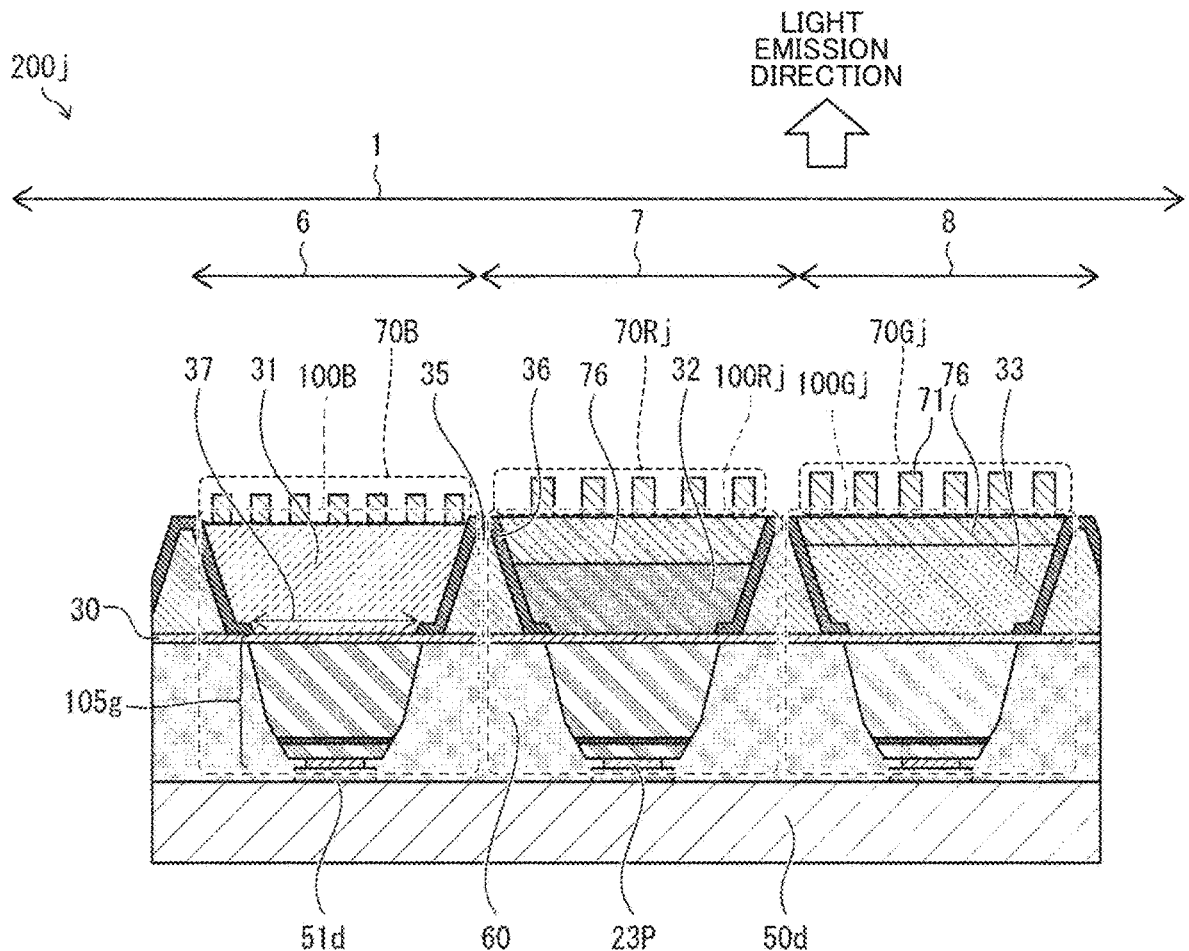
FIG. 18 is a schematic sectional view of an image display element according to Embodiment 11 of the present disclosure.

Another embodiment of the present disclosure will be described below with reference to FIG. 18. An image display element 200j of Embodiment 11 includes a blue light micro light emitting element 100B, a red light micro light emitting element 100Rj, and a green light micro light emitting element 100Gj. The present configuration is a full-color display element similar to that of Embodiment 9. The difference from Embodiment 9 is that a transparent layer 76 is disposed on each of the wavelength converter (red wavelength converter 32 and green wavelength converter 33).

In order to miniaturize the pixel 5, the wavelength converter also needs to be thin. In order to realize a thin wavelength converter, the wavelength converter may have a high refractive index. For example, there is a case where the concentration of a wavelength conversion material (quantum dot, nanophosphor, dye, and the like) is increased to increase the absorption coefficient of excitation light. The higher the refractive index of the light emitting surface, the shorter the period of the antenna needs to be. The shorter the period of the antenna, the more difficult it is to process the antenna.

Therefore, by providing the transparent layer 76 on the surfaces of the wavelength converters (red wavelength converter 32 and green wavelength converter 33) respectively, the light emitting surface of the micro light emitting element (red light micro light emitting element 100Rj and green light micro light emitting element 100Gj) can be replaced with the transparent layer 76 from the wavelength converter, and the period of the antenna (red light antenna 70Rj and green light antenna 70Gj) can be increased. Also in the present configuration, it is preferable to dispose the antennas of different patterns (forms) for the micro light emitting elements of each emission color, as in Embodiment 9. The convex portion 71 could be made of metal, semiconductor or dielectric in this embodiment.

Further, in the present configuration, even if the thicknesses of the red wavelength converter 32 and the green wavelength converter 33 are largely different, the surface of each sub-pixel can be easily flattened. For example, after forming the partition wall 34g, and then after forming the red wavelength converter 32 and the green wavelength converter 33, respectively, when forming the transparent portion 31, if a transparent resin having a high fluidity is used and the transparent resin is applied to the red sub-pixel 7 and the green sub-pixel 8 as well, a flat surface can be obtained by the flow of the resin. If the surface can be made flat, the antenna can be easily formed.

Also in the present embodiment, the same effect as that of Embodiment 1 can be realized. Further, it is possible to realize a secondary effect that the period of the antenna is lengthened to facilitate manufacturing.

Embodiment 12

Another embodiment of the present disclosure will be described below with reference to FIG. 19. The configuration of an image display element 200k of Embodiment 12 is different from the other examples in that the antenna is embedded in a resin layer having a low refractive index.

The antennas (blue light antenna 70Bk, red light antenna 70Rk, and green light antenna 70Gk) formed on the light emitting surface 130 are covered with a transparent low refractive index resin 77. The low refractive index resin 77 is, for example, a siloxane-based resin and has a refractive index of 1.3 or less. By covering with such a low refractive index resin 77, the antenna can be protected from peeling, falling, corrosion, and the like, and long-term reliability can be improved.

Further, the antenna is created on another substrate, the low refractive index resin 77 is applied to form a member in which the antenna is embedded in the low refractive index resin 77, and then the antenna is peeled from the substrate, and attached to the light emitting surface 130. A finer antenna can be formed with high accuracy by attaching the antenna to the light emitting surface 130 after forming the antenna on another substrate. Also in the present configuration, it is preferable to dispose the antennas of different patterns (forms) for the micro light emitting elements of each emission color, as in Embodiment 9. The convex portion 71 could be made of metal, semiconductor or dielectric in this embodiment.

Also in the present embodiment, the same effect as that of Embodiment 1 can be realized. In addition, a secondary effect of improving the long-term reliability of the antenna can be realized.

Embodiment 13

Figure 20:
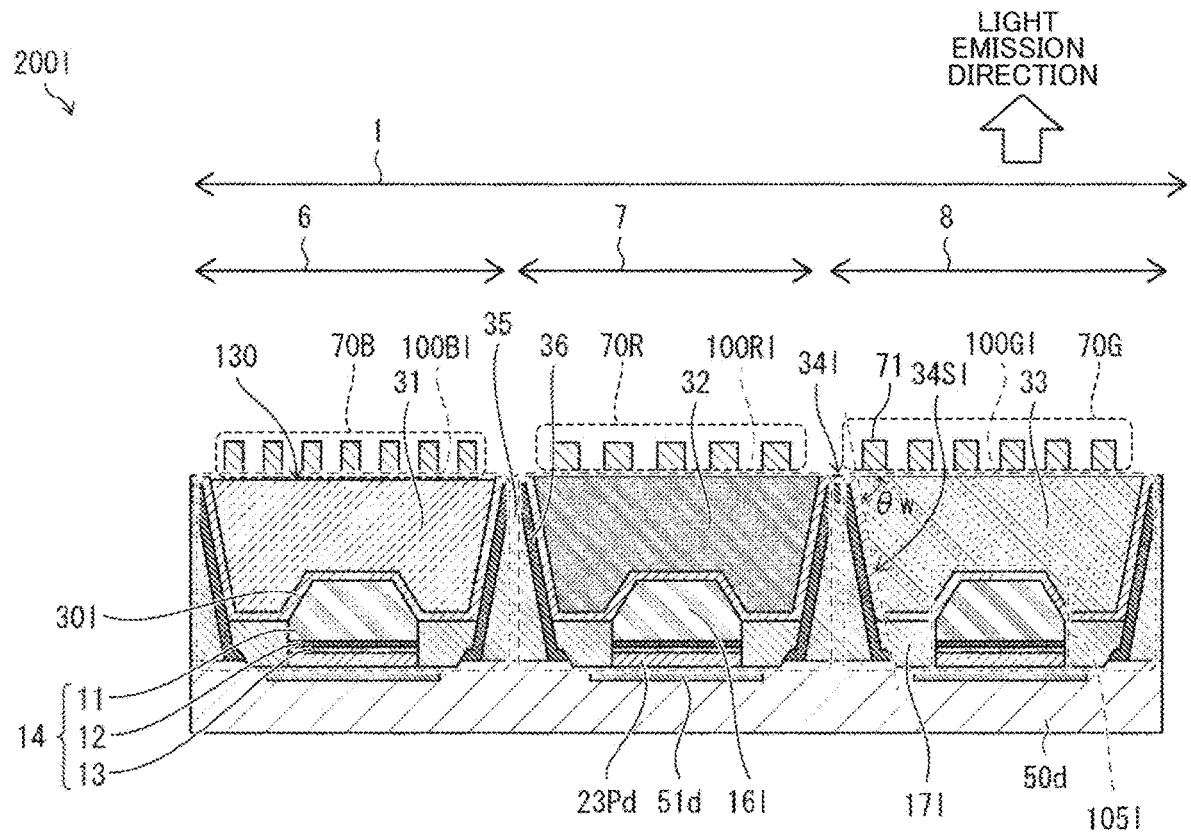
FIG. 20 is a schematic sectional view of an image display element according to Embodiment 13 of the present disclosure.

Another embodiment of the present disclosure will be described below with reference to FIG. 20. An image display element 2001 of Embodiment 13 includes a blue light micro light emitting element 100Bl, a red light micro light emitting element 100Rl, and a green light micro light emitting element 100Gl.

This configuration is a full-color display element similar to that of Embodiment 9. The difference from Embodiment 9 is that an excitation light emitting element 105l and the red wavelength converter 32, the green wavelength converter 33 or the transparent portion 31 are disposed in a partition wall 341 having an inclined side wall, and each wavelength converter or transparent portion is disposed so as to cover the excitation light emitting element 105l. The other points are the same as in Embodiment 9.

In the excitation light emitting element 105l, the upper portion of a body 161 has the shape of a truncated pyramid. By making such a shape that the upper portion of the rectangular parallelepiped is cut off diagonally, the light extraction efficiency to the surrounding transparent portion 31, the red wavelength converter 32, and the green wavelength converter 33 can be improved.

The P electrode 23Pd on the lower surface of the body 161 is coupled to the P drive electrode 51d, the lower side surface of the body 161 is covered with a protective film 171, and the common N electrode 301 is disposed on the upper portion of the body 161. The common N electrode 301 is electrically coupled to the N-side layer 11 of the body 161, and is coupled to the N drive electrode 52d outside the pixel region 1. In the present configuration, the common N electrode 301 is also disposed on the protective film 171 and on the surface of the partition wall 341, and the partition wall 341 is a part of the wiring. In FIG. 20, the P-side layer 13 is disposed on the lower surface side and the N-side layer 11 is disposed on the upper surface side, but the order may be reversed.

The partition wall 341 is disposed at the boundary between the sub-pixels (blue sub-pixel 6, red sub-pixel 7, and green sub-pixel 8), and the bottom of the partition wall 341 is in contact with the drive circuit substrate 50d. The partition wall 341 is composed of the partition wall base material 35 and the partition wall reflective material 36 disposed thereon. In the partition wall reflective material 36, a portion where the body 161 and the P drive electrode 51d are present is removed. Similar to Embodiment 7, a partition wall side surface 34Sl is inclined with respect to the light emitting surface 130 at the inclination angle θw. The partition wall 341 is inclined so that the partition wall side surface 34Sl opens in the light emission direction.

The blue light antenna 70B is disposed on the light emitting surface 130 of the transparent portion 31, the red light antenna 70R is disposed on the light emitting surface 130 of the red wavelength converter 32, and the green light antenna 70G is disposed on the light emitting surface 130 of the green wavelength converter 33. The convex portion 71 could be made of metal, semiconductor or dielectric in this embodiment.

Also in the present embodiment, the same effect as that of Embodiment 1 can be realized.

Embodiment 14

Figure 22:
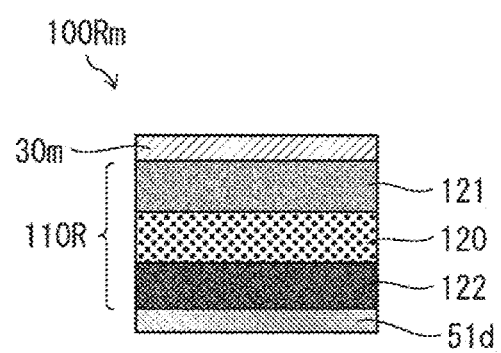
FIG. 22 is a schematic sectional view of a red-light micro light emitting element of the image display element according to Embodiment 14 of the present disclosure.

Another embodiment of the present disclosure will be described below with reference to FIGS. 21 and 22. The image display element 200m of the present configuration is a full-color display element similar to that of Embodiment 7, except that a quantum dot light emitting diode (QLED) is adopted as a micro light emitting element.

In the present configuration, the red light micro light emitting element 100Rm is configured with the P drive electrode 51d, a red light emission layer 110R formed thereon, and a common N electrode 30m further formed thereon. As shown in FIG. 22, in the red light emission layer 110R, an electron transport layer 121 (first conductive layer) and a hole transport layer 122 (second conductive layer) are disposed on both sides of a red light emitting quantum dot layer 120. Electrons and holes are injected into the red light emitting quantum dot layer 120 from the electron transport layer 121 and the hole transport layer 122, respectively, and recombined in the quantum dots to emit light.

In the QLED, the emission wavelength can be controlled by changing the core size of the quantum dots. Therefore, a blue light micro light emitting element 100Bm and a green light micro light emitting element 100Gm can also be configured by QLEDs. In the following, when it is not necessary to distinguish the colors, the red light emission layer 110R, the green light emission layer 110G, and the blue light emission layer 110B may be simply referred to as the light emission layer 110. Details of the configuration of the QLED are not described as the details are not directly related to the present disclosure.

The common N electrode 30m is a transparent conductive film. The surface of the P drive electrode 51d preferably has a high reflectance with respect to visible light. The light emitting surface 130 in the present configuration is the surface of the common N electrode 30m. The red light micro light emitting element 100Rm, the blue light micro light emitting element 100Bm, and the green light micro light emitting element 100Gm are insulated from each other by the first insulating film 19. The first insulating film 19 preferably has a light-shielding property. The first insulating film 19 is, for example, a resin material containing a light-absorbing pigment or dye. Alternatively, the first insulating film 19 is a resin material containing scattering particles such as titanium oxide and the like. The former is light-absorbing and the latter is reflective. More preferably, the first insulating film 19 is reflective.

In the present configuration, the common N electrode 30m constituting each micro light emitting element (blue light micro light emitting element 100Bm, red light micro light emitting element 100Rm, green light micro light emitting element 100Gm) is the light emitting surface 130, and the surface of each micro light emitting element is a light emitting surface 130. A red light antenna 70Rm is disposed on the common N electrode 30m of the red light micro light emitting element 100Rm. Similarly, in the green light micro light emitting element 100Gm, the green light antenna 70Gm is disposed, and in the blue light micro light emitting element 100Bm, the blue light antenna 70Bm is disposed.

The blue light antenna 70Bm, the green light antenna 70Gm, and the red light antenna 70Rm are also equilateral triangle patterns, and the distance between the convex portions is 350 nm for the blue light antenna 70Bm, 400 nm for the green light antenna 70Gm, and 500 nm for the red light antenna 70Rm. By changing the antenna for each emission color, the front emission intensity of each emission color can be increased. For example, when the 500 nm pattern for the red light antenna 70Rm is applied to the blue light antenna 70Bm, the light extraction efficiency of 30 degrees or less can be achieved only by 13%, but can be improved to 32% by setting the distance between the convex portions to 350 nm. That is, it is possible to improve the light extraction efficiency by more than twice.

The diameter of the convex portion 71 is about 100 nm to 250 nm, and the height is 100 nm to 250 nm. The diameter may be changed according to the wavelength of the emission color. The shorter the wavelength, the smaller the diameter may be. Each antenna diameter may be changed in proportion to the center wavelength of the emission spectrum. The pattern may be changed for each emission color. The convex portion 71 could be made of metal, semiconductor or dielectric in this embodiment.

In the present configuration, the shield pattern 72 is provided between the sub-pixels (blue sub-pixel 6, red sub-pixel 7, green sub-pixel 8). The shield pattern 72 is preferably made of the same material as the antenna in a case that the convex portion 71 is made of metal. Since the shield pattern 72 can be formed at the same time as the convex portion 71, the number of manufacturing steps is not increased. The shield pattern 72 may be electrically connected to the common N electrode 30m. This can suppress horizontal energy dissipation by the antenna. Therefore, it is possible to suppress the light emission area of the sub-pixel from expanding and suppress optical crosstalk.

In the present configuration, the common N electrode 30 is held at the ground potential, and the shield pattern 72 is also held at the ground potential, but in the configuration in which the electron transport layer 121 (first conductive layer) and the hole transport layer 122 (second conductive layer) are turned upside down, the electrode on the light emitting surface 130 side is kept at a positive potential (for example, power supply voltage Vcc), and thus the shield pattern 72 is also kept at a positive potential.

In the present configuration, a black matrix 78 covers the shield pattern 72 between the sub-pixels. The shield pattern 72 is necessary to suppress optical crosstalk, but if there is a large metal pattern on the light emitting surface 130, the display image is deteriorated due to reflection of external light. In order to suppress the reflection of external light, it is preferable to dispose a black matrix that absorbs external light.

Also in the present configuration, by disposing the antenna so as to cover the light emitting surface 130, the same effect as that of Embodiment 1 can be realized.

Modification Example

As a modified example of Embodiment 14, the light emission layer 110 (blue light emission layer 110B, red light emission layer 110R, green light emission layer 110G) can be replaced with an organic light emitting diode (OLED) instead of the QLED. Similar to the QLED, the organic LED has a configuration in which a light emission layer is disposed between the electron transport layer 121 (first conductive layer) and the hole transport layer 122 (second conductive layer).

Embodiment 15

Another embodiment of the present disclosure will be described below with reference to FIG. 23. The image display element 200n of the present configuration includes a blue light micro light emitting element 100Bn, a red light micro light emitting element 100Rn, and a green light micro light emitting element 100Gn and uses QLEDs as micro light emitting elements as in Embodiment 14, but differs in that the transparent layer 76 disposed on the QLEDs serves as the light emitting surface 130.

A light emitting material such as QLED generally has a high refractive index and is likely to have low light extraction efficiency. Therefore, by disposing a transparent resin having a relatively high refractive index on the QLED, the light extraction efficiency can be improved by extracting the light into a transparent resin and emitting the light from the transparent resin into the air. The light extraction efficiency from the transparent layer 76 into the air can be improved by forming the side wall of the transparent layer 76 with a light reflecting material and tapering transparent layer 76 so as to open in the light emission direction.

Each sub-pixel is separated by a partition wall 34n, and the partition wall side surface 34S of the partition wall 34n is tapered to open in the light emission direction. The partition wall side surface 34S is made of a highly reflective material. The partition wall side surface 34S is inclined at an inclination angle θw as shown in FIG. 23. The inclination angle θw is preferably 30 to 60 degrees. Since the QLED emits light isotropically, the QLED also emits light in the horizontal direction in FIG. 23. By reflecting the light traveling in the horizontal direction upward, it is possible to suppress light leakage to adjacent pixels and improve the light extraction efficiency.

In the present configuration, the transparent layer 76 is also disposed inside the partition wall 34n, and the partition wall side surface 34S can improve the light extraction efficiency from the transparent layer 76 into the air. By disposing the respective antennas (blue light antenna 70Bn, green light antenna 70Gn, and red light antenna 70Rn) on the surface of the transparent layer 76, it is possible to increase light emission to the front. Each antenna disposed on the transparent portion 31 is preferably changed for each emission color as in Embodiment 14. The convex portion 71 could be made of metal, semiconductor or dielectric in this embodiment. Further, the shield pattern 72 and the black matrix 78 may be disposed between the sub-pixels (blue sub-pixel 6, red sub-pixel 7, and green sub-pixel 8).

The common N electrode 30n may be electrically connected to the partition wall 34n. By making the common N electrode 30n and the partition wall 34n conductive, it is possible to suppress the resistance of the N electrode from increasing even if the common N electrode 30n is made thin. It is preferable that the height of the partition wall 34n is substantially equal to the sum of the thickness of the light emission layer 110 (blue light emission layer 110B, red light emission layer 110R or green light emission layer 110G) and the thickness of the transparent layer 76.

In FIG. 23, the light emission layer 110 is in contact with the partition wall side surface 34S, but the P drive electrode 51d and the partition wall 34n are not short-circuited.

Therefore, for example, the hole transport layer 122 may be disposed only on the P drive electrode 51d.

Also in the present configuration, the same effect as that of Embodiment 1 can be realized by disposing the antenna on the light emitting surface.

Embodiment 16

An image display element 200o, which is another embodiment of the present disclosure, will be described below with reference to FIG. 24, which is a schematic cross-sectional view. The present configuration is a full-color display element similar to that of Embodiment 9. The difference from Embodiment 9 is that only a blue light micro light emitting element 100Bo does not have an antenna. A red light micro light emitting element 100Ro includes a red light antenna 70Ro, and a green light micro light emitting element 100Go includes a green light antenna 70Go.

The configuration of the micro light emitting element of the present embodiment is similar to that of Embodiment 7. That is, in Embodiment 7, by disposing the transparent portion 31 and the green wavelength converter 33 instead of the red wavelength converter 32, the blue light micro light emitting element 100Bo and the green light micro light emitting element 100Go are realized, and the red light micro light emitting element 100Ro has the same structure as that of Embodiment 7.

In the present configuration, the reason why the antenna is not disposed in the blue light micro light emitting element 100Bo is that a high front output may be obtained without an antenna in the blue light micro light emitting element 100Bo having the structure as shown in FIG. 24. That is, when the transparent portion 31 is covered with the light-shielding partition wall 34, the partition wall side surface 34S of the partition wall is formed of a light reflecting material, the partition wall side surface 34S is tapered to open in the light emission direction, the body side surface 16Sf of the excitation light emitting element 105f is covered with a reflective surface and is tapered to open in the light emission direction, an antenna is not necessarily provided.

Table 2 shows the result of simulating the light extraction efficiency of blue light when the red wavelength converter 32 is replaced with the transparent portion 31 in the four structures shown in FIG. 12.

TABLE 2

| STRUCTURE | | 12A | 12B | 12C | 12D |
|---|---|---|---|---|---|
| LIGHT EXTRACTION EFFICIENCY: WITH ANTENNA | ≤20° | 23.5% | 14.8% | 4.1% | 3.4% |
| | ≤30° | 40.9% | 27.3% | 7.4% | 5.8% |
| | ≤40° | 55.4% | 39.1% | 11.0% | 8.2% |
| | ≤90° | 84.7% | 72.4% | 21.0% | 15.3% |
| LIGHT EXTRACTION EFFICIENCY: WITHOUT ANTENNA | ≤20° | 23.3% | 12.5% | 2.8% | 0.9% |
| | ≤30° | 43.3% | 24.6% | 6.0% | 2.3% |
| | ≤40° | 61.0% | 36.2% | 9.7% | 3.7% |
| | ≤90° | 83.6% | 64.4% | 18.4% | 8.7% |

Even in a case that the excitation light is emitted into the air via the transparent portion 31, a structure, in which the side wall of the partition wall that partitions the wavelength converter is tapered to open in the light emission direction and the body side surface 16Sf of the excitation light emitting element 105f is inclined to open in the light emission direction, is highly relevant for improving the light extraction efficiency, as in the case of wavelength conversion.

In the structure such as the structure 12A, the light extraction efficiency is almost the same between the case without the antenna and the case with the antenna. However, in the other structures (structure 12B, structure 12C, and structure 12D), the light extraction efficiency was significantly reduced in the case without the antenna. Further, when the same antenna as the red light antenna 70Ro was applied to the structure 12A, the light extraction efficiency was significantly reduced.

When the excitation light is emitted into the air as it is via the transparent portion 31, mainly due to the inclination of the body side surface 16Sf, the blue light incident on the light emitting surface is distributed strongly in the front direction (not completely random incident), and thus even if an antenna is provided, such a phenomenon is considered to occur because the effect of distributing light to the front is cancelled by the effect of bending the light going to the front. Since the traveling directions of the down-converted light are completely random with respect to the wavelength converters (red wavelength converter 32 and green wavelength converter 33), antennas (red light antenna 70Ro and green light antenna 70Go) are indispensable. The convex portion 71 could be made of metal, semiconductor or dielectric in this embodiment.

Also in the present configuration, the same effect as that of Embodiment 1 can be realized by disposing the antenna on the light emitting surface.

Embodiment 17

Another embodiment of the present disclosure will be described below with reference to FIG. 25. The present embodiment relates to the aspect ratio of the convex portion 71 that constitutes the antenna 70 and is made of Aluminum. The arrangement pattern of the antenna (antenna pattern) may be the same as any antenna pattern described in the present specification (for example, the antenna pattern in Embodiment 1).

In order to examine how the diameter d and the height h of the convex portion 71 influence the front emission intensity, an antenna was formed on the phosphor surface and the front emission intensity was examined. Here, the amount of light emitted at $\theta \leq 20°$ was used as a front emission intensity. The surface of the phosphor is polished flat and the antenna 70 is formed on the surface. The phosphor is irradiated with excitation light and the angular distribution of the emitted light is measured. The refractive index of the phosphor is 1.82, and the wavelength of interest is 550 nm. Further, in order to investigate the contribution to the light amount by the antenna only, as the front emission intensity, only the difference between the amount of light emitted at $\theta \leq 20°$ between the case where an antenna is formed on the phosphor surface and the case without the antenna is used.

Figure 25:
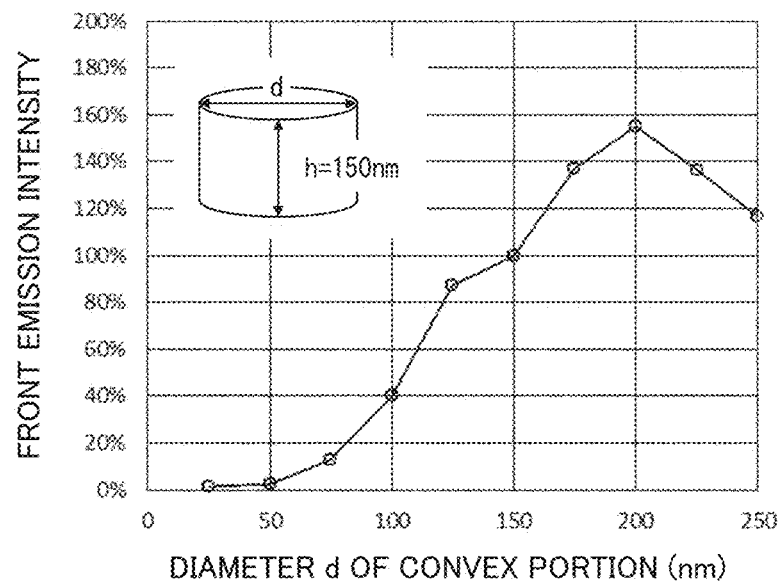
FIG. 25 is a graph showing a relationship between the diameter of a convex portion and a front emission intensity when the height of the convex portion is 150 nm in an equilateral triangle pattern shown in FIG. 2.
Figure 26:
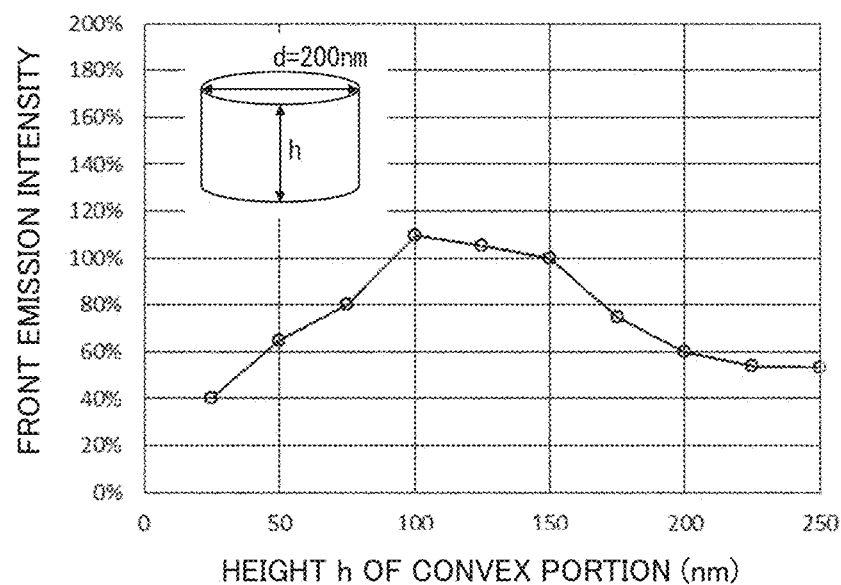
FIG. 26 is a graph showing a relationship between the height of the convex portion and the front emission intensity when the diameter of the convex portion is 200 nm in the equilateral triangle pattern shown in FIG. 2.

FIG. 25 shows the diameter d dependence of the front emission intensity for the equilateral triangle pattern (antenna pattern in Embodiment 1) shown in FIG. 2. The case where the diameter d is 150 nm is shown as 100%. From this result, it is understood that better results are given when the diameter d is larger than 150 nm. Therefore, FIG. 26 shows an experimental result in which the diameter is fixed to 200 nm and the height h is changed. When the diameter d is 200 nm, when the height h is 100 nm, an output about 1.1 times the output when the height is 150 nm is obtained. Therefore, it is considered that it is the most efficient when the diameter d of the convex portion 71 is about 200 nm and the height is about 100 nm.

There is a possibility of further improvement by optimizing the diameter d and the height h. Next, in order to further examine the conditions, the diameter d and the height h of the convex portion 71 were finely changed around d=200 nm and h=100 nm, and the front emission intensity was compared with the case of d=200 nm and h=100 nm. When h=100 nm, an improvement was observed from d=225 nm to d=325 nm compared with the case of d=200 nm. The front emission was lower than the case of d=100 nm, whether the height was higher or lower than 100 nm. Therefore, the height is preferably in the range of 100 nm±25 nm.

The above results show that if the size of the convex portion 71 is too small or too large as compared with the distance between the adjacent convex portions, the diffraction efficiency is low, and the planar dimension of the convex portion is preferably 50% to 80% of the distance between the convex portions 71. On the other hand, the height of the convex portion is preferably 100 nm, and preferably about ¼ of the distance between the adjacent convex portions. From a different point of view, it is shown that the aspect ratio (height/diameter) of the convex portion 71 is preferably 0.5 to 0.3.

Also in the present configuration, the same effect as that of Embodiment 1 can be realized. In particular, by adjusting the size of the convex portion and the aspect ratio to the present configuration, a larger effect can be realized.

Embodiment 18

Figure 27:
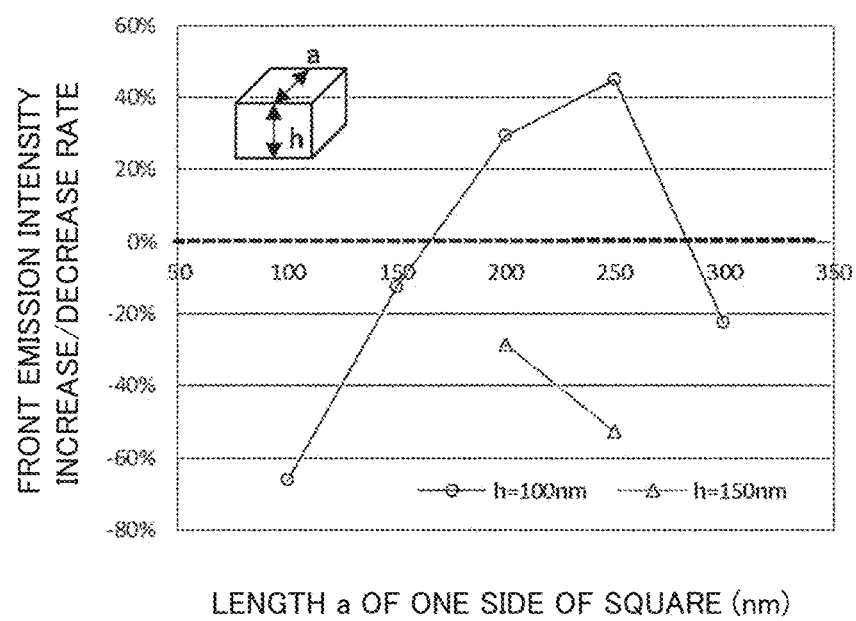
FIG. 27 is a graph showing a front emission intensity increase/decrease rate when the convex portion has a square planar shape with respect to a front emission intensity when the convex portion has a cylindrical shape in an image display element according to Embodiment 18 of the present disclosure.

Another embodiment of the present disclosure will be described below with reference to FIG. 27. The present embodiment relates to the shape of the convex portion 71 that constitutes the antenna 70 and is made of Aluminum. The arrangement pattern of the antennas is the same as the antenna pattern in Embodiment 1.

As a result of studying the shape, it was found that the rectangular parallelepiped shape having a square planar shape had higher front emission intensity than a cylindrical shape. FIG. 27 shows the increase/decrease rate of the front emission intensity (front emission intensity increase/decrease rate) when the convex portion 71 has a rectangular parallelepiped shape with respect to the front emission intensity when the convex portion 71 has a cylindrical shape with a diameter of 200 nm and a height of 100 nm shown in the Embodiment 17. In FIG. 27, the horizontal axis is a side length a of the square. In FIG. 27, the amount of light emitted at θ≤20° is shown by a numerical value obtained by dividing the difference from a reference vale in case of the cylindrical shape (diameter 200 nm, thickness 100 nm) by the reference value. The same applies hereinafter.

When the height of the rectangular parallelepiped is fixed to 100 nm and the length of one side of the plane is changed from 300 nm to 100 nm, the front emission intensity in the rectangular parallelepiped shape exceeds the reference vale at a=200 nm and 250 nm. Therefore, even if the convex portion 71 has a quadrangular planar shape, it is possible to realize the front emission equal to or more than that in the cylindrical shape.

In the above examination, when a=250 nm and h=100 nm, which show the best results, the aspect ratio of the convex portion is 0.4, which is included in the preferable aspect ratio range in the case of the cylindrical shape.

Also in the present configuration, the same effect as that of Embodiment 1 can be realized. In particular, by adjusting the shape of the convex portion and the aspect ratio to the present configuration, a larger effect can be realized.

Embodiment 19

Another embodiment of the present disclosure will be described below with reference to FIG. 28. An image display element 200p of the present embodiment has a structure in which a cap layer 79 is disposed on the low refractive index resin 77 in addition to the structure shown in FIG. 19 (Embodiment 12) in which the antenna (blue light antenna 70Bk, red light antenna 70Rk, and green light antenna 70Gk) is covered with the low refractive index resin 77. The arrangement pattern and shape of the antenna are the same as the arrangement pattern and shape of the antenna in Embodiments 9 and 12, for example. In the present embodiment, the low refractive index resin 77 of Embodiment 12 is replaced with an embedding layer 81. The embedding layer 81 preferably has a small refractive index, but need not be a resin and may be an inorganic film. The convex portion 71 could be made of metal, semiconductor or dielectric in this embodiment.

The red wavelength converter 32 and the green wavelength converter 33 may deteriorate due to the penetration of water and oxygen in the air. For example, a quantum dot material containing no cadmium (Cd) is easily deteriorated in the air. In such a case, deterioration can be suppressed by a method of housing the image display element 200p in a sealed package and filling the inside of the package with an inert gas. However, by housing the display element in such a package, the size of the display element becomes large and becomes unsuitable for use in small devices such as augmented reality (AR) glasses. Also, the manufacturing cost increases. In order to avoid such a problem, the image display element itself needs to have a barrier property against oxygen and moisture. A silicon nitride film (SiN) is known as such a thin film material having a barrier property, and a plasma SiN film deposited by a plasma chemical vapor deposition (CVD) method is often used.

Figure 29:
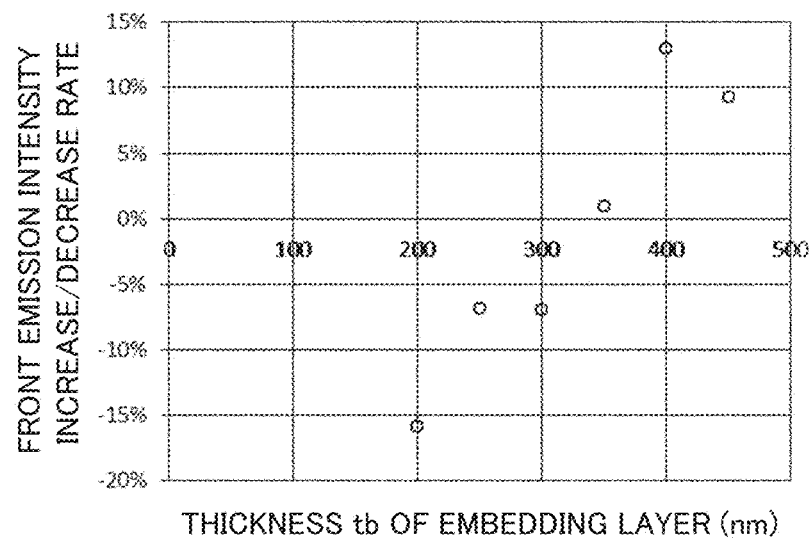
FIG. 29 is a graph showing a relationship between an embedding layer thickness and a front emission intensity increase/decrease rate for an antenna having a cylindrical convex portion with a diameter of 200 nm and a height of 100 nm shown in Embodiment 17 of the present disclosure.

In the image display element 200p, as shown in FIG. 28, a cap layer 79 is disposed on the light emitting surface side of the embedding layer 81 in order to protect the wavelength converter. The cap layer 79 is, for example, a plasma SiN film or the like. However, such a structure may inhibit the function of the antenna even if the deterioration of the wavelength changing portion can be suppressed. FIG. 29 shows the front emission intensity increase/decrease rate when a thickness tb of the embedding layer 81 is changed in the antenna having the cylindrical convex portion 71 with a diameter of 200 nm and a height of 100 nm shown in the Embodiment 17. A plasma SiN film was used as the cap layer 79. The refractive index is 2.0 and a thickness tc=150 nm. Embodiment 16 is a reference in which the embedding layer 81 and the cap layer 79 are not provided.

When tb≥350 nm, it is shown that the front emission intensity can be improved as compared with the case where the embedding layer 81 is not provided. That is, in the region where the thickness of the embedding layer 81 is 350 nm or more, it is possible to protect the wavelength converter and physically protect the antenna while further strengthening the front emission enhancement of the antenna 70. Since the height of the convex portion is 100 nm, the thickness of the embedding layer 81 is preferably 3.5 times or more the height of the convex portion 71.

Figure 31:
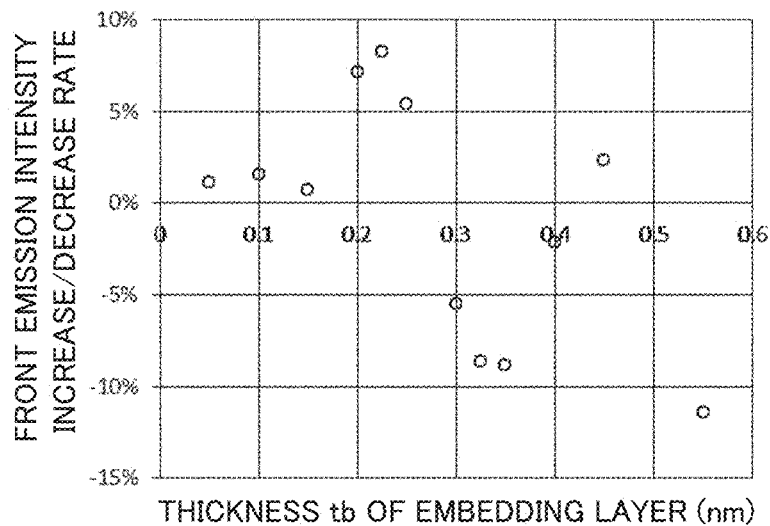
FIG. 31 is a graph showing a relationship between the embedding layer thickness and the front emission intensity increase/decrease rate in the case without cap layer in the configuration shown in FIG. 28.

There can be another way of looking at the film thickness of the embedding layer 81. That is, the most preferable thickness of the embedding layer 81 is 400 nm to 450 nm, and is in a range including the wavelength of light of 440 nm in the embedding layer 81. FIG. 31 shows a relationship between the embedding layer 81 and the front emission intensity increase/decrease rate when the cap layer 79 is not provided. When the cap layer 79 is not provided, the front emission intensity can be increased when the embedding layer thickness is 200 nm to 250 nm and when the embedding layer thickness is 400 nm to 450 nm. These film thicknesses are values that are close to 1 and 2 times a half of the wavelength of light in the embedding layer 81, respectively. That is, this is a condition under which the light reflected on the light emitting surface of the embedding layer 81, when the light is re-reflected at the interface with the wavelength converter and re-incident on the light emitting surface, strengthen with the transmitted light on the light emitting surface.

When the cap layer 79 is not provided, the front emission intensity is higher when the embedding layer thickness is 200 nm to 250 nm. However, when the cap layer 79 was combined with the embedding layer 81 having a thickness of 200 nm to 250 nm, the front emission was reduced. Therefore, when the cap layer 79 is provided, the thickness of the embedding layer 81 is preferably close to the wavelength of light in the embedding layer 81, and the thickness range thereof is preferably about ±25 nm.

Figure 30:
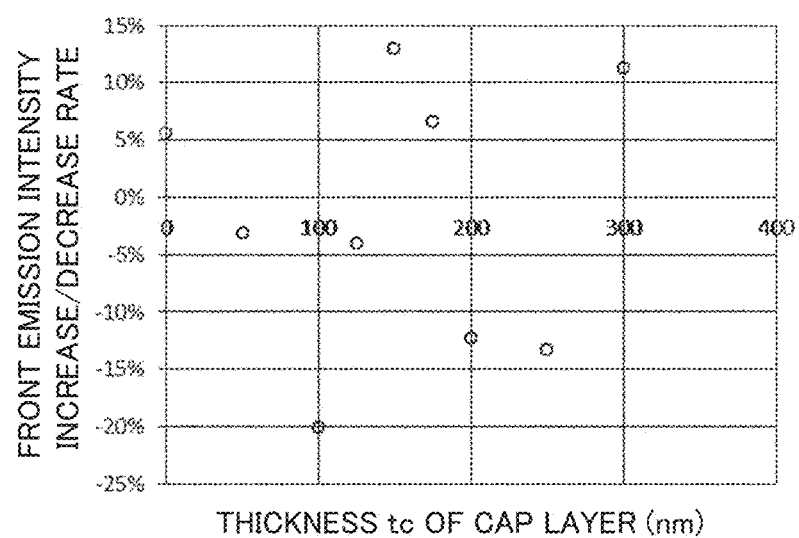
FIG. 30 is a graph showing a relationship between a cap layer thickness and a front emission intensity increase/decrease rate in an image display element according to Embodiment 19 of the present disclosure.

Next, FIG. 30 shows the front emission intensity increase/decrease rate when a thickness tc of the cap layer is changed. The embedding layer 81 has a thickness of 400 nm. The reference in this case is also Embodiment 16 in which the embedding layer 81 and the cap layer 79 are not provided. The results of tc=150 nm and tc=300 nm show almost the same results, and the other film thicknesses show lower front emission intensity increase/decrease rates than the results. The values of tc=150 nm and tc=300 nm are almost 0.5 and 1.0 times of the wavelength of the light in the cap layer 89, respectively. That is, it shows that the thickness of the cap layer 79 is preferably an integral multiple of a half of the wavelength of light in the cap layer 89 in order that the arrangement of the cap layer 79 does not deteriorate the function of the antenna 70. This is a condition under which the light reflected on the light emitting surface of the cap layer 89, when the light is re-reflected at the interface with the embedding layer 81 and re-incident on the light emitting surface, strengthen with the transmitted light on the light emitting surface. Therefore, for red light, preferred thickness of the cap layer 79 having a refractive index of 2.0 is an integral multiple of 157.5 nm. For green light, the thickness of the cap layer 79 having a refractive index of 2.0 is preferably an integral multiple of 131.25 nm. For blue light, the thickness of the cap layer 79 having a refractive index of 2.0 is preferably an integral multiple of 115.0 nm.

However, in the case of a full-color display element, it may be difficult to change the film thickness of the cap layer 79 for each sub-pixel. In such a case, for the center wavelength of light emitted from each sub-pixel, it is also possible to calculate a half of the wavelength in the cap layer 79 and set the film thickness of the cap layer 79 to a film thickness close to the least common multiple thereof. Alternatively, when the light emission efficiency of a certain sub-pixel is low, the cap layer film thickness may be set according to the wavelength of the sub-pixel.

In the present embodiment, a columnar convex portion with a diameter of 200 nm and a height of 100 nm is used, because when the embedding layer 81 is present, the smaller the diameter of the convex portion 71 is, the stronger the front emission can be. In the case of the present embodiment, the strongest front emission is in the case of the diameter of 200 nm to 225 nm, which is smaller than the diameter shown in Embodiment 16.

Also in the present configuration, the same effect as that of Embodiment 1 can be realized. Especially by properly disposing the low dielectric constant film and the cap layer, while improving the front emission enhancement function, it is possible to improve the long-term reliability by blocking the wavelength converter from the outside air and suppressing deterioration of the wavelength converter.

Embodiment 20

Another embodiment of the present disclosure will be described below with reference to FIGS. 32 to 34. An image display element 200q of the present embodiment has a configuration in which a thin film that covers the antenna 70 is used as the protective film of the antenna (blue light antenna 70Bk, red light antenna 70Rk, green light antenna 70Gk), instead of the structure (Embodiment 12) in which the antenna is embedded with the embedding layer 81. The arrangement pattern and shape of the antenna are the same as those in the other embodiments.

Figure 32:
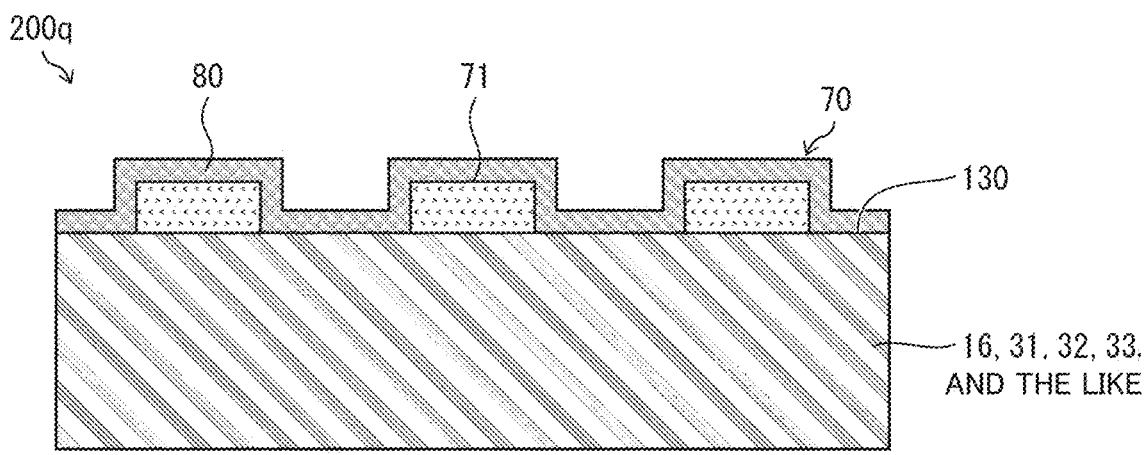
FIG. 32 is a schematic sectional view of an image display element according to Embodiment 20 of the present disclosure.

As shown in FIG. 32, in the image display element 200q of the present configuration, a thin convex portion protective film 80 is provided to cover the antennas including the convex portions 71 disposed on the light emitting surface 130 of the wavelength converter (red wavelength converter 32 and green wavelength converter 33), the transparent portion 31, the body 16 of the micro light emitting element 100, and the like. Such a convex portion protective film 80 can be formed by depositing the convex portion protective film 80 by a thin film forming method such as a CVD method, an atomic layer deposition (ALD) method, or a sputtering method after forming the convex portion 71. As the convex portion protective film 80, a low refractive index insulating film such as a $SiO_2$ film or a SiOC film is preferable. Therefore, the convex portion protective film 80 may cover only the convex portion 71, but it is preferable that the convex portion protective film 80 also covers the light emitting surface 130. The manufacturing process can be simplified. The convex portion 71 could be made of metal, semiconductor or dielectric in this embodiment.

Figure 33:
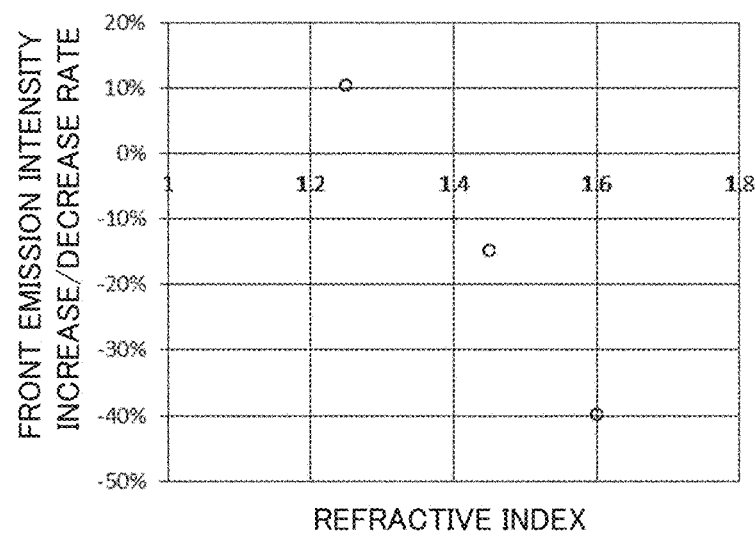
FIG. 33 is a graph showing a relationship between a refractive index of a convex protective film and the front emission intensity increase/decrease rate in the configuration shown in FIG. 32.

FIG. 33 shows the front emission intensity increase/decrease rate when the refractive index of the convex portion protective film 80 is changed. The thickness of the convex portion protective film is set to 50 nm. The convex portion 71 has a cylindrical shape with a diameter of 200 nm and a height of 100 nm, and the other conditions are the same as those in Embodiment 16. When the refractive index is 1.3 or less, the front emission intensity is equal to or higher than that in the case without the convex portion protective film 80. Therefore, the material of the convex portion protective film 80 is preferably a material having a refractive index of 1.3 or less.

Figure 34:
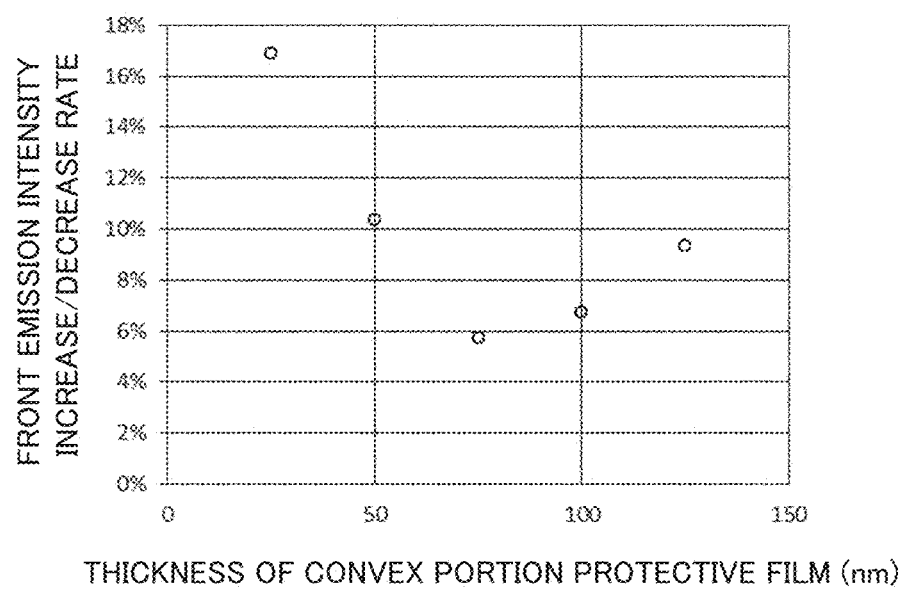
FIG. 34 is a graph showing a relationship between a convex portion protective film thickness and the front emission intensity increase/decrease rate in the configuration shown in FIG. 32.

FIG. 34 shows the front emission intensity increase/decrease rate when the thickness of the convex portion protective film 80 is changed. The refractive index of the convex portion protective film 80 is 1.25. The thinner the convex portion protective film 80 is, the more preferable it is, but there is not much difference in the thickness of 75 nm to 125 nm. That is, the convex portion protective film 80 may have a thickness that does not completely fill the space between the convex portions 71.

Also in the present configuration, the same effect as that of Embodiment 1 can be realized. The antenna and the light emitting surface can be protected while improving the front emission enhancement function.

Embodiment 21

Figure 35:
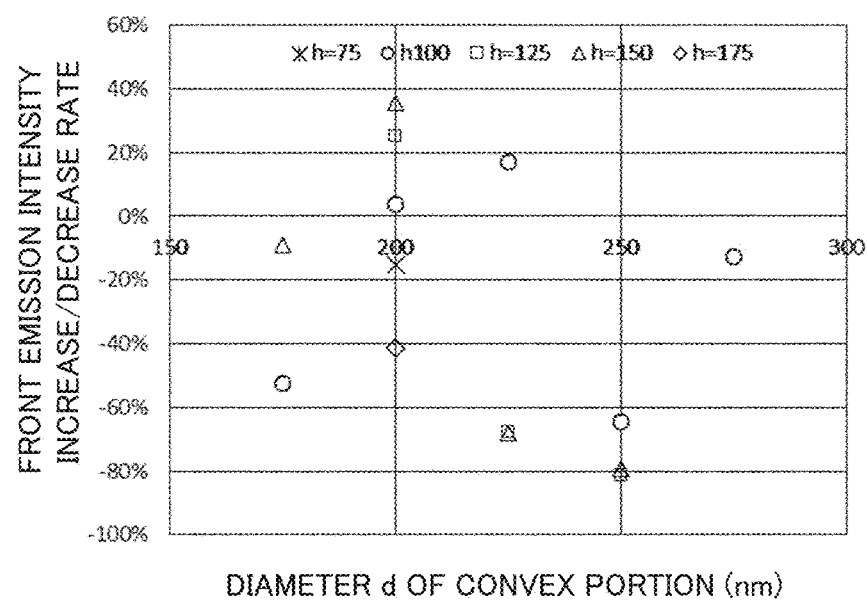
FIG. 35 is a graph showing a relationship between the diameter of a convex portion and a front emission intensity increase/decrease rate in an image display element according to Embodiment 21 of the present disclosure.

Another embodiment of the present disclosure will be described below with reference to FIG. 35. In the present embodiment, a semiconductor such as silicon is used as the material of the convex portion 71 that constitutes the antenna 70, instead of metal (particularly aluminum).

A silicon antenna can be formed in the same manner as aluminum. A silicon thin film of about 75 nm to 200 nm is formed on the light emitting surface 130 by a film forming technique such as a plasma CVD method, and the resist pattern is processed by a lithography method such as a nanoimprint method to form dot patterns arranged in an array. Thereafter, a silicon antenna can be formed by etching the silicon film by a dry etching technique.

As in the case of aluminum, the arrangement of the antennas made of silicon was such that the convex portions were arranged at the vertices of an equilateral triangle having one side of 400 nm, and the diameter of the convex portions was the range of 175 nm to 275 nm on average. FIG. 35 shows the relative front emission intensity with reference to the case of an aluminum antenna with a diameter of 200 nm and a thickness of 100 nm. The horizontal axis represents the diameter, and the data of different thicknesses are displayed in an overlapping manner.

When the thickness was 100 nm, in the diameter range of 200 nm to 225 nm, the result exceeding that of the aluminum antenna was obtained. Further, when the diameter was 200 nm, even better results were shown when the thickness was 125 nm to 150 nm. As described above, it was found that further improvement can be realized by optimizing the shape of the convex portion made of silicon.

Also in the present configuration, the same effect as that of Embodiment 1 can be realized. In particular, by using a semiconductor having a large refractive index such as silicon as a material for the convex portion, the front emission enhancement function can be improved.

Embodiment 22

Another embodiment of the present disclosure will be described below. In the present embodiment, the configuration of the image display element 200s is the same as that of Embodiment 7, but as a material of the convex portion 71 that constitutes the antenna 70, a dielectric such as resin, silicon nitride, or titanium oxide is applied instead of metal (particularly aluminum) or semiconductor (for example, silicon). Such a dielectric has a very low absorption with respect to the emitted light and is transparent. The refractive index of the dielectric at the wavelength of the emitted light is preferably higher than that of the wavelength converter. For example, in a case that the refractive index of the wavelength converter is about 1.5, the refractive index of the dielectric is preferably 1.6 or more, and more preferably 2 or more.

Further, the present embodiment is different from Embodiment 7 in that the red wavelength converter 32 is thicker than that of Embodiment 7, and the aspect ratio, which is the ratio obtained by dividing the thickness of the red wavelength converter 32 by the length of the light emitting surface 130 of the red wavelength converter 32 (typical length of the light emitting surface, such as the length of the short side for a quadrangle, the diameter for a circle, and the like) and, is larger than 1. Increasing the concentration of the wavelength conversion material such as the quantum dots contained in the wavelength converter lowers the wavelength conversion efficiency, and thus the concentration may need to be kept low. In such a case, in order to increase the absorption amount of the excitation light, it is indispensable to make the wavelength converter thick, and the aspect ratio of the wavelength converter becomes at least larger than 0.75. The present configuration is suitable for such a case, and it is more preferable that the aspect ratio of the wavelength converter is 1 or more.

A dielectric antenna can be formed in the same manner as aluminum. The case of silicon nitride will be described below. A silicon nitride film of about 300 nm is formed on the light emitting surface 130 by a film forming technique such as a plasma CVD method, and a resist pattern is formed by an exposure device (stepper or scanner) using KrF laser or i-line rays as a light source to form dot patterns arranged in an array. Thereafter, an antenna pattern made of silicon nitride can be formed by etching the silicon nitride film by a dry etching technique.

When a dielectric antenna has a convex portions 71 mode of resin, dot patterns of resin can be made by applying a nanoimprint technique to a resin layer coated on the light emission layer 130. If the resin layer has photo-sensitivity, dot patterns of the photo-sensitive resin can be made by a photolithography technique. It is preferable that the resin has higher refractive index than that of the wavelength conversion layer at the emission wavelength. The high refractive index resin may contain nano-particles to increase refractive index. The nano-particle may be inorganic material with high refractive index. For example, the nano-particle is made of titanium dioxide (TiO2) and its average diameter is several hundred nm or less.

Figure 36:
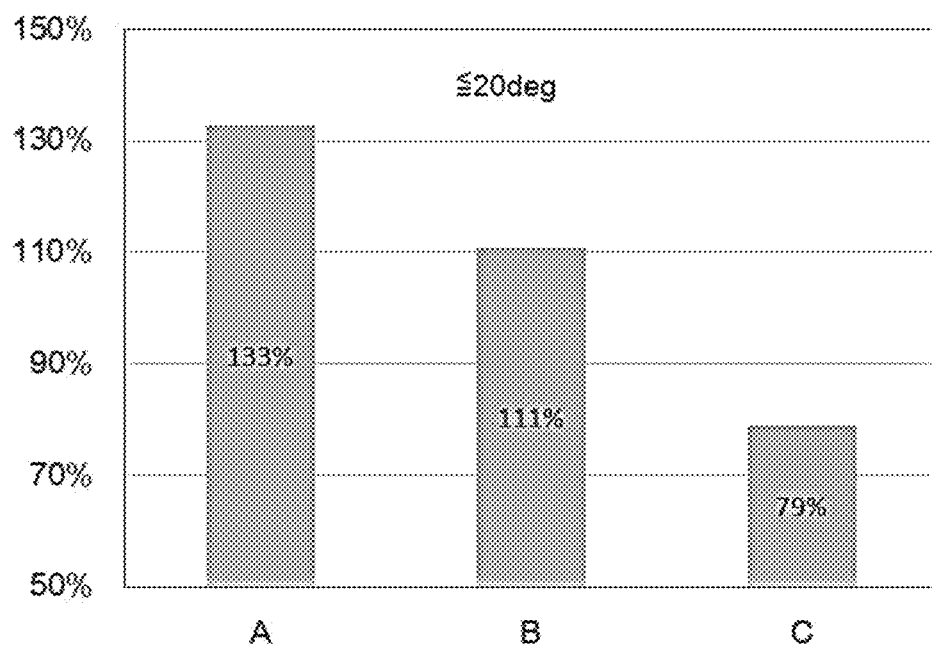
FIG. 36 is a view showing a comparison of intensities of light emitted at a light emission angle of 20 degree or less between various antennas in an image display element according to Embodiment 22 of the present disclosure.
Figure 37:
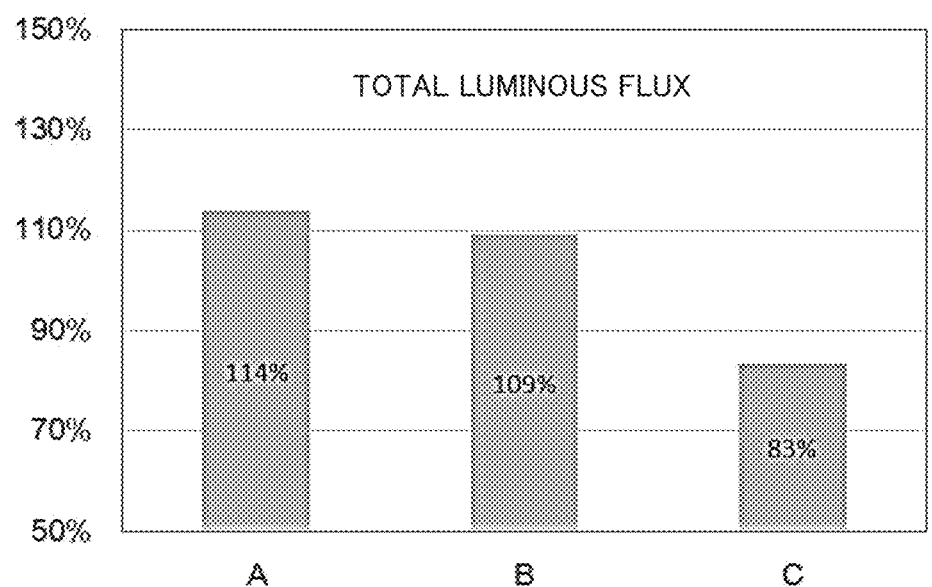
FIG. 37 is a view showing a comparison of intensities of total luminous fluxes between various antennas in an image display element according to Embodiment 22 of the present disclosure.

As the silicon nitride antenna 70, in the case of (A), the convex portions 71 made of silicon nitride are arranged at the vertices of an equilateral triangle having one side of 800 nm. The convex portion 71 is a cylinder having an average diameter of 300 nm and an average height of 300 nm. In the case of (B), the convex portions 71 made of silicon nitride are arranged at the vertices of an equilateral triangle having one side of 460 nm, and the average diameter of the convex portions 71 is 200 nm and the height thereof is 100 nm. Further, as in the case of (C), an antenna having an aluminum convex portion having the same arrangement and shape as in (B) was also compared. The total luminous flux in the red wavelength band and the light emission intensity at an emission angle of 20 degrees or less were evaluated. Comparative graphs with reference to the case without the antenna pattern are shown in FIGS. 36 and 37, respectively. The thickness of the red wavelength converter 32 used for the evaluation is 3 μm, the planar shape is a square having one side of 2.5 μm, and an aspect ratio of 1.2.

With the antenna 70 made of aluminum (in the case of (C)), in the present configuration, both the total luminous flux and the light emission intensity at an emission angle of 20 degrees or less are reduced as compared with the case without the antenna. On the other hand, with the dielectric antenna having the same size and arrangement pattern (in the case of (B)), the light emission intensity increased by about 10% as compared with the case without the antenna. Further, in the configuration in which the arrangement pitch of the antenna is increased and the antenna diameter is also increased (in the case of (A)), the light emission intensity at the emission angle of 20 degrees or less can be further increased.

The trends shown here can be described as follows. As in the present configuration, when the aspect ratio of the red wavelength converter 32 is large and the partition wall side surface 34S surrounding the red wavelength converter 32 is inclined, the average incident angle of light incident on the light emitting surface 130 becomes smaller. The reason is as follows. Since the aspect ratio of the red wavelength converter 32 is increased, the contribution of light coming from a deep portion of the red wavelength converter 32 is increased. The incident angle of light that is directly incident on the light emitting surface 130 from the deep portion of the red wavelength converter 32 is small. On the other hand, the light reflected by the partition wall side surface 34S and incident on the light emitting surface 130 is reflected such that the incident angle on the light emitting surface 130 becomes smaller due to the inclination of the partition wall side surface 34S. Therefore, the incident angle of the light incident on the light emitting surface 130 from the deep portion of the red wavelength converter 32 becomes smaller, and the contribution of the light from such deep portion increases as the aspect ratio of the red wavelength converter 32 increases.

On the other hand, in the antenna 70 having a comparatively small pitch of 460 nm as compared with the wavelength of 630 nm as in (C), light having an incident angle larger than a critical angle, which is totally reflected without the antenna 70, is diffracted to the front to enhance front emission and increase total luminous flux intensity. Therefore, it is considered that the positive effect due to the antenna is reduced by reducing the average incident angle. On the other hand, not only aluminum, but a metal antenna reflects incident light, the transmittance of light emitted to the outside is reduced by the metal antenna. It is considered that, as a result of the diffraction effect of the antenna 70 being weakened, the transmittance of the antenna 70 is decreased, and thus the amount of light emission is reduced in the case of (C) as compared with the case without the antenna 70.

On the other hand, in the case of (B), since the loss of light due to reflection is small, it is considered that a positive effect was exhibited as a whole. Further, in (A), by setting the pitch of the antenna 70 to 800 nm, which is larger than the wavelength of 630 nm, light having a smaller incident angle can be diffracted to the front as compared with the case of 460 nm pitch. As a result, the light emission intensity at an emission angle of 20 degrees or less can be increased (+22%) more than the increase (+5%) of the total luminous flux.

The wavelength of the emitted light inside the red wavelength converter 32 is about 400 nm, the pitch 460 nm is 1.15 times 400 nm, and the pitch 800 nm is 2.0 times, and thus the pitch of the dielectric antenna 70 is preferably at least 1.5 times, more preferably 2 times the wavelength of the emitted light inside the red wavelength converter 32.

Figure 38:
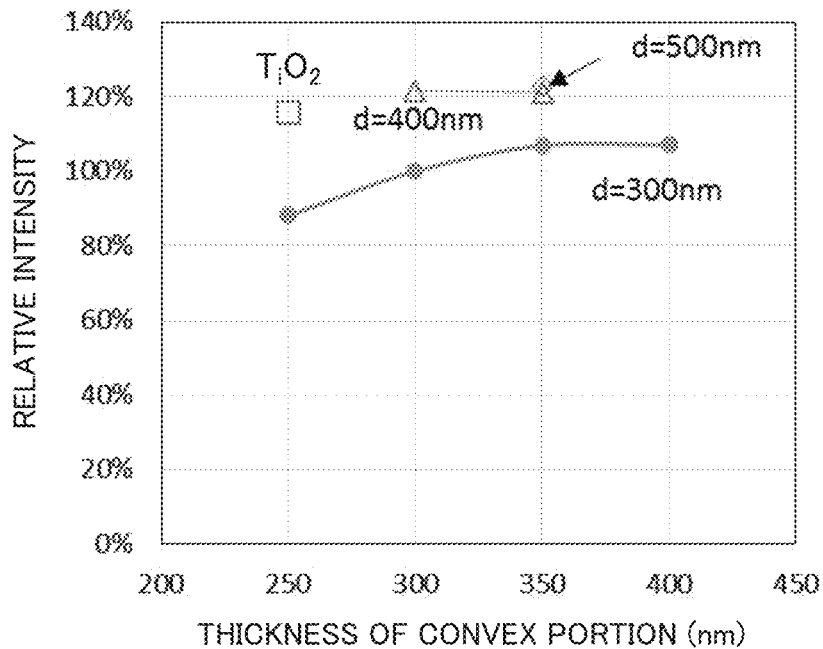
FIG. 38 is a graph showing a relationship between the height of a convex portion and a relative front emission intensity in an image display element according to Embodiment 22 of the present disclosure.

In order to see the influence of the diameter and height of the convex portion 71 of the dielectric antenna 70 and the material, comparison was made between the case where the diameter is 300 nm and the height is changed to 250 nm, 300 nm, 350 nm, and 400 nm without changing the arrangement pattern of the pitch of 800 nm, the case where the height is 300 nm and the diameter is 400 nm, and the case where titanium oxide ($TiO_2$) is used as the convex material. The titanium oxide convex portion has a diameter of 300 nm and a height of 250 nm. FIG. 38 shows a comparison of light emission intensities at an emission angle of 20 degrees or less. A comparison was made with a diameter of 300 nm and a height of 300 nm as references. As for the height, the higher the height, the greater the effect and the tendency to saturate at 350 nm or more. With the titanium oxide convex portion, even if the height is low, the effect more than that of the silicon nitride convex portion can be obtained, and thus it is considered that the higher the refractive index, the better. As for the diameter, 400 nm is more effective, and at 500 nm, the effect is slightly increased. Therefore, in the case of the cylindrical convex portion, the diameter is preferably half the pitch or more. The wavelength of the emitted light is about 315 nm in silicon nitride and about 263 nm in titanium oxide. Therefore, the height of the convex portion is about the same as or larger than the wavelength of the emitted light in the convex portion of the dielectric is preferred.

As described above, when the aspect of the wavelength converter is large, or when the side wall of the partition wall of the wavelength converter is inclined, the dielectric antenna has a larger effect of improving the light emission efficiency. This is the case where the proportion of light having an incident angle larger than the critical angle for total internal reflection at the light emitting surface 130 to the light incident on the light emitting surface 130 is small. Further, the front emission can be further increased by increasing the pitch of the antenna by 1.5 times or more the wavelength of the emitted light in the wavelength converter.

As well as above described case, the dielectric antenna is also effective in cases such that the antenna is relatively far from a light emission point. There are cases that an intermediate layer should be disposed on the wavelength converter surfaces and the antenna is disposed on the intermediate layer. For examples, the intermediate layer may be the insulating film 73 in FIG. 7 (Embodiment 5), the color filter layer 75 in FIG. 17 (Embodiment 10) to reduce the excitation light emission, the dielectric multilayers 74 in FIG. 14 (Embodiment 8) to reflect the excitation light, or the transparent layer 76 (Embodiment 11) to flatten the wavelength converter surfaces. When thickness of the intermediate layer is comparable with the thickness of the wavelength converter, distance between the antenna and light emission points in the wavelength converter increases and average incident angle of the light on the antenna becomes small. For example, in a case that the thickness of the intermediate layer is a half of the thickness of the wavelength converter or more, the average distance between the antenna and light emission points in the wavelength converter is equal to or more than twice of a case without the intermediate layer.

Also in the present configuration, the same effect as that of Embodiment 1 can be realized. Especially the present configuration is effective for wavelength converters with high aspect ratio and wavelength converters with the intermediate layer.

Embodiment 23

Figure 39:
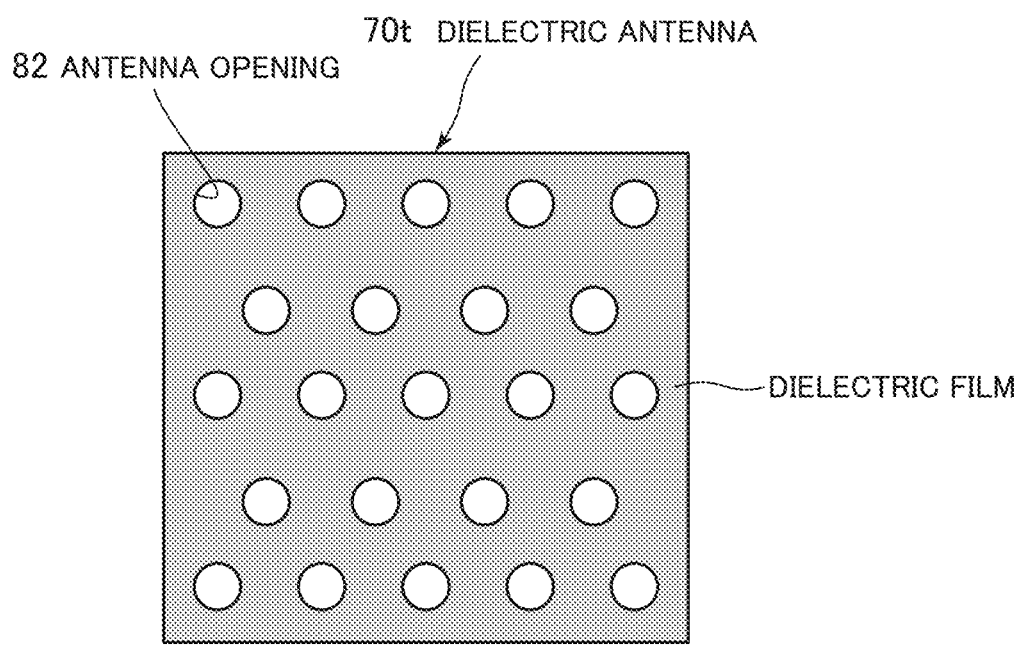
FIG. 39 is a schematic plan view of a dielectric antenna in an image display element according to Embodiment 23 of the present disclosure.

Another embodiment of the present disclosure will be described below. In the present embodiment, the configuration of an image display element 200t is similar to that of Embodiment 7, except that an antenna 70t has a configuration in which an antenna openings 82 are disposed in the dielectric film. That is, in the configuration examples up to now, the convex portion 71 is disposed on the light emitting surface 130, but in the present configuration, a dielectric film is formed on the light emitting surface 130, and holes are formed in the dielectric film in the same pattern as the convex portion 71. FIG. 39 shows a schematic view of the dielectric antenna 70t when seen in a plan view. From a different point of view, in the present configuration, the convex portion 71 can be considered as air.

A silicon nitride film is used as the dielectric film, and a silicon nitride film of about 300 nm is formed on the light emitting surface 130 by a film forming technique such as a plasma CVD method, and a resist film having holes is formed by an exposure apparatus (stepper or scanner) that uses i-line as a light source. Thereafter, the silicon nitride film is etched by a dry etching technique to form the dielectric antenna 70t having the antenna openings 82 arranged in an array in the silicon nitride film. The same arrangement pattern as before was used in which the diameter of the antenna openings 82 was 300 nm, the distance (pitch) between the antenna openings 82 was 800 nm, and the antennas were disposed at the vertices of an equilateral triangle. Also with the present configuration, the same effect as that of Embodiment 22 can be obtained.

SUMMARY

According to Aspect 1 of the disclosure, there is provided an image display element including a drive circuit substrate that includes a drive circuit for supplying a current to micro light emitting elements to cause light to be emitted, the micro light emitting elements arranged in an array on the drive circuit substrate, and an antenna arranged on a light emitting surface of each of the micro light emitting elements, in which the antenna includes isolated metal convex portions in a periodic pattern.

In the image display element according to Aspect 2 of the present disclosure, in the above Aspect 1, the antenna may include a shield pattern on an outer peripheral portion of the micro light emitting element.

In the image display element according to Aspect 3 of the present disclosure, in the above Aspect 1, the antenna may be electrically fixed to a constant potential on an outer peripheral portion of the micro light emitting element.

In the image display element according to Aspect 4 of the present disclosure, in the above Aspect 1, an X-direction period of the periodic pattern may be 1/N (N: natural number) of an X-direction period of an arrangement of the micro light emitting elements, and a Y-direction period of the periodic pattern may be 1/M (M: natural number) of a Y-direction period of the arrangement of the micro light emitting elements.

In the image display element according to Aspect 5 of the present disclosure, in the above Aspect 1, an arrangement pattern of the convex portions included in the antenna on the light emitting surface may be different from that on spaces between adjacent light emitting surfaces.

In the image display element according to Aspect 6 of the present disclosure, in the above Aspect 1, the antenna may be covered with a low refractive index resin.

The image display element according to Aspect 7 of the present disclosure, in the above Aspect 1, the light emitting surface is a surface of a body (16) made of a compound semiconductor that constitutes the micro light emitting element.

In the image display element according to Aspect 8 of the present disclosure, in the above Aspect 1, the light emitting surface may be a surface of one electrode (common N electrode 30m) forming the micro light emitting element.

In the image display element according to Aspect 9 of the present disclosure, in the above Aspect 1, the light emitting surface may be a surface of an insulating film (73) that covers one electrode forming the micro light emitting element.

In the image display element according to Aspect 10 of the present disclosure, in the above Aspect 1, the micro light emitting elements may include a first micro light emitting element that emits light of a first light emitting wavelength, and a second micro light emitting element that emits light of a second light emitting wavelength longer than the first light emitting wavelength, in which a period of a periodic pattern included in an antenna formed on a light emitting surface of the first micro light emitting element may be shorter than a period of a periodic pattern included in an antenna formed on a light emitting surface of the second micro light emitting element.

In the image display element according to Aspect 11 of the present disclosure, in the above Aspect 1, the micro light emitting element may include an excitation light emitting element that emits excitation light and a wavelength converter that down-converts the excitation light.

In the image display element according to Aspect 12 of the present disclosure, in the above Aspect 11, the light emitting surface may be a surface of the wavelength converter.

In the image display element according to Aspect 13 of the present disclosure, in the above 11, the light emitting surface may be a surface of a dielectric multilayer film disposed on the wavelength converter.

In the image display element according to Aspect 14 of the present disclosure, in the above Aspect 11, the light emitting surface may be a surface of a color filter disposed on the wavelength converter.

In the image display element according to Aspect 15 of the present disclosure, in the above Aspect 11, the light emitting surface may be a surface of a transparent layer (76) disposed on the wavelength converter.

In the image display element according to Aspect 16 of the present disclosure, in the above Aspect 11, a periphery of the wavelength converter may be covered with a partition wall having a light-shielding property.

The image display element according to Aspect 17 of the present disclosure, in the above Aspect 16, a side surface of the partition wall may be made of a light reflecting material (partition wall reflective material 36), and the side surface of the partition wall may be tapered to open in a light emission direction.

In the image display element according to Aspect 18 of the present disclosure, in the above Aspect 11 to 17, the excitation light emitting element may include a body including a light emission layer for generating the excitation light, a first conductive layer for injecting electrons into the light emission layer, and a second conductive layer for injecting holes into the light emission layer, a first electrode coupled to the first conductive layer, and a second electrode coupled to the second conductive layer, and a side wall of the body may be tapered to open in a light emission direction.

In the image display element according to Aspect 19 of the present disclosure, in the above Aspect 1, the micro light emitting element may include an excitation light emitting element that emits light and a transparent portion (31) that transmits the light, a surface of the transparent portion may be the light emitting surface, a periphery of the transparent portion may be surrounded by a light-shielding partition wall, a side surface of the partition wall may be made of a light reflecting material (partition wall reflective material 36), and the side surface of the partition wall may be tapered to open in a light emission direction.

In the image display element according to Aspect 20 of the present disclosure, in the above Aspect 10, the first micro light emitting element may include an excitation light emitting element that emits excitation light of the first emission wavelength and a transparent portion (31) that transmits the excitation light, a surface of the transparent portion may be a light emitting surface of the first micro light emitting element, and the second micro light emitting element may include an excitation light emitting element that emits excitation light of the first emission wavelength and a wavelength converter that down-converts the excitation light.

An image display element according to Aspect 21 of the present disclosure, in the above Aspect 1, may include a first micro light emitting element that emits light at a first light emitting wavelength, and a second micro light emitting element that emits light at a second light emitting wavelength that is a wavelength longer than the first light emitting wavelength, in which the first micro light emitting element may include an excitation light emitting element that emits excitation light of the first emission wavelength and a transparent portion (31) that transmits the excitation light, a surface of the transparent portion may be a light emitting surface, no antenna may be disposed on a light emitting surface of the first micro light emitting element, the second micro light emitting element may include an excitation light emitting element that emits excitation light of the first emission wavelength and a wavelength converter that down-converts the excitation light, and the antenna may be disposed on a light emitting surface of the second micro light emitting element.

In the image display element according to Aspect 22 of the present disclosure, in the above Aspect 1, a horizontal dimension of the convex portion may be 50% to 80% of a distance between the adjacent convex portions.

In the image display element according to Aspect 23 of the present disclosure, in the above Aspect 1, a height of the convex portion may be in a range of ¼ to ±25 nm of the distance between the adjacent convex portions.

In the image display element according to Aspect 24 of the present disclosure, in the above Aspect 1, an aspect ratio obtained by dividing the height of the convex portion by the horizontal dimension of the convex portion may be in a range of 0.5 to 0.3.

In the image display element according to Aspect 25 of the present disclosure, in the above Aspect 1, an embedding layer covering the convex portion and a cap layer on the embedding layer may be provided, and a refractive index of the cap layer may be higher than a refractive index of the embedding layer.

In the image display element according to Aspect 26 of the present disclosure, in the above Aspect 25, a thickness of the embedding layer may be within ±25 nm from an integral multiple of a wavelength of light in the embedding layer.

In the image display element according to Aspect 27 of the present disclosure, in the above Aspect 25 or 26, a film thickness of the cap layer may be within ±25 nm from an integral multiple of a half of a wavelength of light in the cap layer.

The image display element according to Aspect 28 of the present disclosure, in the above Aspect 1, may includes a convex portion protective film covering the convex portion, in which a refractive index of the convex portion protective film may be 1.3 or less, and a thickness of the convex portion protective film may be in a range that does not completely fill a space between the convex portions.

An image display element according to Aspect 29 of the present disclosure is an image display element including a drive circuit substrate that includes a drive circuit for supplying a current to micro light emitting elements to cause light to be emitted, the micro light emitting elements arranged in an array on the drive circuit substrate, and an antenna pattern disposed on a light emitting surface of the micro light emitting element, in which the antenna pattern includes isolated silicon convex portions in a periodic pattern.

The present disclosure is not limited to the above-described embodiments, and various modifications can be made within the scope of the claims, and embodiments obtained by appropriately combining the technical means disclosed in the different embodiments are also included in the technical scope of the present disclosure. Further, new technical features can be formed by combining the technical means disclosed in each embodiment.

The present disclosure contains subject matter related to that disclosed in Japanese Priority Patent Application JP 2019-145596 filed in the Japan Patent Office on Aug. 7, 2019 (and Japanese Priority Patent Application JP 2020-035230 filed in the Japan Patent Office on Mar. 2, 2020), the entire contents of which are here by incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An image display element comprising:
a drive circuit substrate that includes a drive circuit for supplying a current to micro light emitting elements to cause light to be emitted;
the micro light emitting elements arranged in an array on the drive circuit substrate; and
an antenna arranged on a light emitting surface of each of the micro light emitting elements, wherein
the antenna includes convex portions in a periodic pattern, and
the convex portions include a semiconductor or a dielectric, or are covered with a resin.

2. The image display element according to claim 1, wherein
each of the micro light emitting elements includes an excitation light emitting element that emits excitation light and a wavelength converter that down-converts the excitation light.

3. The image display element according to claim 2, wherein
the light emitting surface is a surface of the wavelength converter.

4. The image display element according to claim 2, wherein
the light emitting surface is a surface of a dielectric multilayer film disposed on the wavelength converter.

5. The image display element according to claim 2, wherein
the light emitting surface is a surface of a color filter disposed on the wavelength converter.

6. The image display element according to claim 2, wherein
the light emitting surface is a surface of a transparent layer disposed on the wavelength converter.

7. The image display element according to claim 2, wherein
a periphery of the wavelength converter is surrounded by a partition wall having a light-shielding property.

8. The image display element according to claim 2, wherein
a periphery of the wavelength converter is surrounded by a partition wall having a light-shielding property, and a side surface of the partition wall is made of a light reflecting material, and the side surface of the partition wall is tapered to open in a light emission direction.

9. An image display element comprising:
a drive circuit substrate that includes a drive circuit for supplying a current to micro light emitting elements to cause light to be emitted;
the micro light emitting elements arranged in an array on the drive circuit substrate; and
an antenna arranged on a light emitting surface of each of the micro light emitting elements, wherein
the antenna includes convex portions in a periodic pattern,
the micro light emitting elements include a first micro light emitting element that emits light of a first light emitting wavelength, and a second micro light emitting element that emits light of a second light emitting wavelength longer than the first light emitting wavelength, and
a period of a periodic pattern included in an antenna formed on a light emitting surface of the first micro light emitting element is shorter than a period of a periodic pattern included in an antenna formed on a light emitting surface of the second micro light emitting element.

10. The image display element according to claim 9, wherein
the first micro light emitting element includes an excitation light emitting element that emits excitation light of the first light emitting wavelength and a transparent portion that transmits the excitation light, and a surface of the transparent portion is the light emitting surface of the first micro light emitting element, and
the second micro light emitting element includes an excitation light emitting element that emits excitation light of the first light emitting wavelength and a wavelength converter that down-converts the excitation light.

11. The image display element according to claim 9, wherein
the convex portions include a semiconductor or a dielectric, or are covered with a resin.

12. The image display element according to claim 9, wherein
each of the micro light emitting elements includes an excitation light emitting element that emits excitation light and a wavelength converter that down-converts the excitation light.

13. The image display element according to claim 9, wherein
the convex portions include a metal.

14. The image display element according to claim 13, wherein
the antenna includes a shield pattern on an outer peripheral portion of the micro light emitting element.

15. The image display element according to claim 14, wherein
the antenna is electrically fixed to a constant potential on an outer peripheral portion of the micro light emitting element.

16. An image display element comprising:
a drive circuit substrate that includes a drive circuit for supplying a current to micro light emitting elements to cause light to be emitted;
the micro light emitting elements arranged in an array on the drive circuit substrate; and
an antenna arranged on a light emitting surface of each of the micro light emitting elements, wherein
the antenna includes convex portions in a periodic pattern,
the image display element further comprises an embedding layer covering the convex portions, and a cap layer on the embedding layer, and
a refractive index of the cap layer is larger than a refractive index of the embedding layer.

17. The image display element according to claim 16, wherein
a film thickness of the embedding layer is within ±25 nm from an integral multiple of a wavelength of light in the embedding layer.

18. The image display element according to claim 16, wherein
a film thickness of the cap layer is within ±25 nm from an integral multiple of a half of a wavelength of light in the cap layer.

19. The image display element according to claim 16, wherein
the convex portions include a semiconductor or a dielectric, or are covered with a resin.

20. The image display element according to claim 16, wherein
each of the micro light emitting elements includes an excitation light emitting element that emits excitation light and a wavelength converter that down-converts the excitation light.

* * * * *